United States Patent
Hirosawa

(10) Patent No.: US 10,074,825 B2
(45) Date of Patent: Sep. 11, 2018

(54) ORGANIC ELECTROLUMINESCENT ELEMENT

(71) Applicant: Konica Minolta, Inc., Chiyoda-ku, Tokyo (JP)

(72) Inventor: Shota Hirosawa, Hino (JP)

(73) Assignee: KONICA MINOLTA, INC., Tokyo (JP)

( * ) Notice: Subject to any disclaimer, the term of this patent is extended or adjusted under 35 U.S.C. 154(b) by 0 days.

(21) Appl. No.: 14/831,288

(22) Filed: Aug. 20, 2015

(65) Prior Publication Data

US 2016/0056412 A1    Feb. 25, 2016

(30) Foreign Application Priority Data

Aug. 22, 2014 (JP) ................. 2014-168977

(51) Int. Cl.
*H01L 51/52* (2006.01)
(52) U.S. Cl.
CPC .... *H01L 51/5253* (2013.01); *H01L 2251/303* (2013.01)
(58) Field of Classification Search
CPC ............ H01L 51/5253; H01L 51/5246
See application file for complete search history.

(56) References Cited

U.S. PATENT DOCUMENTS

| 2003/0156080 A1* | 8/2003 | Koike | G02B 1/116 345/60 |
|---|---|---|---|
| 2007/0138949 A1* | 6/2007 | Yoshida | H01L 51/56 313/504 |
| 2009/0029056 A1* | 1/2009 | Hoffmann | C23C 18/14 427/372.2 |
| 2011/0132449 A1* | 6/2011 | Ramadas | H05B 33/04 136/256 |
| 2014/0356636 A1* | 12/2014 | Sun | C08K 5/1545 428/435 |
| 2015/0132587 A1* | 5/2015 | Nishio | C23C 14/0036 428/447 |
| 2015/0303336 A1* | 10/2015 | Lefebvre | H01L 31/048 136/259 |

(Continued)

FOREIGN PATENT DOCUMENTS

| JP | 2014109001 A | 6/2014 |
|---|---|---|
| WO | 2013119734 A1 | 8/2013 |
| WO | 2013161809 A1 | 10/2013 |

(Continued)

OTHER PUBLICATIONS

Chinese Office Action corresponding to Application No. 201510509720.5; dated Nov. 16, 2016, with English translation.

(Continued)

*Primary Examiner* — Christine Enad
(74) *Attorney, Agent, or Firm* — Cantor Colburn LLP

(57) ABSTRACT

The present invention provides an organic electroluminescent element containing a flexible substrate having thereon: a first gas barrier layer, an insulating layer, a first electrode, a light emitting unit containing an organic functional layer, and a second electrode, in that order, wherein the first gas barrier layer is a polysilazane reforming layer; the insulating layer is a layer containing a metal oxide; and a metal element in the metal oxide has a lower redox potential than silicon.

6 Claims, 3 Drawing Sheets

(56) References Cited

U.S. PATENT DOCUMENTS

2015/0380681 A1* 12/2015 Furukawa .......... H01L 51/5253
257/40
2016/0017186 A1* 1/2016 Aoyama ............. H01L 51/5253
257/40

FOREIGN PATENT DOCUMENTS

| WO | 2014126037 A1 | 8/2014 |
| WO | 2013161809 A1 | 12/2015 |
| WO | 2014092085 A1 | 1/2017 |
| WO | 2014126037 A1 | 2/2017 |

OTHER PUBLICATIONS

Notification of the Second Office Action for corresponding CN Application No. 201510509720.5; dated Jul. 17, 2017.
JP Office Action corresponding to Application No. 2014-168977; dated Feb. 27, 2018.

* cited by examiner

ORGANIC ELECTROLUMINESCENT ELEMENT

CROSS REFERENCE TO RELATED APPLICATIONS

The present invention claims priority under 35 U.S.C. § 119 to Japanese Application No. 2014-168977 filed on Aug. 22, 2014, the entire content of which is incorporated herein by reference.

TECHNICAL FIELD

The present invention relates to an organic electroluminescent element. More specifically, the present invention relates to an organic electroluminescent element which can prevent generation of dark spots with achieving high storage stability, high luminescence efficiency and high luminescence uniformity.

BACKGROUND

An organic electroluminescence element is a thin-type complete solid element utilizing electroluminescence produced by an organic material (hereafter, the term "electroluminescence" is also simply called as "EL") and enabling to emit light at a voltage of approximately a few to a few tens volts. It has many excellent features of high luminance, high emission efficiency, thin-type, and lightweight. Therefore, particularly in recent years, an organic EL element using a resin substrate provided with a thin and lightweight gas barrier layer attracts attention as a surface-emitting body used for a backlight in various displays, a display panel of sign or emergency light, or an illuminating light source.

However, with respect to this organic EL element using a resin substrate, it is required a gas barrier property of extremely high level almost as high as a glass substrate. In particular, it is demanded an organic EL element which can prevent generation of dark spots even keeping for a long term under the condition of high temperature and high humidity such as 85° C. and 85% RH.

In addition, with respect to a bottom-emission type organic EL element, it is required to take out light emitted in the electric field light emitting layer uniformly and efficiently.

As a resin substrate for a flexible organic EL element, for example, a gas barrier substrate utilizing a polysilazane reforming layer is disclosed (for example, refer to Patent document 1: Japanese patent application publication (JP-A) No. 2014-109001).

However, the flexible organic EL element disclosed in the aforesaid Patent document 1 has not achieved the level of preventing generation of dark spots after keeping for a long term under the condition of high temperature and high humidity such as 85° C. and 85% RH. Further, there is a problem of deterioration of emission efficiency and emission uniformity of the organic EL element due to a reflection phenomenon of light at an interface between a polysilazane reforming layer and an electrode.

SUMMARY

The present invention has been made in view of the above-described problems and situation. An object of the present invention is to provide an organic electroluminescent element which can prevent generation of dark spots even after keeping for a long term under the condition of high temperature and high humidity with achieving high storage property, high emission efficiency and high emission uniformity.

An aspect of the embodiment which has resolved the problem of the present invention is an organic electroluminescent element comprising a flexible substrate having thereon: a first gas barrier layer, an insulating layer, a first electrode, a light emitting unit containing an organic functional layer, and a second electrode, in that order, wherein the first gas barrier layer is a polysilazane reforming layer; the insulating layer is a layer containing a metal oxide; and a metal element in the metal oxide has a lower redox potential than silicon.

Another aspect of the present invention is an organic electroluminescent element, wherein the aforesaid first gas barrier layer is a polysilazane reforming layer which is formed by impressing energy to a coating layer containing polysilazane; and the aforesaid insulating layer is a layer formed by gas phase layer formation with a metal oxide.

Another aspect of the present invention is an organic electroluminescent element, wherein a second gas barrier layer is further provided between the aforesaid flexible substrate and the aforesaid first gas barrier layer, wherein the second gas barrier layer contains a silicon compound, and further, an element selected from the group consisting of carbon, nitrogen and oxygen; and a composition of silicon, carbon, nitrogen and oxygen each continuously changes in a depth direction of the second gas barrier layer and each element has an extremum point in an element composition distribution of silicon, carbon, nitrogen and oxygen.

Another aspect of the present invention is an organic electroluminescent element, wherein the aforesaid impression of energy is done by irradiating with vacuum ultra violet rays.

Another aspect of the present invention is an organic electroluminescent element, wherein the aforesaid metal oxide is niobium oxide.

BRIEF DESCRIPTION OF THE DRAWINGS

The present invention will be fully understood by the following detailed description and the attached figures. However, the present invention is not limited by them.

DESCRIPTION OF THE PREFERRED EMBODIMENTS

Figure 1:
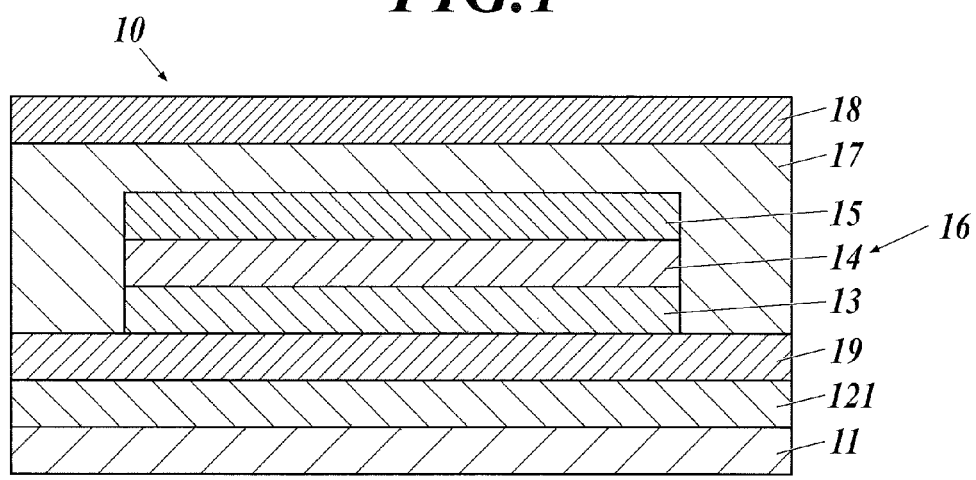
FIG. 1 is a drawing showing a schematic composition of an organic electroluminescent element of a first embodiment.

An organic electroluminescent element of the present invention comprises a flexible substrate having thereon: a first gas barrier layer, an insulating layer, a first electrode, a light emitting unit containing an organic functional layer, and a second electrode, in that order. The aforesaid first gas barrier layer is a polysilazane reforming layer. It has the following properties: the aforesaid insulating layer is a layer containing a metal oxide; and a metal element in the metal oxide has a lower redox potential than silicon. These technical properties are common to the above-described embodiments of the present invention.

By the above-described embodiments of the present invention, it can provide an organic electroluminescent element which can prevent generation of dark spots even after keeping for a long term under the condition of high temperature and high humidity with achieving a high storage property, high emission efficiency and high emission uniformity.

Although it is not clearly understood, a formation mechanism and a mode of action of the effects of the present invention are presumed to be as follows.

According to an organic EL element of the present invention, it can provide an organic EL element having a high storage property. An organic EL element having a high storage property can be achieved by making contact a first gas barrier layer with a metal oxide, the first gas barrier layer being formed by impressing energy to a polysilazane layer and the metal oxide having lower redox potential than silicon, thus, it can control an oxidation reaction of polysilazane.

Namely, polysilazane will usually undergo an oxidation reaction by reacting with water vapor and oxygen under the condition of high temperature and high humidity. As a consequence of this oxidation reaction, it is supposed that the aforesaid gas barrier property will be deteriorated. It is supposed that the metal oxide will act as a reducing agent, and that the oxidation reaction of polysilazane will be controlled by making contact a metal oxide having lower redox potential than silicon with a polysilazane layer.

According to an organic EL element of the present invention, it can provide an organic EL element achieving excellent light emitting efficiency and excellent emission light uniformity. It is supposed that an optical decrease is controlled by placing a metal oxide in an adjacent place of the first electrode, the optical decrease being derived from an angle dependent light reflection and absorption of light produced at an interface of a first electrode.

Based on the above-described assumed mechanism, it is believed that an organic EL element of a high storage property with excellent light emission efficiency and light emission uniformity can be provided.

Regarding the embodiments of the present invention, the following is a preferable embodiment from the viewpoint of obtaining the effects of the present invention. It is preferable that a first gas barrier layer is a polysilazane reforming layer formed by impressing energy to a coated layer containing polysilazane from the viewpoint of obtaining high smoothness and high gas barrier property. Further, it is preferable that the aforesaid insulating layer is a layer formed with a metal oxide by gas phase layer formation from the viewpoint of composition stability and layer forming speed.

A further preferable embodiment is as follows. A second gas barrier layer is further provided between the aforesaid flexible substrate and the aforesaid gas barrier layer. The second gas barrier layer contains a silicon compound, and further contains an element selected from the group of carbon, nitrogen and oxygen. The composition of these elements continuously changes in the depth direction, and has an extreme value (extremum) in a composition distribution of these elements. These features are preferable in the point of controlling interference of light in the specific wavelength at an interface of the second gas barrier layer. Consequently, it can improve distribution of an emitting light of an organic EL element to result in solving the problem of view angle dependency. Therefore, it can improve uniformity of chromaticity of emitting light of an organic EL element even when the light is emitted in a bended condition.

In addition, it is preferable that the aforesaid impression of energy is done by irradiation with vacuum UV (ultra violet) rays from the viewpoint of achieving high conversion rate of polysilazane to a reformed layer. This reformed layer is called as a polysilazane reforming layer. Further, it is preferable that the aforesaid metal oxide is niobium oxide from the viewpoint of getting a high storage property, excellent light emission efficiency and light emission uniformity.

The present invention and the constitution elements thereof, as well as configurations and embodiments, will be detailed in the following. In the present description, when two figures are used to indicate a range of value before and after "to", these figures are included in the range as a lowest limit value and an upper limit value.

The description will be done in the following order.
1. Organic electroluminescent element (First embodiment)
2. Organic electroluminescent element (Second embodiment)

1. Organic Electroluminescent Element (First Embodiment)

[Constitution of Organic EL Element]

FIG. 1 is a drawing (cross-section) showing a schematic composition of an organic electroluminescent element of a first embodiment.

As illustrated in FIG. 1, an organic EL element 10 comprises a flexible substrate 11, a first gas barrier layer 121, an insulating layer 19, a first electrode 13, a light emitting unit 16 containing an organic functional layer 14, and a second electrode 15. These layers are laminated in that order. Further, a sealing layer 17 and a sealing member 18 are laminated over the second electrode 15.

In addition, the organic EL element 10 has, as it is called, a bottom emission type constitution in which emission from the light emitting unit 16 is taken out from the side of the flexible substrate 11.

[Flexible Substrate]

As a flexible substrate 11 used for an organic EL element 10, it is not specifically limited as long as it can provide an organic EL element 10 with a flexible property. As a flexible substrate, it can cite a transparent resin film.

Examples of a resin for a resin film include: polyesters such as polyethylene terephthalate (PET) and polyethylene naphthalate (PEN), polyethylene, polypropylene, cellophane, cellulose esters and their derivatives such as cellulose diacetate, cellulose triacetate (TAC), cellulose acetate butyrate, cellulose acetate propionate (CAP), cellulose acetate phthalate, and cellulose nitrate, polyvinylidene chloride, polyvinyl alcohol, polyethylene vinyl alcohol, syndiotactic polystyrene, polycarbonate, norbornene resin, polymethyl pentene, polyether ketone, polyimide, polyether sulfone (PES), polyphenylene sulfide, polysulfones, polyether imide, polyether ketone imide, polyamide, fluororesin, Nylon, polymethyl methacrylate, acrylic resin, polyarylates and cycloolefin resins such as ARTON (trade name made by JSR Co. Ltd.) and APEL (trade name made by Mitsui Chemicals, Inc.).

Among these resin films, preferably used films are, for example, polyethylene terephthalate (PET), polybutylene terephthalate and polyethylene naphthalate (PEN) and polycarbonate (PC) with respect to the cost or the ease of acquisition.

Further, with respect to optical transparency, heat resistance and adhesion with a first gas barrier layer 121, a heat resistant transparent film having a basic skeleton of silsesquioxane which contains an organic-inorganic hybrid structure may be preferably used.

The thickness of this flexible substrate 11 is preferably about 5 to 500 μm, and more preferably, it is within the range of 25 to 250 μm. It is preferable that the flexible substrate 11 has a light transparent property. It is possible to achieve an organic EL element 10 having light transparency when the flexible substrate 11 has a light transparent property.

[First Gas Barrier Layer]

A first gas barrier layer 121 is provided between a flexible substrate 11 and an insulating layer 19. In order to shield water and oxygen gas in the atmosphere which may penetrate in a first electrode 13, an organic functional layer 14 and a second electrode 15 through the flexible substrate 11, the first gas barrier layer 121 is formed in such a manner to cover the flexible substrate 11 completely.

As a first gas barrier layer 121 as described above, it is preferable to use a polysilazane reforming layer which is formed by performing a reforming treatment to a polysilazane containing layer via irradiation with an active energy radiation (Polysilazane Reforming Layer)

A polysilazane reforming layer is preferably formed by: applying a coating solution containing polysilazane and drying; then, carrying out reforming treatment by irradiating the coated layer with an active energy radiation.

The polysilazane reforming layer forms a surface region in which reforming of polysilazane is more advanced, and there is formed a less reformed region or unreformed region at the lower portion of this region. In the present invention, "a polysilazane reforming layer" includes the less reformed region and unreformed region.

"Polysilazane" is a polymer having a silicon-nitrogen bond and it is a ceramic precursor inorganic polymer such as: SiO2, Si3N4 and an intermediate solid solution of SiOxNy containing Si—N, Si—H and N—H bonds in the molecule. Specifically, preferable polysilazane has the following structure.

  Formula (I)

In the aforesaid Formula (I), R1, R2 and R3 each independently represent a hydrogen atom, a substituted or unsubstituted alkyl group, aryl group, vinyl group or (trialkoxysilyl)alkyl group. R1, R2 and R3 each may be the same or different with each other.

Here, as an alkyl group, there are cited a straight, branched or cyclic alkyl group with 1 to 8 carbon atoms. More specifically, examples of an alkyl group include: a methyl group, an ethyl group, an n-propyl group, an isopropyl group, an n-butyl group, an isobutyl group, a sec-butyl group, a tert-butyl group, an n-pentyl group, an isopentyl group, a neopentyl group, an n-hexyl group, an n-heptyl group, an n-octyl group, a 2-ethylhexyl group, a cyclopropyl group, a cyclopentyl group, and a cyclohexyl group.

As an aryl group, there are cited aryl groups having 6 to 30 carbon atoms. More specifically, there are cited: non-condensed hydrocarbon groups such as a phenyl group, a biphenyl group and a terphenyl group;

condensed polycyclic hydrocarbon groups such as a pentalenyl group, an indenyl group, a naphthyl group, an azulenyl group, a heptalenyl group, a biphenylenyl group, a fluorenyl group, an acenaphthylenyl group, a pleiadenyl group, an acenaphthenyl group, a phenalenyl group, a phenanthryl group, an anthryl group, a fluoranthenyl group, an acephenanthrylenyl group, an aceanthrylenyl group, a triphenylenyl group, a pyrenyl group, a chrysenyl group and a naphthacenyl group.

As a (trialkoxysilyl)alkyl group, there are cited an alkyl group of 1 to 8 carbon atoms having a silyl group substituted with an alkoxyl group of 1 to 8 carbon atoms. More specifically, it may be cited: 3-(triethoxysilyl)propyl group and 3-(trimethoxysilyl)propyl group.

A substituent which may be present in the aforesaid R1 to R3 is not specifically limited. Examples thereof are: an alkyl group, a halogen atom, a hydroxyl group (—OH), a mercapto group (—SH), a cyano group (—CN), a sulfo group (—SO3H), a carboxyl group (—COOH), and a nitro group (—NO2).

In addition, a substituent which may be present will not be the same as R1 to R3 which are substituted. This means that, for example, when R1 to R3 each are an alkyl group, these are not further substituted with an alkyl group.

Among them, it is preferable that R1, R2 and R3 each are: a hydrogen atom, a methyl group, an ethyl group, a propyl group, an isopropyl group, a butyl group, an isobutyl group, a tert-butyl group, a phenyl group, a vinyl group, a 3-(triethoxysilyl)propyl group, and 3-(trimethoxysilylpropyl) group.

In the aforesaid Formula (I), n is an integer, and it is preferable that n is determined so that polysilazane having a structure represented by Formula (I) will have a number average molecular weight of 150 to 150,000 g/mol.

Among compounds having a structure represented by the aforesaid Formula (I), one of the preferable embodiments is "perhydropolysilazane" in which all of R1, R2 and R3 are a hydrogen atom. Preferable polysilazane has a structure represented by the following Formula (II).

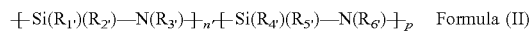  Formula (II)

In the aforesaid Formula (II), R1', R2', R3', R4', R5', and R6' each independently represent a hydrogen atom, a substituted or unsubstituted alkyl group, aryl group, vinyl group or (trialkoxysilyl)alkyl group. R1', R2', R3', R4', R5', and R6' each may be the same or different with each other. The aforesaid substituted or unsubstituted alkyl group, aryl group, vinyl group or (trialkoxysilyl)alkyl group each have the same definition as described for the aforesaid Formula (I), therefore, the explanation to them is omitted.

In the aforesaid Formula (II), n' and p each are an integer, and it is preferable that n' and p are determined so that polysilazane having a structure represented by Formula (II) will have a number average molecular weight of 150 to 150,000 g/mol. Further, n' and p may be the same or different.

Among polysilazane compounds represented by Formula (II), the following are preferable: a compound in which R1', R3', and R6' each represent a hydrogen atom, and R2', R4', and R5' each represent a methyl group; a compound in which R1', R3', and R6' each represent a hydrogen atom, R2' and R4' each represent a methyl group, and R5' represents a vinyl group; and a compound in which R1', R3', R4', and R6' each represent a hydrogen atom, and R2' and R5' each represent a methyl group. Preferable polysilazane has a structure represented by the following Formula (III).

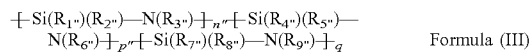  Formula (III)

In the aforesaid Formula (III), R1", R2", R3", R4", R5", R6", R7", R8", and R9" each independently represent a hydrogen atom, a substituted or unsubstituted alkyl group, aryl group, vinyl group or (trialkoxysilyl)alkyl group. R1", R2", R3", R4", R5", R6", R7", R8", and R9" each may be the same or different with each other. The aforesaid substituted or unsubstituted alkyl group, aryl group, vinyl group or (trialkoxysilyl)alkyl group each have the same definition as described for the aforesaid Formula (I), therefore, the explanation to them is omitted.

In the aforesaid Formula (III), n", p" and q each are an integer, and it is preferable that n", p" and q are determined so that polysilazane having a structure represented by Formula (III) will have a number average molecular weight of 150 to 150,000 g/mol.

Further, n", p" and q may be the same or different.

Among polysilazane compounds represented by Formula (III), a preferable is a compound in which R1", R3", and R6" each represent a hydrogen atom, R2", R4", R5" and R8" each represent a methyl group, R9" represents a (trialkoxysilyl)alkyl group, and R7" represents an alkyl group or a hydrogen atom.

On the other hand, an organopolysilazane, which has a structure of substituting a part of hydrogen atoms bonded to Si with an alkyl group, will improve adhesiveness with the underlying substrate by having an alkyl group such as a methyl group. And it can give tenacity to a ceramic film made of stiff and breakable polysilazane. It has a merit of decreased generation of crack even when the (average) film thickness is increased. According to an application, one of these perhydropolysilazane and organopolysilazane may be selected and they may be used in combination.

Perhydropolysilazane is presumed to have a ring structure containing a straight chain, and a ring structure mainly composed of a 6- and a 8-membered ring. Its molecular weight is about 600 to 2,000 (in polystyrene conversion value) in a number average molecular weight (Mn). It has a material of liquid and solid, and the state depends on the molecular weight.

Polysilazane is commercially available in a solution state dissolved in an organic solvent. A commercially available product may be used directly as a coating liquid for producing a polysilazane reforming layer.

Examples of commercially available polysilazane are: AQUAMICA™ NN120-10, NN120-20, NAX120-20, NN110, NN310, NN320, NL110A, NL120A, NL120-20, NL150A, NP110, NP140, and SP140, which are supplied by AZ Electronic Materials, Ltd.

Although another examples of polysilazane are not specifically limited, examples of polysilazane which may be converted to ceramic at a low temperature are: silyl alkoxide added polysilazane, being produced by reacting silyl alkoxide with the above-described polysilazane (for example, refer to JP-A 5-238827); glycidol added polysilazane, being produced by reacting glycidol (for example, refer to JP-A 6-122852); alcohol added polysilazane, being produced by reacting alcohol (for example, refer to JP-A 6-240208); metal carboxylic acid salt added polysilazane, being produced by reacting metal carboxylate (for example, refer to JP-A 6-299118); acetyl acetonate complex added polysilazane, being produced by reacting acetyl acetonate complex containing a metal (for example, refer to JP-A 6-306329); and metal fine particle added polysilazane, being produced by adding metal fine particles (for example, refer to JP-A 7-196986).

When polysilazane is used, the content of polysilazane in the polysilazane layer before subjecting to a reforming treatment may be made to be 100 mass %, in which the total mass of the polysilazane reforming layer is set to be 100 mass %.

Further, when a polysilazane reforming layer contains other compound than polysilazane, it is preferable that the content of polysilazane in the layer is in the range of 10 to 99 mass %, more preferably, it is in the range of 40 to 95 mass %, and still more preferably, it is in the range of 70 to 95 mass %.

A forming method of a polysilazane reforming layer by a coating method is not specifically limited, and known methods may be adopted. It is preferable that a coating solution containing polysilazane with a catalyst when required in an organic solvent for forming a polysilazane reforming layer is applied with a known wet coating method, and a reforming treatment is performed after removing the solvent with evaporation.

(Coating Solution for Forming a Polysilazane Reforming Layer)

As a solvent to prepare a coating solution for forming a polysilazane reforming layer, it is not specifically limited as long as it can dissolve polysilazane.

Preferable are solvents without containing water or a reactive group (for example, a hydroxyl group, or an amino group), which easily react with polysilazane. It is preferable to use an unreactive organic solvent. In particular, aprotic organic solvent is more preferable.

Specific examples of an aprotic solvent are as follows: an aliphatic hydrocarbon, an alicyclic hydrocarbon and an aromatic hydrocarbon such as pentane, hexane, cyclohexane, toluene, xylene, Solvesso™, and turpentine; a halogenated hydrocarbon solvent such as methylene chloride and trichloroethane; an ester such as ethyl acetate and butyl acetate; a ketone such as acetone and methyl ethyl ketone; an aliphatic ether such as dibutyl ether; an alicyclic ether such as dioxane and tetrahydrofuran; and alkylene glycol dialkyl ether and polyalkylene glycol dialkyl ethers (such as diglyme).

These organic solvents may be chosen in accordance with characteristics, such as solubility of silicon compound, and an evaporation rate of a solvent, and a plurality of solvents may be mixed.

A concentration of polysilazane in a coating solution for forming a polysilazane reforming layer is not specifically limited. Although it depends on a layer thickness and a pot life, it is preferably in the range of 1 to 80 mass %, more preferably, it is in the range of 5 to 50 mass %, and still more preferably, it is in the range of 10 to 40 mass %.

A coating solution for forming a polysilazane reforming layer preferably contains a catalyst in order to accelerate reforming.

Examples of a catalyst include: amine compounds such as N,N-diethylethanolamine, N,N-dimethylethanolamine, triethanolamine, triethylamine, 3-morpholino-propylamine, N,N,N',N'-tetramethyl-1,3-diaminopropane, and N,N,N',N'-tetramethyl-1,6-diaminohexane; metal complexes of a Pt compound such as Pt acetyl acetonate, a Pd compound such as Pd propionate, and a Rh compound such as Rh acetyl acetonate; N-heterocyclic compounds of pyridine derivatives such as pyridine, α-picoline, β-picoline, γ-picoline, piperidine, lutidine, pyrimidine, and pyridazine; DBU (1,8-diazabicyclo[5.4.0]-7-undecene), DBN (1,5-diazabicyclo[4.3.0]-5-nonene); organic acids such as acetic acid, propionic acid, butyric acid, valeric acid, maleic acid, stearic acid; inorganic acids such as hydrochloric acid, nitric acid, sulfuric acid, and hydrogen peroxide. Among them, it is preferable to use an amine compound.

As a concentration of a catalyst added, it is preferably in the range of 0.1 to 10 mass %, more preferably, it is in the range of 0.5 to 7 mass % based on the mass of polysilazane.

By making the concentration of a catalyst in this range, it is possible to avoid excessive formation of silanol due to a rapid advance in reaction, decrease of a layer density and increase of layer defects.

A coating solution for forming a polysilazane reforming layer may contain an additive as described below when needed.

Examples thereof are: cellulose ethers, cellulose esters such as ethyl cellulose, nitro cellulose, cellulose acetate, and cellulose acetobutylate; natural resins such as rubber and a rosin resin; synthetic resins such as a polymerized resin; condensed resins such as aminoplast, specifically a urea resin, a melamine-formaldehyde resin, an alkyd resin, an acrylic resin, a polyester or a modified polyester, epoxide, polyisocyanate or blocked polyisocyanate, and polysiloxane.

(Method for Applying a Coating Solution for Forming a Polysilazane Reforming Layer)

A conventionally known appropriate wet coating method, may be adopted as a coating method of a coating solution for forming a polysilazane reforming layer. Specific examples of a coating method include: a spin coat method, a roll coat method, a flow coat method, an inkjet method, a spray coat method, a printing method, a dip coat method, a casting film forming method, a bar coat method and a gravure printing method.

A coating thickness may be appropriately set up according to the purpose. For example, a coating thickness per one polysilazane reforming layer may be set up so that the thickness after being dried is preferably about 10 nm to 10 µm, more preferably, it is in the range of 15 nm to 1 µm, still more preferably, it is in the range of 20 to 500 nm.

When the thickness is 10 nm or more, a sufficient gas barrier property will be obtained, and when the thickness is 10 µm or less, stable coating will be achieved during layer formation and high light transparency will be realized.

After applying the coating solution, it is preferable that the coated layer is dried. An organic solvent contained in the coating solution will be removed by drying the coated layer. Here, the organic solvent contained in the coating solution may be removed completely, or the organic solvent may be remained partially.

A suitable polysilazane reforming layer may be formed even when the organic solvent remains partially. When it remains in the layer, it will be removed later.

Although a drying temperature of the coated layer depends on the substrate used, it is preferable in the range of 50 to 200° C. For example, when a polyethylene terephthalate substrate having a glass transposition temperature (Tg) of 70° C. is used, it is preferable to set a drying temperature to 150° C. or less by considering heat deformation of the substrate.

The above-described temperature may be set up by using a hot plate, an oven or a furnace. It is preferable that the drying time is set up to be a short time. For example, when the drying temperature is 150° C., it is preferable that the drying time is set up to be 30 minutes or less. Further, a drying atmosphere may be any one of the conditions of under air, under nitrogen, under argon, under vacuum and under controlled reduced oxygen density.

A method for a coated layer obtained by applying a coating solution for forming a polysilazane reforming layer may contain a step of removing water before performing a reforming treatment or during a reforming treatment. As a step of removing water, it is preferable to dehumidify with keeping a low humidity condition. The humidity under a low humidity condition will change depending on a temperature. The preferable embodiment is indicated by fixing a dew point containing a relation of temperature and humidity.

A preferable dew point is 4° C. or less (temperature of 25° C. and humidity of 25%). A more preferable dew point is −5° C. or less (temperature of 25° C. and humidity of 10%), and preferably, the keeping time is suitably determined on the thickness of the polysilazane reforming layer.

When the thickness of the polysilazane reforming layer is 1.0 µm or less, a preferable dew point is −5° C. or less and a preferable keeping time is 1 minute or less.

In addition, although a lowest limit of a dew point is not specifically limited, usually, it is −50° C. or more, and preferably, it is −40° C. or more.

Removing water before performing a reforming treatment or during a reforming treatment is a preferable embodiment from the viewpoint of accelerating dehydration reaction of a polysilazane reforming layer which has been converted to silanol.

(Reforming Treatment of a Polysilazane Coated Layer Formed by a Coating Method)

A reforming treatment of a polysilazane coated layer formed by a coating method indicates a conversion reaction of polysilazane into silicon oxide or silicon oxynitride. More specifically, it is a treatment in which a polysilazane coated later is reformed into an inorganic layer which exhibits a gas barrier property.

The conversion reaction of polysilazane into silicon oxide or silicon oxynitride may be done by a suitably adopted known method.

As a reforming treatment, preferable are conversion reactions of a plasma treatment and a UV ray irradiation treatment enabling to achieve a conversion reaction at a relatively low temperature from the viewpoint of application to a resin film substrate.

(Plasma Treatment)

An atmospheric pressure plasma CVD method, which performs a plasma CVD process near the atmospheric pressure, does not require a reduced pressure in contrast with a vacuum plasma CVD method. Not only its production efficiency is high, but its film forming speed is high since a plasma density is high. Further, compared with a condition of a conventional CVD method, since an average free path of a gas is very short under a high-pressure of an atmospheric pressure, it can obtain an extremely homogeneous film.

When an atmospheric pressure plasma treatment is carried out, it is used a nitrogen gas or elements of group 18 in the periodic table as a discharge gas. Specifically, it is used: helium, neon, argon, krypton, xenon or radon. Of these, nitrogen, helium and argon are preferably used, and, specifically, nitrogen is most preferably used in view of the low cost.

(UV Ray Irradiation Treatment)

A treatment by irradiation with UV rays is preferable as a reforming treatment. Ozone and active oxygen, which are produced by UV rays (the same meaning as UV light), have high oxidation ability. Therefore, it can form silicon oxide or silicon oxynitride, each having a high density and high insulating ability, at a low temperature.

By this UV ray irradiation, the substrate will be heated, O2 and H2O, a UV absorbing agent and polysilazane itself, which contribute to convert to ceramic (silica conversion), will be exited and activated. As a result, polysilazane becomes exited, and conversion of polysilazane into ceramics will be promoted. Moreover, an obtained polysilazane reforming layer will become denser.

The UV ray irradiation may be done at any moment after formation of a coated layer.

For a UV ray irradiation treatment, it may be used any conventionally used UV ray generating apparatus. In general, although a UV ray is an electromagnetic wave having a wavelength of 10 to 400 nm, it is preferable that a UV ray having 210 to 375 nm is used as a UV ray irradiation treatment except for a vacuum UV ray (10 to 200 nm) treatment.

When irradiating with UV rays, it is preferable that irradiation strength and irradiating time are set up within the range in which the substrate supporting a polysilazane layer to be reformed does not get damage.

When a plastic film is used as a substrate, an example of an irradiation treatment is as follows: using a lamp of 2 kW (80 W/cm×25 cm); adjusting the distance between the substrate and the UV irradiation lamp so that the strength at the substrate surface becomes to be 20 to 300 mW/cm2, preferably to be 50 to 200 mW/cm2; and irradiation is done for 0.1 second to 10 minutes.

In general, in the case of a plastic film, when the temperature of a substrate is less than 150° C. during the UV irradiation treatment, a property of the substrate will not be damaged to result in deformation of the substrate or deterioration of its strength.

However, in the case of a highly thermal resistive film such as polyimide, it is possible to carry out a reforming treatment at a higher temperature. Consequently, as a temperature of a substrate during a UV ray irradiation treatment, there is no general upper limit. It can suitably set up by one skilled in the art according to the kind of substrate.

Examples of an apparatus to generate UV rays include: a metal halide lamp, a high pressure mercury lamp, a low pressure mercury lamp, a xenon arc lamp, a carbon arc lamp, an excimer lamp (a single wavelength of 172 nm, 222 nm, or 308 nm, for example, manufactured by Ushio Inc., M.D. COM. Inc.), and a UV light laser. However, the present invention is not limited to them.

When the generated UV rays are irradiated to a polysilazane reforming layer, it is preferable that irradiation of the generated UV rays to the polysilazane reforming layer is done after making reflex with a reflex plate from the viewpoint of achieving improved efficiency and uniform irradiation.

The UV ray irradiation may be applicable to a batch treatment and a continuous treatment. It may be suitably selected according to a shape of a substrate used. For example, in the case of a batch treatment, a laminated body having a polysilazane reforming layer on the surface thereof may be treated in a UV ray furnace which is provided with a UV ray generating source. A UV ray furnace itself is generally known, and it can use a UV ray furnace made by Eye Graphics Co. Ltd.

Further, when a laminated body having a polysilazane reforming layer on the surface thereof is an elongated film, making ceramic will be done by continuously irradiating with UV rays in a drying zone provided with the aforesaid UV ray generating source while conveying this elongated film.

The time required for UV ray irradiation depends on the used substrate, the composition and the density of the polysilazane reforming layer. It is generally, 0.1 second to 10 minutes, and preferably, it is 0.5 seconds to 3 minutes.

(Vacuum UV Ray Irradiation Treatment: Excimer Irradiation Treatment)

To a polysilazane reforming layer, one of the most preferable reforming treatments is a treatment by irradiation with vacuum UV rays (excimer irradiation treatment).

A treatment by irradiation with vacuum UV rays uses a light energy of wavelength of 100 to 200 nm, preferably, a light energy of wavelength of 100 to 180 nm. This energy is larger than an atomic binding force in a polysilazane compound. By using this light energy, it is possible to make proceed with an oxidation reaction with active oxygen or ozone while directly breaking an atomic bond only with an effect of a photon, which is called as a photo quantum process. As a result, formation of silicon oxide layer will be achieved at a relatively low temperature (about 200° C. or less).

In addition, when carrying out an excimer irradiation treatment, it is preferable to use a thermal treatment in combination as described above. The detailed thermal conditions are as described above.

The radiation source is only required to emit a light having a wavelength of 100 to 180 nm. Suitable light sources are: an excimer radiator (for example, Xe excimer lamp) having a maximum radiation at 172 nm; a low pressure mercury lamp having a bright line at 185 nm; a medium pressure and a high pressure mercury lamp having a component of a wavelength of 230 nm or less; and an excimer lamp having a maximum radiation at 222 nm.

Among them, since a Xe excimer lamp emits ultraviolet rays of a single short wavelength of 172 nm, it is excellent in luminous efficiency. Oxygen has a large absorption coefficient to this light, as a result, it can generate a radical oxygen atom species and ozone in high concentration with a very small amount of oxygen.

Moreover, it is known that the light energy of a short wavelength of 172 nm has a high potential to dissociate a bond in an organic substance. Property modification of a polysilazane film will be realized in a short time with the high energy which is possessed by this active oxygen, ozone, and UV ray radiation.

An excimer lamp has a high efficiency in generation of light, as a result, it is possible to make the light switch on by an injection of low electric power. Moreover, it does not emit a light with a long wavelength which will be a factor of temperature increase, but since it emits energy of a single wavelength in a UV region, it has a distinctive feature of suppressing an increase of a surface temperature of an exposure subject. For this reason, it is suitable for flexible film materials, such as polyethylene terephthalate which is supposed to be easily affected by heat.

Oxygen is required for the reaction during UV ray irradiation. Since a vacuum UV ray is absorbed by oxygen, efficiency during the step of UV ray irradiation is likely to decrease. Therefore, irradiation of the vacuum UV rays is preferably carried out at a concentration of oxygen and water vapor being as low as possible. That is, an oxygen concentration is preferably in the range of 10 to 20,000 ppm in volume, and more preferably, it is in the range of 50 to 10,000 ppm in volume. Further, a water vapor concentration during the conversion process is preferably in the range of 1,000 to 4,000 ppm in volume.

As a gas which is used during vacuum UV ray irradiation and fills an irradiation atmosphere, a dry inactive gas is preferably used. In particular, a dry nitrogen gas is preferable from the viewpoint of cost. The adjustment of an oxygen concentration may be made by measuring a flow rate of an oxygen gas and an inactive gas introduced in an irradiation chamber and by changing a flow rate ratio.

In a step of vacuum UV ray irradiation, illuminance of the aforesaid vacuum UV rays which are received at a coated layer surface of a polysilazane coated layer is preferably in the range of 1 mW/cm2 to 10 W/cm2, preferably, it is in the range of 30 mW/cm2 to 200 mW/cm2, and more preferably, it is in the range of 50 mW/cm2 to 160 mW/cm2. When it is in the range of 1 mW/cm2 to 10 W/cm2, the reforming efficiency will not be decreased, and there does not occur concern of producing ablation in the coated layer or giving damage to the substrate.

An amount of irradiation energy (irradiation amount) of vacuum UV rays at a coated layer surface is preferably in the range of 10 to 10,000 mJ/cm2, more preferably, it is in the range of 100 to 8,000 mJ/cm2, still more preferably, it is in the range of 200 to 6,000 mJ/cm2. When it is in the range of 10 to 10,000 mJ/cm2, sufficient reforming will be done, and there does not occur concern of producing crack due to over reforming or thermal deformation of the substrate.

The vacuum UV rays used for reforming may be generated from plasma which is formed with a gas containing at least one of CO, CO2 and CH4.

A gas containing at least one of CO, CO2 and CH4 (hereafter, it is also called as "a carbon containing gas"), may be used singly, however, it is preferable to add a small amount of carbon containing gas to a rare gas or a hydrogen gas used as a main gas. Capacitive coupled plasma may be cited as a method of generating plasma.

A layer composition of a polysilazane reforming layer may be determined by measuring an atomic composition ratio with an XPS surface analyzing apparatus. Further, it may be determined by cutting the polysilazane reforming layer, and by measuring an atomic composition ratio at a cross section with an XPS surface analyzing apparatus.

A layer density of a polysilazane reforming layer is appropriately set depending on the purpose. For example, it is preferable to be in the range of 1.5 to 2.6 g/cm3. When it is in this range, compactness of the layer will not be decreased, a gas barrier property will be improved, and oxidation deterioration of the layer by humidity will be prevented. A polysilazane reforming layer may be a single layer, and it may be used a laminated structure of two or more.

[Insulating Layer]

An insulating layer 19 relating to the present invention is formed by gas phase layer formation with a metal oxide. A metal element in the metal oxide has a lower redox potential than silicon. Namely, it contains as a main component a metal oxide having a lower redox potential than a redox potential of silicon. Here, "to contain as a main component a metal oxide having a lower redox potential than a redox potential of silicon" means that a content of a metal oxide is 50 mass % or more based on the total mass of the insulating layer 19, wherein the metal in the metal oxide has a lower redox potential than a redox potential of silicon. The aforesaid content is preferably 80 mass % or more, more preferably, it is 95 mass % or more, and still more preferably, it is 98 mass % or more. The most preferably, it is 100 mass %.

Specific examples of a metal having a lower redox potential than silicon are: niobium, tantalum, zirconium, titanium, hafnium, magnesium, yttrium, and aluminum. These metals may be used singly, or two or more kinds may be used by mixing.

That is, it is preferable that the insulating layer 19 contains as a main component a metal oxide which is made of at least one selected from the group consisting of niobium, tantalum, zirconium, and titanium. Among them, it is specifically preferable that the aforesaid metal oxide is niobium oxide.

Standard redox potentials of important metals are listed in the following Table 1. The following standard redox potentials of metals may be measured by using a solution containing a target metal ion with an ORP measuring apparatus on the market.

TABLE 1

| METAL | STANDARD REDOX POTENTIAL (V) |
|---|---|
| Zn | −0.80 |
| Si | −0.91 |
| Nb | −1.10 |
| Ta | −1.12 |
| Zr | −1.53 |
| Ti | −1.63 |
| Hf | −1.70 |
| Mg | −2.30 |
| Y | −2.37 |
| Al | −2.40 |

A method of forming an insulating layer 19 is not specifically limited. Examples thereof are: physical vapor deposition (PVD) methods such as a sputtering method, a vapor deposition method, and an ion plating method; and chemical vapor deposition (CVD) methods such as plasma CVD method, and an atomic layer deposition (ALD) method.

Among them, formation by a sputtering method is preferable, since it enables to perform layer formation without giving damage to a first gas barrier layer 121 provided at an under position and described later to result in high productivity. Examples of a layer formation by a sputtering method are: a DC (direct current) sputtering method, a RF (high frequency) sputtering method, a combined method of these methods with a magnetron sputtering method, and a dual magnetron sputtering (DMS) method which uses an intermediate frequency range. These known methods may be used alone or in combination of two or more.

An insulating layer 19 may be a single layer, or it may be a laminated structure composed of two or more. When the insulating layer 19 is a laminated structure composed of two or more, the composing layers of the insulating layer 19 may have the same composition, or different composition.

Although a thickness of the insulating layer 19 (when it is a laminated structure, this means the total thickness) is not specifically limited, a preferable thickness is in the range of 1 to 200 nm, a more preferable thickness is in the range of 5 to 50 nm. When the thickness is in this range, it will give a merit of producing an improved effect on a gas barrier property within the range of time (takt time) required for highly productive layer formation.

[Light Emitting Unit]

In the present invention, "a light emitting unit" is a unit composed of organic functional layers containing at least a light emitting layer as a main component. The aforesaid light emitting unit is sandwiched between an anode and a cathode, and they form an organic EL element as a whole. The electrodes are composed of a first electrode 13 and a second electrode 15, and each form a cathode and an anode of an organic EL element. An organic functional layer 14 includes a light emitting layer containing at least an organic material. Further it may be provided with another layer between the light emitting layer and the electrodes.

Preferable specific examples of a layer constitution of various organic functional layers sandwiched between an anode and a cathode in an organic EL element of the present invention will now be described below, however, the present invention is not limited to these.

(1) Anode/light emitting layer/cathode
(2) Anode/light emitting layer/electron transport layer/cathode
(3) Anode/hole transport layer/light emitting layer/cathode
(4) Anode/hole transport layer/light emitting layer/electron transport layer/cathode
(5) Anode/hole transport layer/light emitting layer/electron transport layer/electron injection layer/cathode
(6) Anode/hole injection layer/hole transport layer/light emitting layer/electron transport layer/cathode
(7) Anode/hole injection layer/hole transport layer/(electron blocking layer)/light emitting layer/(hole blocking layer)/electron transport layer/electron injection layer/cathode Among these, the embodiment (7) is preferably used. However, the present invention is not limited to this. In the above-described representative element constitution, the layers except the anode and the cathode are organic functional layers.

(Organic Functional Layer)

In the above-described constitutions, the light emitting layer unit is composed of a single layer or plural layers. When the light emitting layer unit contains plural layers, a non-light emitting intermediate layer may be placed between the light emitting layers.

In addition, it may be provided with a hole blocking layer (a hole bather layer) or an electron injection layer (a cathode buffer layer) between the light emitting layer and the cathode. Further, it may be provided with an electron blocking layer (an electron barrier layer) or an hole injection layer (an anode buffer layer) between the light emitting layer and the anode.

An electron transport layer is a layer having a function of transporting an electron. An electron transport layer includes an electron injection layer, and a hole blocking layer in a broad sense. Further, an electron transport layer unit may be composed of plural layers.

A hole transport layer is a layer having a function of transporting a hole. A hole transport layer includes a hole injection layer, and an electron blocking layer in a broad sense. Further, a hole transport layer unit may be composed of plural layers.

(Tandem Structure)

A light emitting unit 16 may be a so-called tandem element in which plural organic functional layers each containing at least one light emitting are laminated.

As examples of an organic functional layer, it may be cited the above-described layer constitutions of (1) to (7) from which an anode and a cathode are eliminated.

Examples of an element constitution having a tandem structure are as follows:

(1) Anode/first organic functional layer/intermediate layer/second organic functional layer/cathode; and
(2) Anode/first organic functional layer/intermediate layer/second organic functional layer/intermediate layer/third organic functional layer/cathode.

Here, the above-described first organic functional layer, second organic functional layer, and third organic functional layer may be the same or different. It may be possible that two organic functional layers are the same and the remaining one organic functional layer is different.

In addition, the organic functional layers each may be laminated directly or they may be laminated through an intermediate layer. Examples of an intermediate layer are: an intermediate electrode, an intermediate conductive layer, a charge generating layer, an electron extraction layer, a connecting layer, and an intermediate insulating layer. Known composing materials may be used as long as it can form a layer which has a function of supplying an electron to an adjacent layer to the anode, and a hole to an adjacent layer to the cathode.

Examples of a material used in an intermediate layer are: conductive inorganic compounds such as ITO (indium tin oxide), IZO (indium zinc oxide), $ZnO_2$, TiN, ZrN, HfN, TiOX, VOX, CuI, InN, GaN, $CuAlO_2$, $CuGaO_2$, $SrCu_2O_2$, $LaB_6$, $RuO_2$, and Al; a two-layer film such as $Au/Bi_2O_3$; a multi-layer film such as $SnO_2/Ag/SnO_2$, ZnO/Ag/ZnO, $Bi_2O_3/Au/Bi_2O_3$, $TiO_2/TiN/TiO_2$, and $TiO_2/ZrN/TiO_2$; fullerene such as $C_{60}$; and a conductive organic layer such as oligothiophene, metal phthalocyanine, metal-free phthalocyanine, metal porphyrin, and metal-free porphyrin. The present invention is not limited to them.

Examples of a tandem type light emitting unit are described in: U.S. Pat. No. 6,337,492, U.S. Pat. No. 7,420,203, U.S. Pat. No. 7,473,923, U.S. Pat. No. 6,872,472, U.S. Pat. No. 6,107,734, U.S. Pat. No. 6,337,492, WO 2005/009087, JP-A 2006-228712, JP-A 2006-24791, JP-A 2006-49393, JP-A 2006-49394, JP-A 2006-49396, JP-A 2011-96679, JP-A 2005-340187, JP Patent 4711424, JP Patent 3496681, JP Patent 3884564, JP Patent 4213169, JP-A 2010-192719, JP-A 2009-076929, JP-A 2008-078414, JP-A 2007-059848, JP-A 2003-272860, JP-A 2003-045676, and WO 2005/094130. The constitutions of the elements and the composing materials are described in these documents, however, the present invention is not limited to them.

Hereafter, each layer which composes a light emitting layer unit 16 will be described.

[Light Emitting Layer]

A light emitting layer used in an organic EL element 10 is a layer which provide a place of emitting light via an exciton produce by recombination of electrons and holes injected from an electrode or an adjacent layer. The light emitting portion may be either within the light emitting layer or at an interface between the light emitting layer and an adjacent layer thereof.

A total thickness of the light emitting layer is not particularly limited. However, in view of layer homogeneity, required voltage during light emission, and stability of the emitted light color against a drive electric current, a layer thickness is preferably adjusted to be in the range of 2 nm to 5 μm, more preferably, it is in the range of 2 nm to 500 nm, and still most preferably, it is in the range of 5 nm to 200 nm.

Each light emitting layer is preferably adjusted to be in the range of 2 nm to 1 μm, more preferably, it is in the range of 2 nm to 200 nm, and still most preferably, it is in the range of 3 nm to 150 nm.

It is preferable that the light emitting layer incorporates a light emitting dopant (a light emitting dopant compound, a dopant compound, or simply called as a dopant) and a host compound (a matrix material, a light emitting host compound, or simply called as a host).

(1. Light Emitting Dopant)

As a light emitting dopant used in a light emitting layer, it is preferable to employ: a fluorescence emitting dopant (also referred to as a fluorescent dopant and a fluorescent compound) and a phosphorescence emitting dopant (also referred to as a phosphorescent dopant and a phosphorescent emitting material). Among these, it is preferable that at least one light emitting layer contains a phosphorescence emitting dopant.

A concentration of a light emitting dopant in a light emitting layer may be arbitrarily decided based on the specific dopant employed and the required conditions of the device. A concentration of a light emitting dopant may be uniform in a thickness direction of the light emitting layer, or it may have any concentration distribution.

A light emitting layer may contain plural light emitting dopants. For example, it may use a combination of dopants each having a different structure, or a combination of a fluorescence emitting dopant and a phosphorescence emitting dopant. Any required emission color will be obtained by this.

Figure 4:
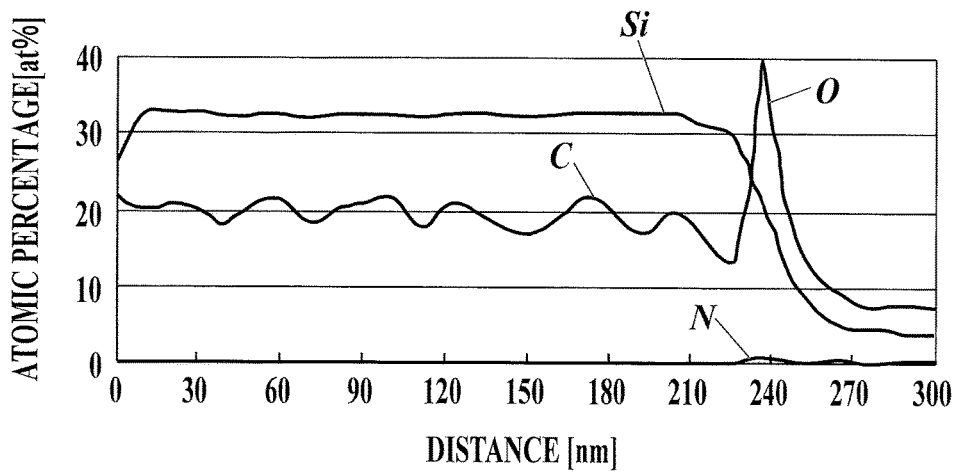
FIG. 4 is a drawing showing an expansion of a carbon distribution curve described in FIG. 3.

Color of light emitted by the organic EL element 10 is specified as follows. In FIG. 4.16 on page 108 of "Shinpen Shikisai Kagaku Handbook (New Edition Color Science Handbook)" (edited by The Color Science Association of Japan, Tokyo Daigaku Shuppan Kai, 1985), values determined via a spectroradiometric luminance meter CS-2000 (produced by Konica Minolta, Inc.) are applied to the CIE chromaticity coordinate, whereby the color is specified.

It is preferable that the organic EL element 10 exhibits white emission by incorporating one or plural light emitting layers contain plural emission dopants having different emission colors. The combination of emission dopants producing white is not specifically limited. It may be cited, for example, combinations of: blue and orange; and blue, green and red.

It is preferable that "white" in the organic EL element 10 shows chromaticity in the CIE 1931 Color Specification System at 1,000 cd/m2 in the region of X=0.39±0.09 and Y=0.38±0.08, when measurement is done to 2-degree viewing angle front luminance via the aforesaid method.

(1-1. Phosphorescence Emitting Dopant)

The phosphorescence emitting dopant is a compound which is observed emission from an excited triplet state thereof. Specifically, it is a compound which emits phosphorescence at room temperature (25° C.) and exhibits a phosphorescence quantum yield of at least 0.01 at 25° C. The phosphorescence quantum yield is preferably at least 0.1.

The phosphorescence quantum yield will be determined via a method described in page 398 of Bunko II of Dai 4 Han Jikken Kagaku Koza 7 (Spectroscopy II of 4th Edition Lecture of Experimental Chemistry 7) (1992, published by Maruzen Co. Ltd.). The phosphorescence quantum yield in a solution will be determined using appropriate solvents. However, it is only necessary for the phosphorescent dopant of the present invention to exhibit the above phosphorescence quantum yield (0.01 or more) using any of the appropriate solvents.

Two kinds of principles regarding emission of a phosphorescence emitting dopant are cited. One is an energy transfer-type, wherein carriers recombine on a host compound on which the carriers are transferred to produce an excited state of the host compound, and then, via transfer of this energy to a phosphorescent dopant, emission from the phosphorescence emitting dopant is realized. The other is a carrier trap-type, wherein a phosphorescence emitting dopant serves as a carrier trap and then carriers recombine on the phosphorescent dopant to generate emission from the phosphorescent dopant. In each case, the excited state energy of the phosphorescent dopant is required to be lower than that of the host compound.

A phosphorescence emitting dopant may be suitably selected and employed from the known materials used for a light emitting layer for an organic EL element 10.

Examples of a known phosphorescence emitting dopant are compound described in the following publications.

Nature 395, 151 (1998), Appl. Phys. Lett. 78, 1622 (2001), Adv. Mater. 19, 739 (2007), Chem. Mater. 17, 3532 (2005), Adv. Mater. 17, 1059 (2005), WO 2009/100991, WO 2008/101842, WO 2003/040257, US 2006/0202194, US 2007/0087321, and US 2005/0244673.

Inorg. Chem. 40, 1704 (2001), Chem. Mater. 16, 2480 (2004), Adv. Mater. 16, 2003 (2004), Angew. Chem. Int. Ed. 2006, 45, 7800, Appl. Phys. Lett. 86, 153505 (2005), Chem. Lett. 34, 592 (2005), Chem. Commun. 2906 (2005), Inorg. Chem. 42, 1248 (2003), WO 2009/050290, WO 2002/015645, WO 2009/000673, US 2002/0034656, U.S. Pat. No. 7,332,232, US 2009/0108737, US 2009/0039776, U.S. Pat. No. 6,921,915, U.S. Pat. No. 6,687,266, US 2007/0190359, US 2006/0008670, US 2009/0165846, US 2008/0015355, U.S. Pat. No. 7,250,226, U.S. Pat. No. 7,396,598, US 2006/0263635, US 2003/0138657, US 2003/0152802, and U.S. Pat. No. 7,090,928.

Angew. Chem. Int. Ed. 47, 1 (2008), Chem. Mater. 18, 5119 (2006), Inorg. Chem. 46, 4308 (2007), Organometallics 23, 3745 (2004), Appl. Phys. Lett. 74, 1361 (1999), WO 2002/002714, WO 2006/009024, WO 2006/056418, WO 2005/019373, WO 2005/123873, WO 2005/123873, WO 2007/004380, WO 2006/082742, US 2006/0251923, US 2005/0260441, U.S. Pat. No. 7,393,599, U.S. Pat. No. 7,534,505, U.S. Pat. No. 7,445,855, US 2007/0190359, US 2008/0297033, U.S. Pat. No. 7,338,722, US 2002/0134984, and U.S. Pat. No. 7,279,704.

WO 2005/076380, WO 2010/032663, WO 2008/140115, WO 2007/052431, WO 2011/134013, WO 2011/157339, WO 2010/086089, WO 2009/113646, WO 2012/020327, WO 2011/051404, WO 2011/004639, WO 2011/073149, JP-A 2012-069737, JP-A 2012-195554, JP-A 2009-114086, JP-A 2003-81988, JP-A 2002-302671 and JP-A 2002-363552.

Among them, preferable phosphorescence emitting dopants are organic metal complexes containing Ir as a center metal. More preferable are complexes containing at least one coordination mode selected from a metal-carbon bond, a metal-nitrogen bond, a metal-oxygen bond and a metal-sulfur bond.

Specific examples of a known phosphorescence emitting dopant applicable to a light emitting layer are cited in the following. The phosphorescence emitting dopants are not limited to them, and other compound may be applied.

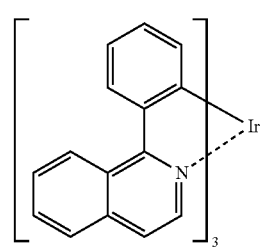

D-1

D-2
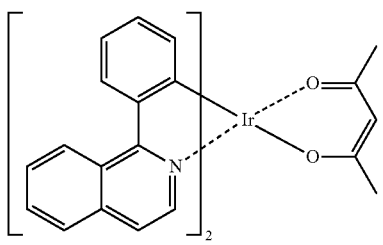
D-3
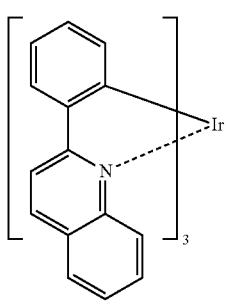
D-4
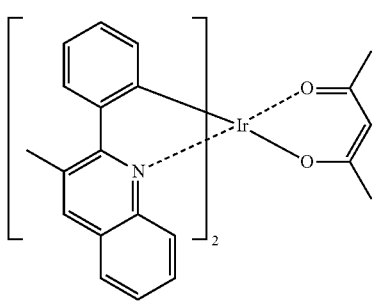
D-5
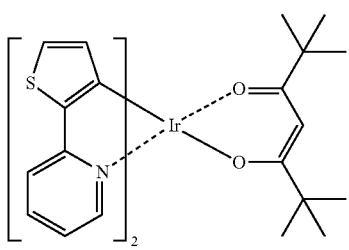
D-6
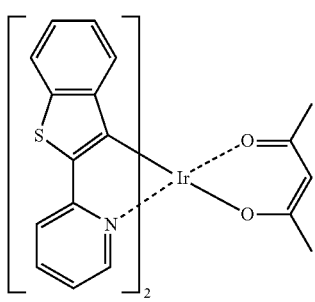
D-7
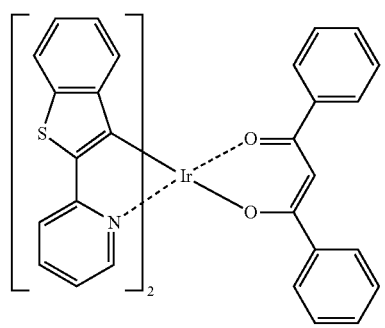
D-8
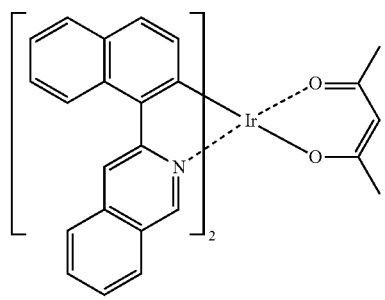
D-9
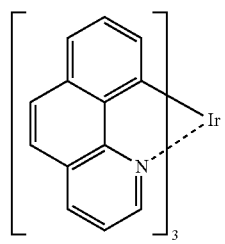
D-10
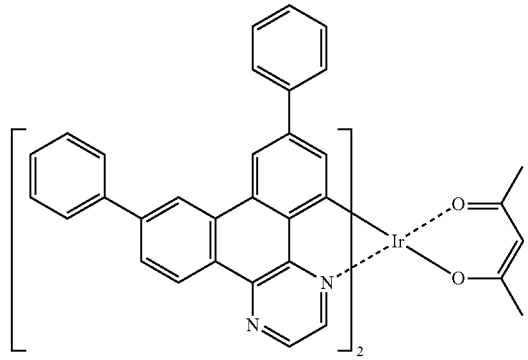
D-11
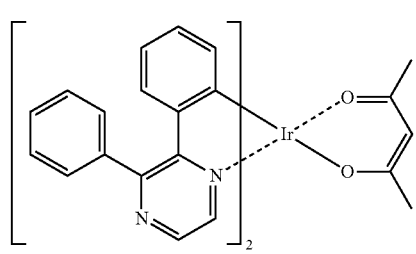

D-12 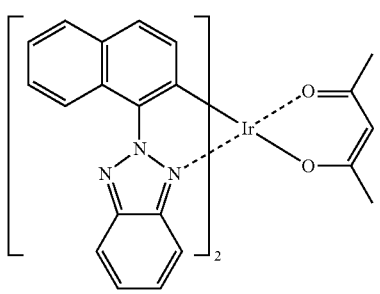
D-13 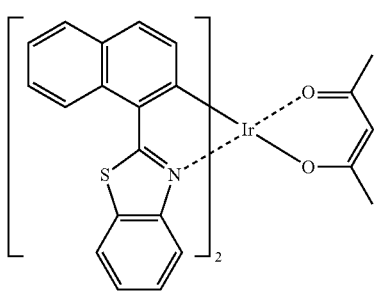
D-14 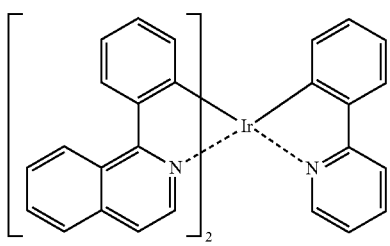
D-15 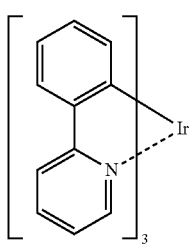
D-16 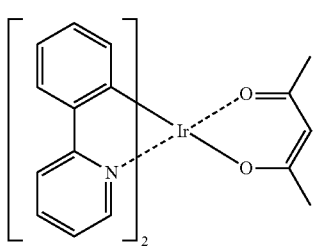
D-17 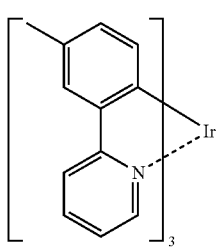
D-18 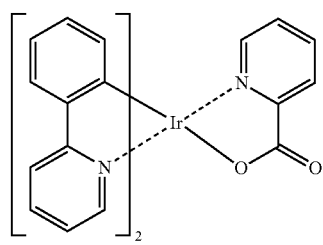
D-19 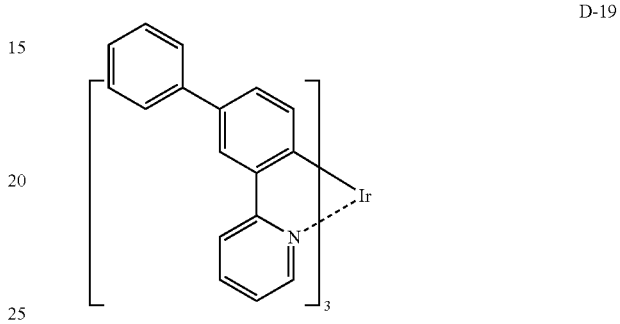
D-20 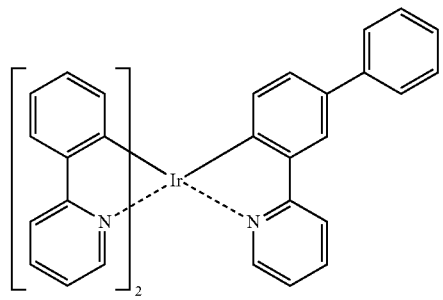
D-21 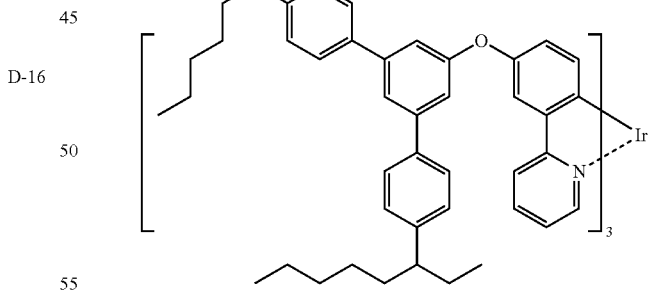
D-22 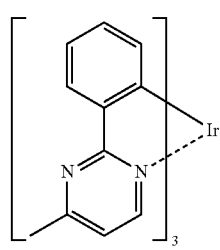

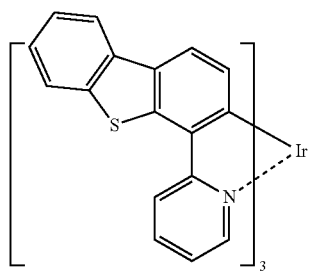
D-23
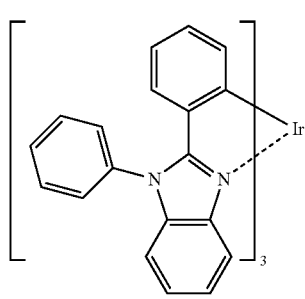
D-24
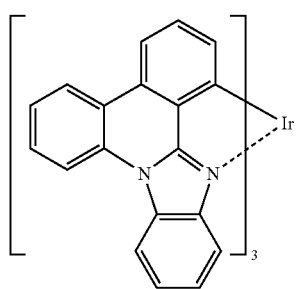
D-25
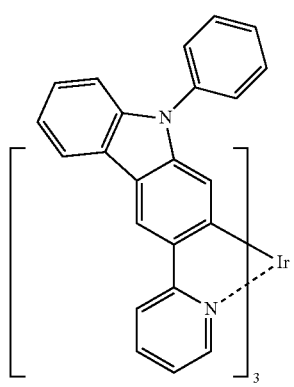
D-26
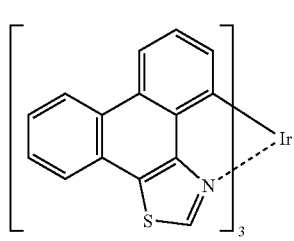
D-27
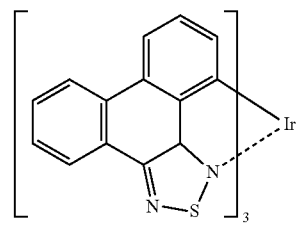
D-28
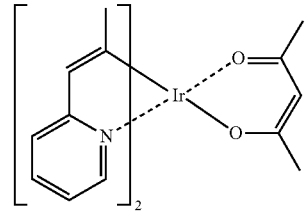
D-29
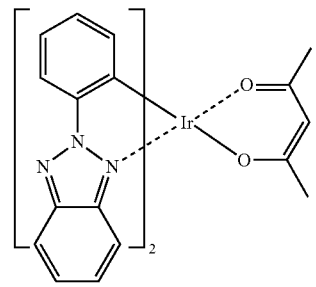
D-30
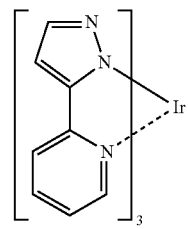
D-31
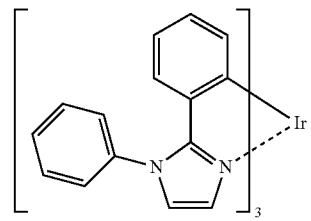
D-32
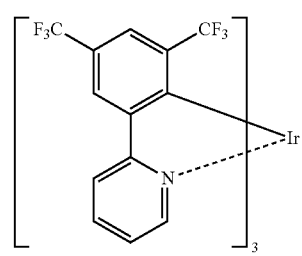
D-33

D-34
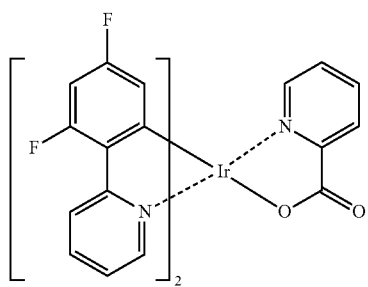
D-35
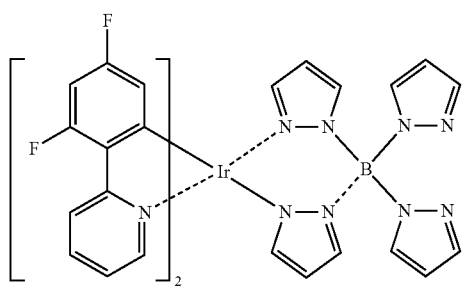
D-36
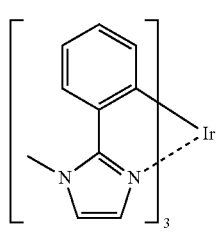
D-37
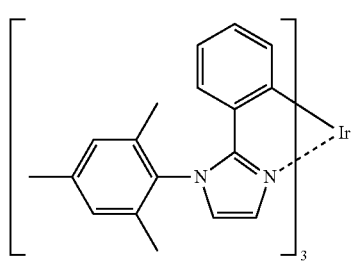
D-38
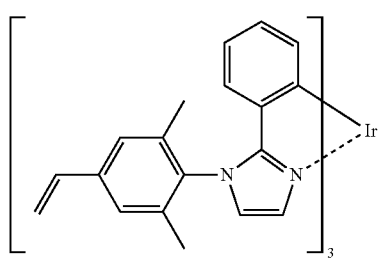
D-39
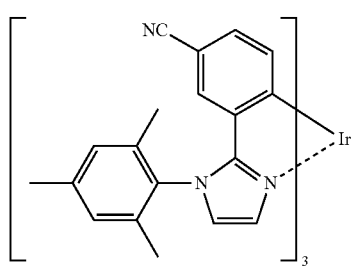
D-40
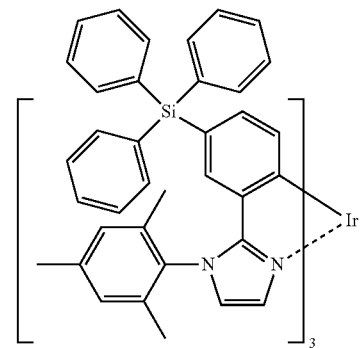
D-41
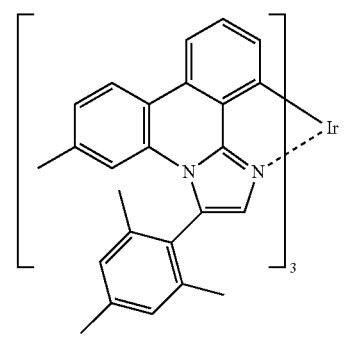
D-42
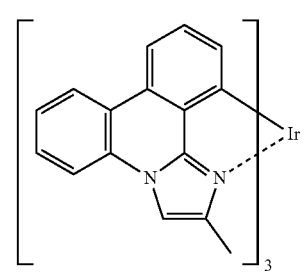
D-43
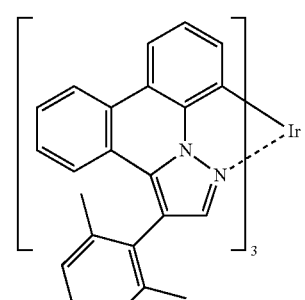
D-44
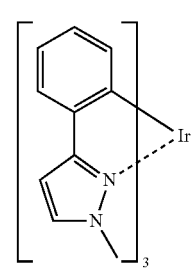

D-45
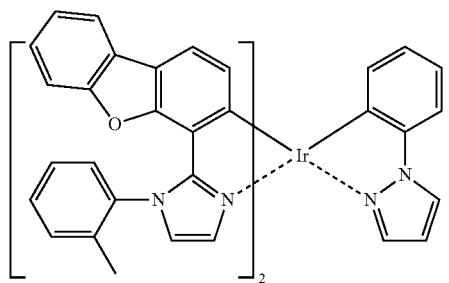
D-46
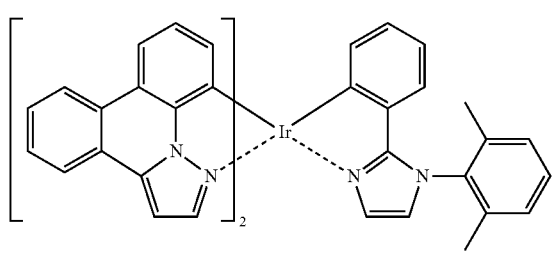
D-47
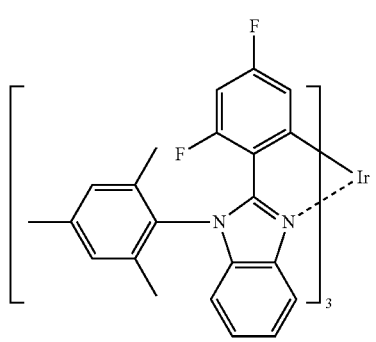
D-48
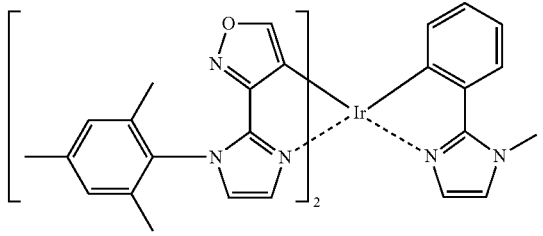
D-49
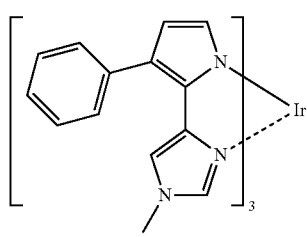
D-50
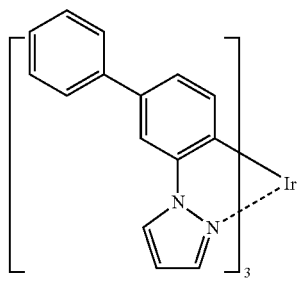
D-51
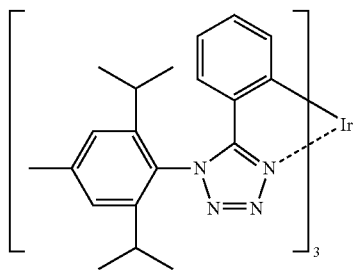
D-52
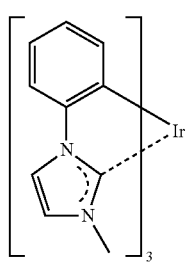
D-53
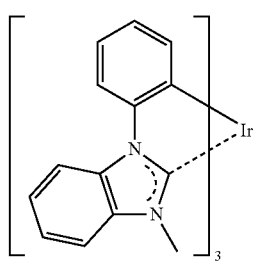
D-54
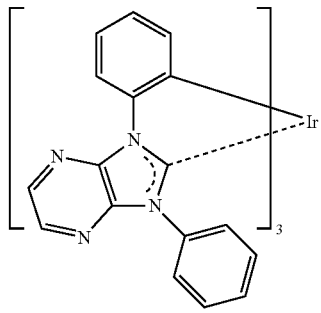

-continued
D-55
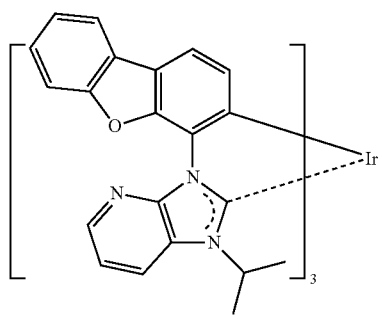
D-56
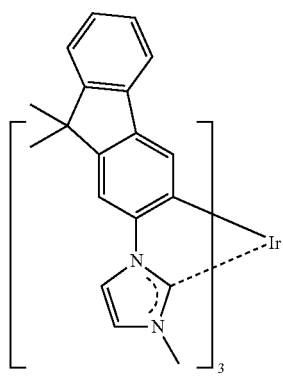
D-57
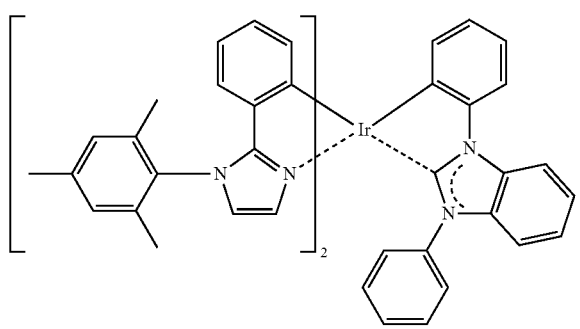
D-58
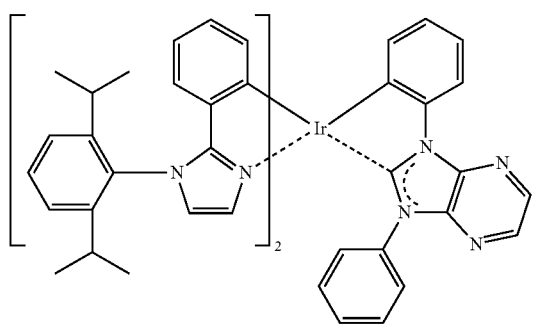
D-59
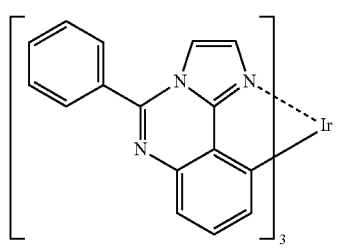
-continued
D-60
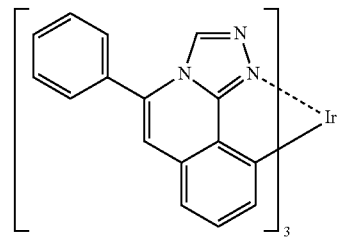
D-61
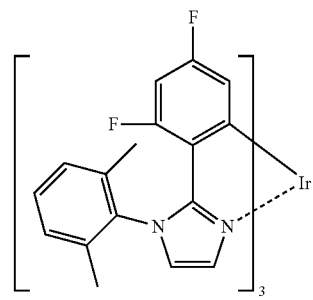
D-62
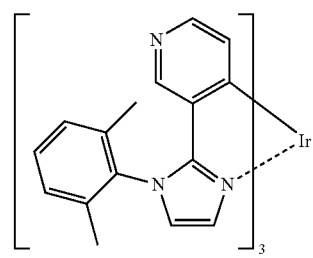
D-63
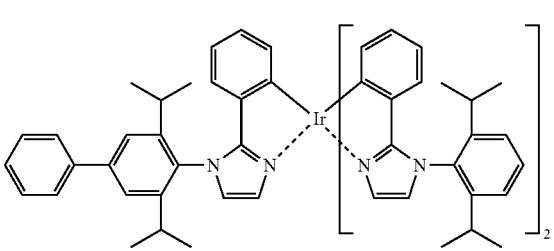
D-64
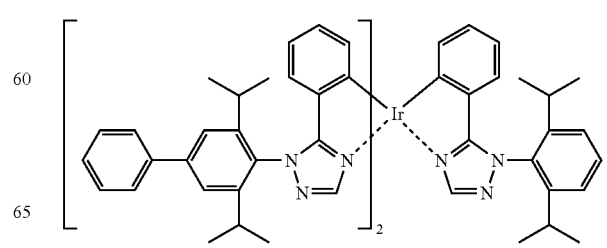

D-65
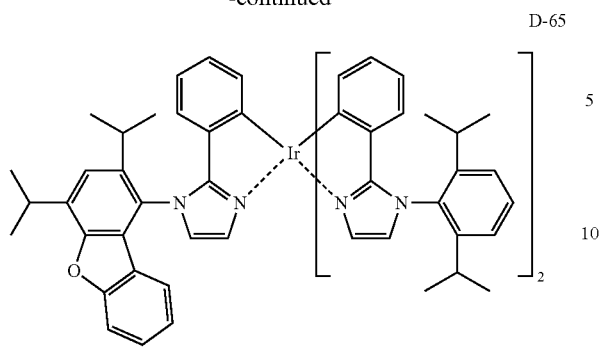
D-66
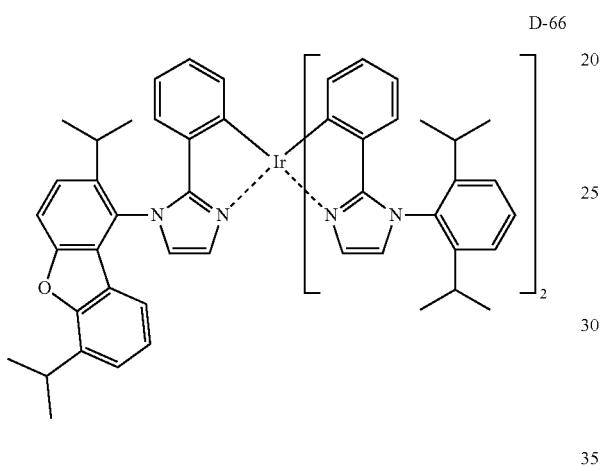
D-67
D-68
D-69
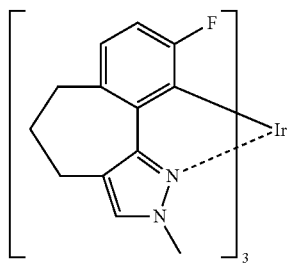
D-70
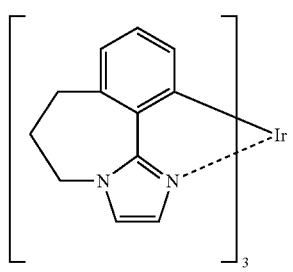
D-71
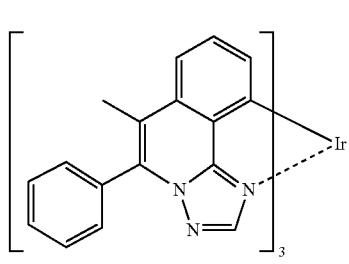
D-72
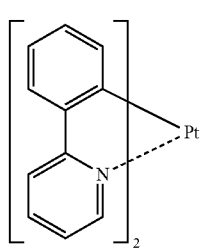
D-73
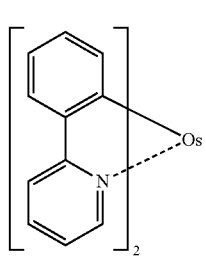
D-74
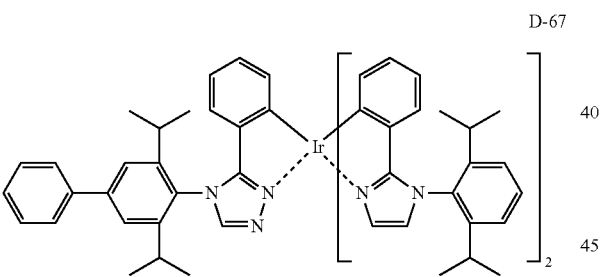
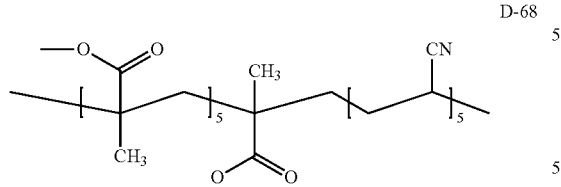
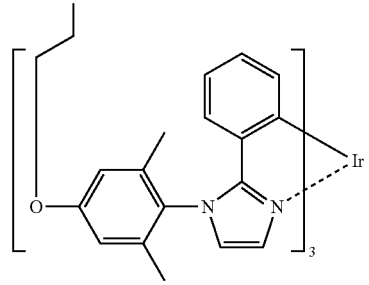

D-75 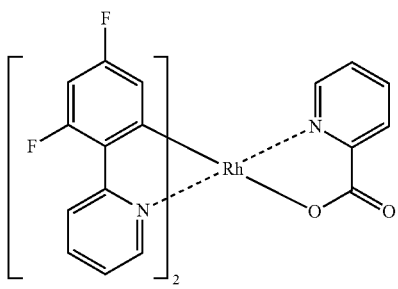

D-76 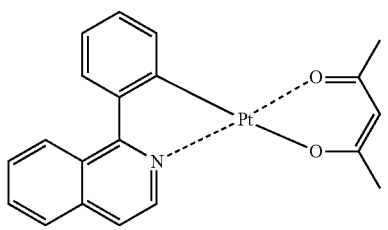

D-77 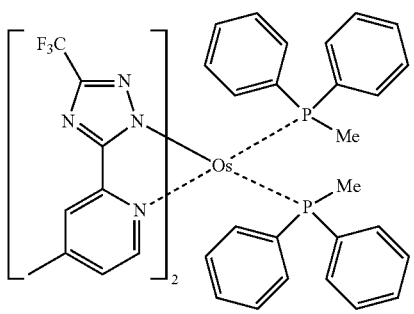

D-78 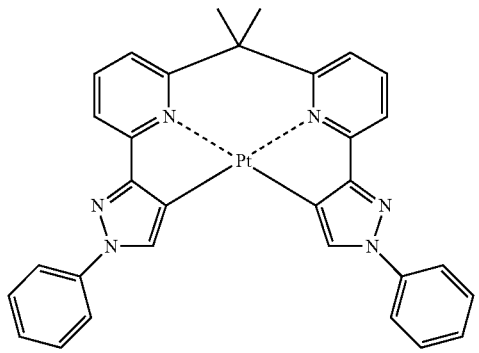

D-79 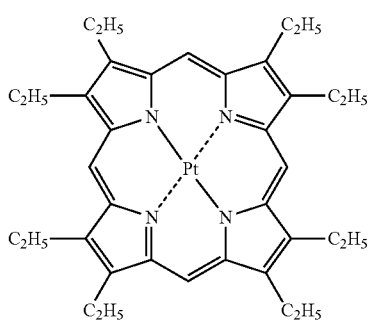

D-80 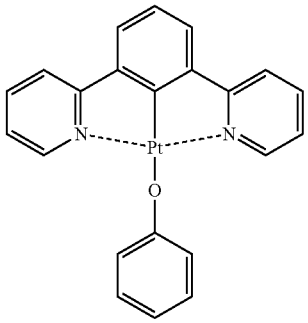

D-81 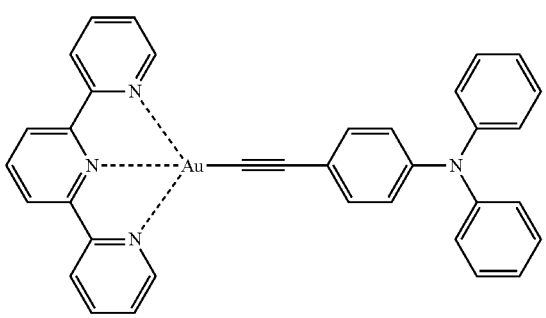

(1-2. Fluorescence Emitting Dopant)

A fluorescence emitting dopant is a compound which is capable of emitting light from an excited singlet. It is not specifically limited as long as an emission from an excited singlet is observed.

As fluorescence emitting dopants, listed are compounds such as: an anthracene derivative, a pyrene derivative, a chrysene derivative, a fluoranthene derivative, a perylene derivative, a fluorene derivative, an arylacetylene derivative, a styrylarylene derivative, a styrylamine derivative, an arylamine derivative, a boron complex, a coumarin derivative, a pyran derivative, a cyanine derivative, a croconium derivative, a squarium derivative, an oxobenzanthracene derivative, a fluorescein derivative, a rhodamine derivative, a pyrylium derivative, a perylene derivative, a polythiophene derivative, and a rare earth complex compound.

As a fluorescence emitting dopant, it may be used a light emitting dopant utilizing delayed fluorescence. Specific examples of utilizing delayed fluorescence are compounds described in: WO 2011/156793, JP-A 2011-213643, and JP-A 2010-93181.

(2. Host Compound)

A host compound is a compound which mainly plays a role of injecting or transporting a charge in a light emitting layer. In an organic EL element 10, an emission from the host compound itself is substantially not observed. Preferably, a host compound is a compound exhibiting a phosphorescent quantum yield of the phosphorescence emission of less than 0.1 at room temperature (25° C.). More preferably, it is a compound exhibiting a phosphorescent quantum yield of less than 0.01. Further, among the compounds incorporated in the light emitting layer, a mass ratio of the host compound in the aforesaid layer is preferably at least 20%.

It is preferable that an exited energy level of a host compound is higher than an exited energy level of a light emitting dopant incorporated in the same layer.

Host compounds may be used singly or may be used in combination of two or more compounds. By using plural host compounds, it is possible to adjust transfer of charge, thereby it is possible to achieve high efficiency of an organic EL element 10.

A host compound used in a light emitting layer is not specifically limited, and known compounds used in organic EL elements may be used. For example, it may be either a low molecular weight compound or a polymer compound having a repeating unit. Further, it may be a compound provided with a reactive group such as a vinyl group and an epoxy group.

A known light emitting host which may be used in the present invention is preferably a compound having a hole transporting ability and an electron transporting ability, as well as preventing elongation of an emission wavelength and having a high Tg (a glass transition temperature). It is preferable that a host compound has a Tg of 90° C. or more, more preferably, has a Tg of 120° C. or more. A glass transition temperature (Tg) is a value obtained using DCS (Differential Scanning Colorimetry) based on the method in conformity to JIS-K-7121.

As specific examples of a host compounds, the compounds described in the following Documents are cited. However, the present invention is not to them.

Japanese patent application publication (JP-A) Nos. 2001-257076, 2002-308855, 2001-313179, 2002-319491, 2001-357977, 2002-334786, 2002-8860, 2002-334787, 2002-15871, 2002-334788, 2002-43056, 2002-334789, 2002-75645, 2002-338579, 2002-105445, 2002-343568, 2002-141173, 2002-352957, 2002-203683, 2002-363227, 2002-231453, 2003-3165, 2002-234888, 2003-27048, 2002-255934, 2002-260861, 2002-280183, 2002-299060, 2002-302516, 2002-305083, 2002-305084 and 2002-308837; US Patent Application Publication (US) Nos. 2003/0175553, 2006/0280965, 2005/0112407, 2009/0017330, 2009/0030202, 2005/0238919; WO 2001/039234, WO 2009/021126, WO 2008/056746, WO 2004/093 207, WO 2005/089025, WO 2007/063796, WO 2007/063754, WO 2004/107822, WO 2005/030900, WO 2006/114966, WO 2009/086028, WO 2009/003898, WO 2012/023947, JP-A 2008-074939, JP-A 2007-254297 and EP 2034538.

[Electron Transport Layer]

An electron transport layer used for an organic EL element 10 is composed of a material having a function of transferring an electron. It has a function of transporting an injected electron from a cathode to a light emitting layer. An electron transport material may be used singly or plural kinds may be used in combination.

A total layer thickness of the electron transport layer is not specifically limited, however, it is generally in the range of 2 nm to 5 μm, and preferably, it is in the range of 2 nm to 500 nm, and more preferably, it is in the range of 5 nm to 200 nm.

In an organic EL element 10, it is known that there occurs interference between the light directly taken from the light emitting layer and the light reflected at the electrode located at the opposite side of the electrode from which the light is taken out at the moment of taking out the light which is produced in the light emitting layer. When the light is reflected at the cathode, it is possible to use effectively this interference effect by suitably adjusting the total thickness of the electron transport layer in the range of several nm to several μm.

On the other hand, the voltage will be increased when the layer thickness of the electron transport layer is made thick. Therefore, especially when the layer thickness is large, it is preferable that the electron mobility in the electron transport layer is 10-5 cm2/Vs or more.

As a material used for an electron transport layer (hereafter, it is called as an electron transport material), it is only required to have either a property of ejection or transport of electrons, or a bather to holes. Any of the conventionally known compounds may be selected and they may be employed.

Cited examples are: a nitrogen-containing aromatic heterocyclic derivative, an aromatic hydrocarbon ring derivative, a dibenzofuran derivative, a dibenzothiophene derivative, and a silole derivative.

Examples of the aforesaid nitrogen-containing aromatic heterocyclic derivative are: a carbazole derivative, an azacarbazole derivative, (a compound in which one or more carbon atoms constituting the carbazole ring are substitute with nitrogen atoms), a pyridine derivative, a pyrimidine derivative, a pyrazine derivative, a pyridazine derivative, a triazine derivative, a quinoline derivative, a quinoxaline derivative, a phenanthroline derivative, an azatriphenylene derivative, an oxazole derivative, a thiazole derivative, an oxadiazole derivative, a thiadiazole derivative, a triazole derivative, a benzimidazole derivative, a benzoxazole derivative, and a benzothiazole derivative.

Examples of an aromatic hydrocarbon ring derivative are: a naphthalene derivative, an anthracene derivative, and a triphenylene derivative.

Further, metal complexes having a ligand of a 8-quinolinol structure or dibnenzoquinolinol structure such as tris(8-quinolinol)aluminum (Alq3), tris(5,7-dichloro-8-quinolinol)aluminum, tris(5,7-dibromo-8-quinolinol)aluminum, tris(2-methyl-8-quinolinol)aluminum, tris(5-methyl-8-quinolinol)aluminum and bis(8-quinolinol)zinc (Znq); and metal complexes in which a central metal of the aforesaid metal complexes is substituted by In, Mg, Cu, Ca, Sn, Ga or Pb, may be also utilized as an electron transport material.

Further, metal-free or metal phthalocyanine, or a compound whose terminal is substituted by an alkyl group or a sulfonic acid group, may be preferably utilized as an electron transport material.

A distyryl pyrazine derivative, which is exemplified as a material for a light emitting layer, may be used as an electron transport material. Further, in the same manner as used for a hole injection layer and a hole transport layer, an inorganic semiconductor such as an n-type Si and an n-type SiC may be also utilized as an electron transport material. It may be used a polymer compound having incorporating any one of these compound in a polymer side chain, or a compound having any one of these compound in a polymer main chain.

Further, in an organic EL element 10, it is possible to employ an electron transport layer of a higher n property (electron rich) which is doped with impurities as a guest material. As examples of a dope material, listed are those described in each of JP-A Nos. 4-297076, 10-270172, 2000-196140, 2001-102175, as well as in J. Appl. Phys., 95, 5773 (2004).

Although the present invention is not limited thereto, preferable examples of a known electron transport material used in an organic EL element 10 are compounds described in the following publications: U.S. Pat. No. 6,528,187, U.S. Pat. No. 7,230,107, US 2005/0025993, US 2004/0036077, US 2009/0115316, US 2009/0101870, US 2009/0179554, WO 2003/060956, WO 2008/132085, Appl. Phys. Lett. 75, 4 (1999), Appl. Phys. Lett. 79, 449 (2001), Appl. Phys. Lett. 81, 162 (2002), Appl. Phys. Lett. 81, 162 (2002), Appl. Phys. Lett. 79, 156 (2001), U.S. Pat. No. 7,964,293, WO 2004/080975, WO 2004/063159, WO 2005/085387, WO 2006/

067931, WO 2007/086552, WO 2008/114690, WO 2009/069442, WO 2009/066779, WO 2009/054253, WO 2011/086935, WO 2010/150593, WO 2010/047707, EP 2311826, JP-A 2010-251675, JP-A 2009-209133, JP-A 2009-124114, JP-A 2008-277810, JP-A 2006-156445, JP-A 2005-340122, JP-A 2003-45662, JP-A 2003-31367, JP-A 2003-282270, and WO 2012/115034.

Examples of a more preferable electron transport material are: a pyridine derivative, a pyrimidine derivative, a pyrazine derivative, a triazine derivative, a dibenzofuran derivative, a dibenzothiophene derivative, a carbazole derivative, an azacarbazole derivative, and a benzimidazole derivative.

[Hole Blocking Layer]

A hole blocking layer is a layer provided with a function of an electron transport layer in a broad meaning. Preferably, it contains a material having a function of transporting an electron, and having very small ability of transporting a hole. It can improve the recombination probability of an electron and a hole by blocking a hole while transporting an electron.

Further, a composition of an electron transport layer described above may be appropriately utilized as a hole blocking layer when needed.

A hole blocking layer placed in an organic EL element 10 is preferably arranged at a location in the light emitting layer adjacent to the cathode side.

In an organic EL element 10, a thickness of a hole blocking layer is preferably in the range of 3 to 100 nm, and more preferably, in the range of 5 to 30 nm.

With respect to a material used for a hole blocking layer, the material used in the aforesaid electron transport layer is suitably used, and further, the material used as the aforesaid host compound is also suitably used for a hole blocking layer.

[Electron Injection Layer]

An electron injection layer (it is also called as "a cathode buffer layer") is a layer which is arranged between a cathode and a light emitting layer to decrease an operating voltage and to improve an emission luminance. An example of an electron injection layer is detailed in volume 2, chapter 2 "Electrode materials" (pp. 123-166) of "Organic EL Elements and Industrialization Front thereof (Nov. 30, 1998, published by N.T.S. Co. Ltd.)".

An electron injection layer is provided in an organic EL element 10 according to necessity, and as described above, it is placed between a cathode and a light emitting layer, or between a cathode and an electron transport layer.

An electron injection layer is preferably a very thin layer. The layer thickness thereof is preferably in the range of 0.1 to 5 nm depending on the materials used. In addition, the layer may be an unequal layer in which the composing material exists intermittently.

An election injection layer is detailed in JP-A Nos. 6-325871, 9-17574, and 10-74586. Examples of a material preferably used in an election injection layer include: a metal such as strontium and aluminum; an alkaline metal compound such as lithium fluoride, sodium fluoride, or potassium fluoride; an alkaline earth metal compound such as magnesium fluoride; a metal oxide such as aluminum oxide; and a metal complex such as lithium 8-hydroxyquinolate (Liq). It is possible to use the aforesaid electron transport materials. The above-described materials may be used singly or plural kinds may be used in an election injection layer.

[Hole Transport Layer]

A hole transport layer contains a material having a function of transporting a hole. A hole transport layer is a layer having a function of transporting a hole injected from an anode to a light emitting layer.

The total layer thickness of a hole transport layer in an organic EL element 10 is not specifically limited, however, it is generally in the range of 0.5 nm to 5 μm, preferably in the range of 2 nm to 500 nm, and more preferably in the range of 5 nm to 200 nm.

A material used in a hole transport layer (hereafter, it is called as a hole transport material) is only required to have any one of properties of injecting and transporting a hole, and a barrier property to an electron. A hole transport material may be suitably selected from the conventionally known compounds. A hole transport material may be used singly, or plural kinds may be used.

Examples of a hole transport material include: a porphyrin derivative, a phthalocyanine derivative, an oxazole derivative, an oxadiazole derivative, a triazole derivative, an imidazole derivative, a pyrazoline derivative, a pyrazolone derivative, a phenylenediamine derivative, a hydrazone derivative, a stilbene derivative, a polyarylalkane derivative, a triarylamine derivative, a carbazole derivative, an indolocarbazole derivative, an isoindole derivative, an acene derivative of anthracene or naphthalene, a fluorene derivative, a fluorenone derivative, polyvinyl carbazole, a polymer or an oligomer containing an aromatic amine in a side chain or a main chain, polysilane, and a conductive polymer or oligomer (e.g., PEDOT: PSS, aniline type copolymer, polyaniline and polythiophene).

Examples of a triarylamine derivative include: a benzidine type represented by α-NPD, a star burst type represented by MTDATA, a compound having fluorenone or anthracene in a triarylamine bonding core.

A hexaazatriphenylene derivative described in JP-A Nos. 2003-519432 and 2006-135145 may be also used as a hole transport material.

In addition, it is possible to employ an electron transport layer of a higher p property which is doped with impurities. As its example, listed are those described in each of JP-A Nos. 4-297076, 2000-196140, and 2001-102175, as well as in J. Appl. Phys., 95, 5773 (2004).

Further, it is possible to employ so-called p-type hole transport materials, and inorganic compounds such as p-type Si and p-type SiC, as described in JP-A No. 11-251067, and J. Huang et al. reference (Applied Physics Letters 80 (2002), p. 139). Moreover, an orthometal compounds having Ir or Pt as a center metal represented by Ir(ppy)3 are also preferably used.

Although the above-described compounds may be used as a hole transport material, preferably used are: a triarylamine derivative, a carbazole derivative, an indolocarbazole derivative, an azatriphenylene derivative, an organic metal complex, a polymer or an oligomer incorporated an aromatic amine in a main chain or in a side chain.

Examples of a hole transport material used in an organic EL element 10 are compounds in the aforesaid publications and in the following publications. However, the present invention is not limited to them.

Appl. Phys. Lett. 69, 2160(1996), J. Lumin 72-74, 985 (1997), Appl. Phys. Lett. 78, 673(2001), Appl. Phys. Lett. 90, 183503(2007), Appl. Phys. Lett. 51, 913(1987), Synth. Met. 87, 171(1997), Synth. Met. 91, 209(1997), Synth. Met. 111, 421(2000), SID Symposium Digest, 37, 923(2006), J. Mater. Chem. 3, 319(1993), Adv. Mater. 6, 677(1994), Chem. Mater. 15, 3148(2003), US 2003/0162053, US 2002/0158242, US 2006/0240279, US 2008/0220265, U.S. Pat. No. 5,061,569, WO 2007/002683, WO 2009/018009, EP 650955, US 2008/0124572, US 2007/0278938, US 2008/

0106190, US 2008/0018221, WO 2012/115034, JP-A 2003-519432, JP-A 2006-135145, and U.S. patent application Ser. No. 13/585,981.]

[Electron Blocking Layer]

An electron blocking layer is a layer provided with a function of a hole transport layer in a broad meaning. Preferably, it contains a material having a function of transporting a hole, and having very small ability of transporting an electron. It can improve the recombination probability of an electron and a hole by blocking an electron while transporting a hole.

Further, a composition of a hole transport layer described above may be appropriately utilized as an electron blocking layer of an organic EL element 10 when needed. An electron blocking layer placed in an organic EL element 10 is preferably arranged at a location in the light emitting layer adjacent to the anode side.

A thickness of an electron blocking layer is preferably in the range of 3 to 100 nm, and more preferably, in the range of 5 to 30 nm.

With respect to a material used for an electron blocking layer, the material used in the aforesaid hole transport layer is suitably used, and further, the material used as the aforesaid host compound is also suitably used for an electron blocking layer.

[Hole Injection Layer]

A hole injection layer (it is also called as "an anode buffer layer") is a layer which is arranged between an electrode and a light emitting layer to decrease an operating voltage and to improve an emission luminance. An example of a hole injection layer is detailed in volume 2, chapter 2 "Electrode materials" (pp. 123-166) of "Organic EL Elements and Industrialization Front thereof (Nov. 30, 1998, published by N.T.S. Co. Ltd.)". A hole injection layer is provided according to necessity, and as described above, it is placed between an anode and a light emitting layer, or between an anode and a hole transport layer.

A hole injection layer is also detailed in JP-A Nos. 9-45479, 9-260062 and 8-288069. Materials used in the hole injection layer are the same materials used in the aforesaid hole transport layer. Among them, preferable materials are: a phthalocyanine derivative represented by copper phthalocyanine; a hexaazatriphenylene derivative described in JP-A Nos. 2003-519432 and 2006-135145; a metal oxide represented by vanadium oxide; a conductive polymer such as amorphous carbon, polyaniline (or called as emeraldine) and polythiophene; an orthometalated complex represented by tris(2-phenylpyridine) iridium complex; and a triarylamine derivative.

The above-described materials used in a hole injection layer may be used singly or plural kinds may be used.

[Other Additive]

An organic functional layer which composes an organic EL element 10 may further contain other additive. Examples of an additive are: halogen elements such as bromine, iodine and chlorine, and a halide compound; and a compound, a complex and a salt of an alkali metal, an alkaline earth metal and a transition metal such as Pd, Ca and Na.

Although a content of an additive may be arbitrarily decided, preferably, it is 1,000 ppm or less based on the total mass of the layer containing the additive, more preferably, it is 500 ppm or less, and still more preferably, it is 50 ppm or less.

In order to improve a transporting ability of an electron or a hole, or to facilitate energy transport of an exciton, the content of the additive is not necessarily within these range, and other range of content may be used.

[Forming Method of Organic Functional Layer]

It will be described forming methods of organic functional layers of an organic EL element 10 (hole injection layer, hole transport layer, light emitting layer, hole blocking layer, electron transport layer, and electron injection layer).

Forming methods of organic functional layers are not specifically limited. They may be formed by using a known method such as a vacuum vapor deposition method and a wet method (wet process).

Examples of a wet process include: a spin coating method, a cast method, an inkjet method, a printing method, a die coating method, a blade coating method, a roll coating method, a spray coating method, a curtain coating method, and a LB method (Langmuir Blodgett method).

From the viewpoint of getting a uniform thin layer with high productivity, preferable are method highly appropriate to a roll-to-roll method such as a die coating method, a roll coating method, an inkjet method, and a spray coating method.

In a wet process, examples of a liquid medium to dissolve or to disperse a material for an organic functional layer include: ketones such as methyl ethyl ketone and cyclohexanone; aliphatic esters such as ethyl acetate; halogenated hydrocarbons such as dichlorobenzene; aromatic hydrocarbons such as toluene, xylene, mesitylene, and cyclohexylbenzene; aliphatic hydrocarbons such as cyclohexane, decalin, and dodecane; organic solvents such as DMF and DMSO.

These will be dispersed with a dispersion method such as an ultrasonic dispersion method, a high shearing dispersion method and a media dispersion method.

When a vapor deposition method is adopted for forming each layer which composes an organic functional layer, the vapor deposition conditions will change depending on the compounds used. Generally, the following ranges are suitably selected for the conditions, heating temperature of boat: 50 to 450° C., level of vacuum: 10-6 to 10-2 Pa, vapor deposition rate: 0.01 to 50 nm/sec, temperature of substrate: −50 to 300° C., and layer thickness: 0.1 nm to 5 μm, preferably 5 to 200 nm.

Formation of an organic EL element 10 is preferably continuously carried out from an organic functional layer to a cathode with one time vacuuming. It may be taken out on the way, and a different layer forming method may be employed. In that case, the operation is preferably done under a dry inert gas atmosphere. In addition, different formation methods may be applied for each layer.

[First Electrode]

As a first electrode 13, a metal having a large work function (4 eV or more, preferably, 4.3 eV or more), an alloy, and a conductive compound and a mixture thereof are utilized as an electrode substance.

Specific examples of an electrode substance are: metals such as Au and Ag, and an alloy thereof; transparent conductive materials such as CuI, indium tin oxide (ITO), SnO2, and ZnO. Further, a material such as IDIXO (In2O3-ZnO), which can form an amorphous and transparent electrode, may also be used.

As for a first electrode 13, these electrode substances may be made into a thin layer by a method such as a vapor deposition method or a sputtering method; followed by making a pattern of a desired form by a photolithography method. Otherwise, in the case of requirement of pattern precision is not so severe (about 100 μm or more), a pattern may be formed through a mask of a desired form at the time of layer formation with a vapor deposition method or a sputtering method using the above-described material.

Alternatively, when a coatable substance such as an organic conductive compound is employed, it is possible to employ a wet film forming method such as a printing method or a coating method.

When emitted light is taken out from the side of the first electrode 13, The transmittance is preferably set to be not less than 10%. A sheet resistance of a first electrode 13 is preferably a few hundred Ω/sq or less. Further, although a layer thickness of the first electrode 13 depends on a material, it is generally selected in the range of 10 nm to 1 μm, and preferably in the range of 10 to 200 nm.

Specifically, it is preferable that the first electrode 13 is a layer composed of silver as a main ingredient, and it is preferably made of silver or an alloy containing silver as a main component.

As a forming method of the first electrode 13 as described above, it may be cited: wet processes such as an application method, an inkjet method, a coating method and a dip method; and dry processes such as a vapor deposition method (resistance heating, EB method), a sputtering method, and CVD. Among them, a vapor deposition method is preferably used.

Examples of an alloy which contains silver (Ag) as a main component for forming the first electrode 13 are: silver magnesium (AgMg), silver copper (AgCu), silver palladium (AgPd), silver palladium copper (AgPdCu) and silver indium (AgIn).

The above-described first electrode 13 may have a constitution in which plural layers made of silver or an alloy containing silver as a main component are separately made and they are laminated according to necessity.

Further, a preferable thickness of this first electrode 13 is in the range of 4 to 15 nm. When it is 15 nm or less, an absorbing component and a reflection component of the layer may be kept at low level, and as a result, a transparency of the transparent barrier layer will be maintained, which is preferable. By making the thickness to be 4 nm or more, the conductivity of the layer will be also maintained.

In the case of forming a layer composed of silver as a main component as a first electrode 13, it may form an underlayer of the first electrode 13. The underlayer may be other conductive layer containing Pd, or an organic layer containing a nitrogen compound or a sulfur compound. By forming an underlayer, it can improve a layer forming property of a layer composed of silver as a main component; it can decrease resistivity of the first electrode 13; and it can improve transparency of the first electrode 13.

[Second Electrode]

As a second electrode 15, a metal having a small work function (4 eV or less) (it is called as an electron injective metal), an alloy, a conductive compound and a mixture thereof are utilized as an electrode substance.

Specific examples of the aforesaid electrode substance includes: sodium, sodium-potassium alloy, magnesium, lithium, a magnesium/copper mixture, a magnesium/silver mixture, a magnesium/aluminum mixture, a magnesium/indium mixture, an aluminum/aluminum oxide (Al2O3) mixture, indium, a lithium/aluminum mixture, aluminum, and a rare earth metal.

Among them, with respect to an electron injection property and durability against oxidation, preferable are: a mixture of election injecting metal with a second metal which is stable metal having a work function larger than the electron injecting metal. Examples thereof are: a magnesium/silver mixture, a magnesium/aluminum mixture, a magnesium/indium mixture, an aluminum/aluminum oxide (Al2O3) mixture, a lithium/aluminum mixture and aluminum.

The second electrode 15 may be made by using these electrode substances with a method such as a vapor deposition method or a sputtering method. A sheet resistance of a second electrode 15 is preferably a few hundred Ω/sq or less. Further, a layer thickness of the second electrode 15 is generally selected in the range of 10 nm to 5 μm, and preferably in the range of 50 to 200 nm.

Further, after forming a layer of the aforesaid metal having a thickness of 1 to 20 nm on the second electrode 15, it is possible to prepare a transparent or translucent second electrode 15 by providing with a conductive transparent material described in the description for First electrode thereon. By applying this process, it is possible to produce an element in which both a first electrode 13 and a second electrode 15 are transparent.

[Sealing Layer]

An organic EL element 10 has a solid sealing by adhering a sealing member 18 through a sealing layer 17. The sealing layer 17 covers a first electrode 13, an organic functional layer 14 and a second electrode 15, which are provided on one surface of a flexible substrate 11.

Solid sealing of the organic EL element 10 may be formed as follows: coating an uncured resin material on adhering surfaces of the sealing member 18 and the flexible substrate 11 at plural spreading positions; pressing mutually the sealing member 18 and the flexible substrate 11 through the resin material; then curing the resin material to combine into a single unit.

The sealing layer 17 is provided in such a manner as covering a light emitting unit 16, and making to expose an edge portion (illustration omitted) of the first electrode 13 and the second electrode 15. It may have a composition in which an electrode is placed on the sealing member 18, and an electrical connection is made between this electrode and the edge portion of the first electrode 13 and the second electrode 15.

The sealing layer 17 is composed of a resin material (a resin sealing layer) for bonding the flexible substrate 11 and the sealing member 18.

In addition to the resin material (a resin sealing layer), it may be added an inorganic material (an inorganic sealing layer). For example, it may form a composition in which the first electrode 13, the organic functional layer 14 and the second electrode 15 are covered with an inorganic sealing layer, then the sealing member 18 and the flexible substrate 11 are bonded with the resin sealing layer.

[Resin Sealing Layer]

A resin sealing layer is used for fixing a sealing member 18 on a side of a flexible substrate 11. In addition, it is used as a sealing agent for sealing a first electrode 13, an organic functional layer 14 and a second electrode 15, which are sandwiched between a sealing member 18 and a flexible substrate 11.

In order to bond the sealing member 18 to the flexible substrate 11, it is preferable to bind them using a resin sealing layer of any curing type. In the resin sealing layer, an appropriate adhesive may be suitably selected from the viewpoint of improving close contact of the adjacent sealing member 18 and the flexible substrate 11.

A heat-curable resin is preferably used in such a resin sealing layer. As a heat-curable adhesive, it can use a resin containing as a main component: a compound having an ethylenic double bond at an end or a side chain of the molecule; and a thermal polymerization initiator.

More specifically, it can use a heat-curable adhesive composed of an epoxy resin and an acrylic resin. Further, a melt type heat-curable adhesive may be used in accordance with an adhesion apparatus and a hardening treatment apparatus used in the production step of an organic EL element 10.

A photo-curable resin is preferably used for the above-described resin sealing layer. Examples thereof are: a photo-radical polymerizable resin containing, as a main component, various (meth)acrylate such as acrylates polyester (meth)acrylates, polyether (meth)acrylate, epoxy(meth) acrylate, and polyurethane (meth)acrylate; a photo-cationic polymerizable resin containing, as a main component, resins such as an epoxy resin and a vinyl ether resin; and a thiol-ene addition type resin. Among these light curing resins, a photo-cationic polymerizable resin of epoxy resin type is preferable in view of low contraction rate of the cured product, low amount of outgassing and excellent in long term reliability.

A chemical hardening (two liquid mixture) resin may be used for such resin sealing layer. Further, hot melt type resins of polyamide, polyester and polyolefin can also be used. In addition, a UV curing epoxy resin of a cationic hardening type may be used.

An organic material which composes an organic EL element 10 may be deteriorated by a heating treatment. Therefore, it is preferable to use a resin material which enables to adhere and to be cured between room temperature and 80° C.

[Sealing Member]

A sealing member 18 covers an organic EL element 10. A sealing member 18 of a plate type (film type) is fixed to a side of a flexible substrate 11 via a sealing layer 17. Specific examples of a sealing member 18 of a plate type (film type) are a glass substrate and a polymer substrate. These substrate materials may be further made to be a thin film. Examples of a glass substrate include: soda-lime glass, barium-strontium containing glass, lead glass, aluminosilicate glass, borosilicate glass, barium borosilicate glass, and quartz. Further, listed examples of a polymer substrate are: polycarbonate, acryl, polyethylene terephthalate, polyether sulfide, and polysulfone.

As a sealing member 18, it is preferable to use a metal foil laminated with a resin film (polymer layer). The metal foil laminated with a resin film cannot be used for a flexible substrate 11 placed at a side from which light is taking out, however, it is low cost and it is a sealing material of low moisture permeability. Therefore, it is suitable for a sealing member 18 which is not intended to take out light.

"A metal foil" in the present invention indicates a foil or a film made of a metal which is produced by a process such as rolling. This is different from: a metal thin layer formed with a sputtering method or a vapor deposition method; or a conductive layer formed by using a fluid electrode material such as a conductive paste.

As a metal foil, the kind of metal is not specifically limited. Examples thereof are: copper (Cu) foil, aluminum (Al) foil, gold (Au) foil, brass foil, nickel (Ni) foil, titanium (Ti) foil, copper alloy foil, stainless steel foil, tin (Sn) foil, and high nickel alloy foil. Among these foils, specifically preferred metal foil is an aluminum (Al) foil.

A thickness of metal foil is preferably in the range of 6 to 50 μm. When it is in the range of 6 to 50 μm, it can prevent generation of pinholes which may be produced depending on the used material for metal foil, and required gas barrier properties (vapor permeability and oxygen permeability) will be obtained.

Examples of a resin for a resin film are: a polyethylene resin, a polypropylene resin, a polyethylene terephthalate resin, a polyamide resin, an ethylene-vinyl alcohol copolymer resin, an ethylene-vinyl acetate copolymer resin, an acrylonitrile-butadiene copolymer resin, a cellophane resin, a vinylon resin, and a vinylidene chloride resin.

A polypropylene resin and a Nylon resin may be stretched, and further, they may be coated with a vinylidene chloride resin. Any one of high density or low density polyethylene resin may be used.

The sealing member 18 is preferably provided with the following properties: an oxygen permeability of $1\times10^{-3}$ ml/(m2·24 h·atm) or less, determined based on JIS K 7126-1987; and a water vapor permeability of $1\times10^{-3}$ g/(m2·24 h) or less (25±0.5° C., and relative humidity (90±2) % RH) determined based on JIS K 7129-1992.

The aforesaid substrate materials may be processed to form a concave form to become a sealing member 18. In this case, a concave form is formed by carrying out a process such as a sand blast process or a chemical etching process to the aforesaid substrate materials.

A metal material may be used other than these materials. Examples of a metal material are: those composed of at least one metal selected from the group consisting of stainless steel, iron, copper, aluminum, magnesium, nickel, zinc, chromium, titanium, molybdenum, silicon, germanium, and tantalum, or alloys thereof. These metal materials are made into a thin film, and they are used as a sealing member 18. Thus, an entire light emitting panel provided with an organic EL element 10 will be made thinner.

[Inorganic Sealing Layer]

An inorganic sealing layer is formed so as to cover the portion of a flexible substrate 11 having a first gas barrier layer 121 except the portion which is placed with a first electrode 13, an organic functional layer 14, and a second electrode 15.

An inorganic sealing layer is a member to seal a first electrode 13, an organic functional layer 14, and a second electrode 15 together with a resin sealing layer. Therefore, with respect to the inorganic sealing layer, it is preferable to employ a material having a function of preventing penetration of water or oxygen which will deteriorate the first electrode 13, the organic functional layer 14, and the second electrode 15.

Further, the inorganic sealing layer is a constitution component which directly comes in contact with the insulating layer 19, the first electrode 13, the organic functional layer 14, and the second electrode 15. Therefore, it is preferable to use a material excellent in joining ability with the insulating layer 19, the first electrode 13, the organic functional layer 14, and the second electrode 15.

An inorganic sealing layer is preferably formed with a compound such as inorganic oxide, inorganic nitride, and inorganic carbide having a high sealing property. Specifically, it may be formed with: $SiO_x$, $Al_2O_3$, $In_2O_3$, $TiO_x$, ITO (indium tin oxide), AlN, $Si_3N_4$, $SiO_xN$, $TiO_xN$, and SiC.

The inorganic sealing layer may be formed with a known method such as a sol-gel method, a vapor deposition method, CVD, ALD (Atomic Layer Deposition), PVD and a sputtering method.

The inorganic sealing layer may be formed with an atmospheric pressure plasma method by selecting conditions of: an organic metal compound as a raw ingredient (it is called as a raw material), a decomposition gas, a decomposition temperature, an input electric power. By a suitable selection, it is possible to selectively make a composition of: silicon oxide, inorganic oxide mainly composed of silicon oxide, inorganic oxynitride, inorganic oxyhalide, inorganic carbide, inorganic nitride, inorganic sulfide, and mixture of inorganic halides.

For example, if a silicon compound is used as a raw material compound and oxygen is used for a decomposition gas, a silicon oxide will be generated. Moreover, if silazane is used as a raw material compound, silicon oxynitride will be generated. The reason of this is as follows. In a plasma space, there exist very active charged particles and active radicals in a high density, as a result, a chemical reaction of multi-steps will be extremely accelerated in a plasma space to result in converting into a thermodynamically stable compound in an extremely short time.

As a raw material for forming the above-described inorganic sealing layer, it may be used any silicon compounds of gas, liquid and solid sates at ambient temperature and pressure. When it is a gas, it may be introduced as it is in the plasma space, however, when it is a liquid or a solid, it is used after evaporating with a means such as heating, bubbling, reduced pressure or ultrasonic irradiation. Moreover, it may be used by diluting with a solvent, and organic solvents such as methanol, ethanol, and n-hexane, and a mixed solvent thereof may be used as a solvent. In addition, since these diluting solvents are decomposed into a state of a molecule or an atom during a plasma electric discharge process, their influences will be almost disregarded.

Examples of such a silicon compound are cited as: silane, tetramethoxysilane, tetraethoxysilane, tetra-n-propoxysilane, tetraisopropoxysilane, tetra-n-butoxysilane, tetra-t-butoxysilane, dimethyldimethoxysilane, dimethyldiethoxysilane, diethyldimethoxysilane, diphenyl dimethoxysilane, methyl triethoxysilane, ethyl trimethoxysilane, phenyltriethoxysilane, (3,3,3-trifluoropropyl)trimethoxysilane, hexamethyldisiloxane, bis(dimethylamino)dimethylsilane, bis(dimethylamino)methylvinylsilane, bis(ethylamino) dimethylsilane, N,O-bis(trimethylsilyl)acetamide, bis(trimethylsilyl)carbodiimide, diethylaminotrimethylsilane, dimethylaminodimethylsilane, hexamethyldisilazane, hexamethylcyclotrisilazane, heptahexamethyldisilazane, nona methyltrisilazane, octamethylcyclotetrasilazane, tetrakisdimethylaminosilane, tetraisocyanatesilane, tetramethyldisilazane, tris(dimethylamino)silane, triethoxyfluorosilane, allyldimethylsilane, allyltrimethylsilane, benzyltrimethylsilane, bis(trimethylsilyl)acetylene, 1,4-bistrimethylsilyl-1,3-butadiyne, di-t-butylsilane, 1,3-disilabutane, bis(trimethyl-silyl)methane, cyclopentadienyltrimethylsilane, phenyldimethylsilane, phenyltrimethylsilane, propargyltrimethylsilane, tetramethylsilane, trimethylsilylacetylene, 1-(trimethylsilyl)-1-propyne, tris(trimethylsilyl) methane, tris(trimethylsilyl)silane, vinyltrimethylsilane, hexamethyldisilane, octamethylcyclotetrasiloxane, tetramethylcyclotetrasiloxane, hexamethyl cyclotetrasiloxane, and M silicate 51.

Examples of a decomposition gas which decomposes these raw material gasses containing silicon and produces an inorganic sealing material are: hydrogen gas, methane gas, acetylene gas, carbon monoxide gas, carbon dioxide gas, nitrogen gas, ammonia gas, nitrous oxide gas, nitrogen oxide gas, nitrogen dioxide gas, oxygen gas, water vapor, fluorine gas, hydrogen fluoride, trifluoroacetic alcohol, trifluorotoluene, hydrogen sulfide, sulfur dioxide, carbon disulfide, and chlorine gas.

By suitably selecting a raw material gas containing silicon and a decomposition gas, it can obtain an inorganic sealing layer containing silicon oxide, nitride or carbide. It is used a nitrogen gas or elements of group 18 in the periodic table as a discharge gas. Specifically, it is used: helium, neon, argon, krypton, xenon or radon. Of these, nitrogen, helium and argon are preferably used.

The above-described discharge gas and a reactive gas are mixed, and this is supplied as a thin layer forming (mixture) gas in an atmospheric pressure plasma generating apparatus (plasma generating apparatus) to result in formation of a layer. Although a ratio of a discharge gas to a reactive gas will be different depending on the layer property to be obtained, a reactive gas is supplied so that a ratio of a discharge gas is made to be 50% or more based on the total mixture gas. In particular, a polymer substrate produced in a thin film is preferably used for a sealing member 18 from the viewpoint of achieving a thin element.

A thin film shaped polymer substrate is preferably provided with the following properties: an oxygen permeability of $1 \times 10-3$ ml/(m2·24 h·atm) or less, determined based on JIS K 7126-1987; and a water vapor permeability of $1 \times 10-3$ g/(m2·24 h) or less (25±0.5° C., and relative humidity (90±2) % RH), determined based on JIS K 7129-1992.

The aforesaid substrate materials may be processed to form a concave form to become a sealing member 18. In this case, a concave form is formed by carrying out a process such as a sand blast process or a chemical etching process to the aforesaid substrate materials.

A metal material may be used other than these materials. Examples of a metal material are: those composed of at least one metal selected from the group consisting of stainless steel, iron, copper, aluminum, magnesium, nickel, zinc, chromium, titanium, molybdenum, silicon, germanium, and tantalum, or alloys thereof. These metal materials are made into a thin film, and they are used as a sealing member 18. Thus, an entire light emitting panel provided with an organic electroluminescent element will be made thinner.

[Applications]

An organic EL element 10 may be applied to: a display device, a display, and an electronic device such as various light emission sources.

Examples of a light emission source includes: a home use illumination, a car room illumination, a backlight of a watch or a liquid crystal, a panel advertisement, a signal, a light source for an optical memory medium, a light source for an electrophotographic copier, a light source for an optical telecommunication processor, and a light source for a photosensor. However, the present invention is not limited thereto. In particular, it may be effectively used for a backlight for a liquid crystal and an illumination source.

If needed, the organic EL element 10 may be subjected to patterning via a metal mask or an inkjet printing method during film formation. When the patterning is carried out, only an electrode may undergo patterning, an electrode and a light emitting layer may undergo patterning, or all element layers may undergo patterning. During preparation of the element, it is possible to employ conventional methods.

2. Organic Electroluminescent Element (Second Embodiment)

[Constitution of Organic EL Element]

Next, a second embodiment will be described. A schematic composition of an organic electroluminescent element is illustrated in FIG. 2.

Figure 2:
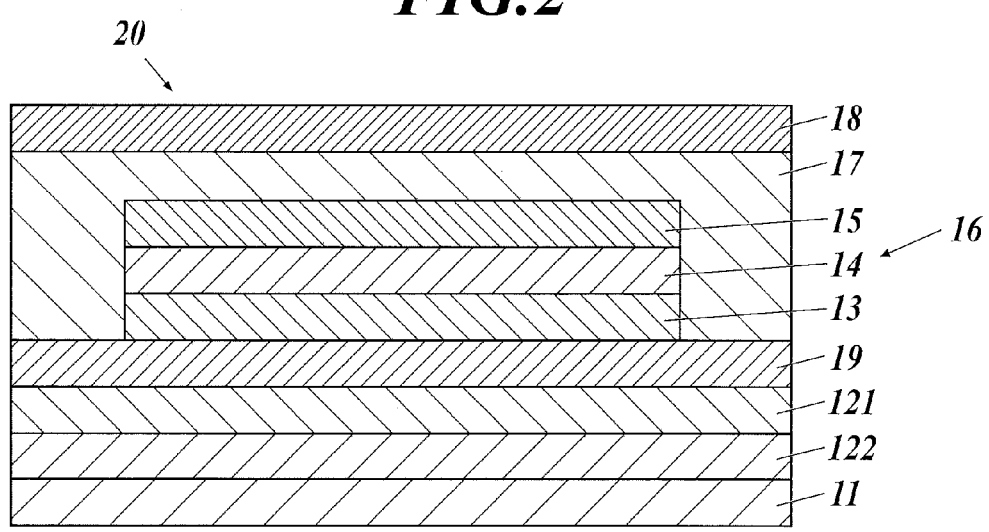
FIG. 2 is a drawing showing a schematic composition of an organic electroluminescent element of a second embodiment.

As illustrated in FIG. 2, an organic EL element 20 comprises a flexible substrate 11, a second gas barrier layer 122, a first gas barrier layer 121, an insulating layer 19, a first electrode 13, a light emitting unit 16 containing an organic functional layer 14, a second electrode 15, a sealing layer 17, and a sealing member 18.

This organic EL element 20 has the same constitution as the above-described First embodiment, except that the second gas barrier layer 122 is placed between the flexible substrate 11 and the first gas barrier layer 121. Therefore, in the following description, an overlapping explanation described in an organic EL element of a first embodiment is omitted. An organic EL element of a second embodiment will be described in the following.

[Second Gas Barrier Layer]

The second gas barrier layer 122 provided on the flexible substrate 11 is composed of a silicon compound which further contains at least one element selected from the group consisting of carbon (C), nitrogen (N) and oxygen (O). The silicon compound which composes the second gas barrier layer 122 has a continuous composition change from a surface to a thickness direction by changing an element ratio, the element being at least one selected from the group consisting of C, N and O.

In addition, the silicon compound which composes the second gas barrier layer 122 has at least one extreme value (extremum) in this continuous composition change in the thickness direction. Namely, the second gas barrier layer 122 is composed of materials containing silicon, oxygen and carbon, and it has a laminated structure made of a plurality of layers each has a different content of silicon, oxygen and carbon.

These coated layer and a second gas barrier have the following properties: a water vapor permeability of $1\times10^{-3}$ g/(m2·24 h) or less (25±0.5° C., and relative humidity (90±2) % RH) determined based on JIS K 7129-1992; and an oxygen permeability of $1\times10^{-3}$ ml/(m2·24 h·atm) or less, determined based on JIS K 7126-1987. In addition, a water vapor permeability is preferably $1\times10^{-5}$ g/(m2·24 h) or less.

A method for forming a gas barrier film is not particularly limited. Employable methods include: a vacuum vapor deposition method, a sputtering method, a reactive sputtering method, a molecular beam epitaxy method, a cluster ion beam method, an ion plating method, a plasma polymerization method, an atmospheric pressure plasma polymerization method, a plasma CVD method, a laser CVD method, a thermal CVD method, and a coating method. Of these, specifically preferred is a method employing an atmospheric pressure plasma polymerization method described in JP-A 2004-68143.

(Second Gas Barrier Layer: Constitution)

The second gas barrier layer 122 containing the aforesaid silicon compound is characterized in having a specific distribution curve of each element, which shows a relationship between the distance in the thickness direction from the surface of the second gas barrier layer 122 and a ratio of atomic amount (an atomic percentage) of the aforesaid each element (silicon, oxygen and carbon).

An atomic percentage of silicon, oxygen or carbon is each represented by a ratio of silicon, oxygen or carbon to a total amount of silicon, oxygen and carbon element: [(Si, O, C)/(Si+O+C)].

A silicon, oxygen or carbon distribution curve represents an atomic percentage of silicon, oxygen or carbon at a distance in the thickness direction from the surface of the second gas barrier layer 122. A distribution curve showing a relationship between a ratio of atomic amount (an atomic percentage) of the sum of oxygen and carbon to a distance in the thickness direction from the surface of the second gas barrier layer 122 (an interface of a first electrode 13 side) is called as an oxygen-carbon distribution curve.

The second gas barrier layer 122 may further contain nitrogen in addition to silicon, oxygen and carbon. By containing nitrogen, a refractive index of the second gas bather layer 122 will be controlled.

For example, while a refractive index of SiO2 is 1.5, a refractive index of SiN is about 1.8 to 2.0. Therefore, a required refractive index value of 1.6 to 1.8 will be achieved by adding nitrogen to the second gas barrier layer 122 and to form SiON inside of the second gas bather layer 122. Thus, a refractive index of the second gas barrier layer 122 will be controlled.

When the second gas barrier layer 122 contains nitrogen, a distribution curve of each element (silicon, oxygen, carbon and nitrogen) which composes the second gas barrier layer 122 will be as follows.

When nitrogen is contained, in addition to silicon, oxygen, and carbon, atomic percentages of silicon, oxygen, carbon and nitrogen are represented by a ratio of silicon, oxygen, carbon and nitrogen to a total amount of silicon, oxygen, carbon and nitrogen element: [(Si, O, C, N)/(Si+O+C+N)].

(Relationship Between a Distribution Curve of Element and a Refractive Index Distribution)

A refractive index distribution of the second gas barrier layer 122 may be controlled by an amount of carbon and an amount of oxygen in the thickness direction of the second gas barrier layer 122.

Figure 3:
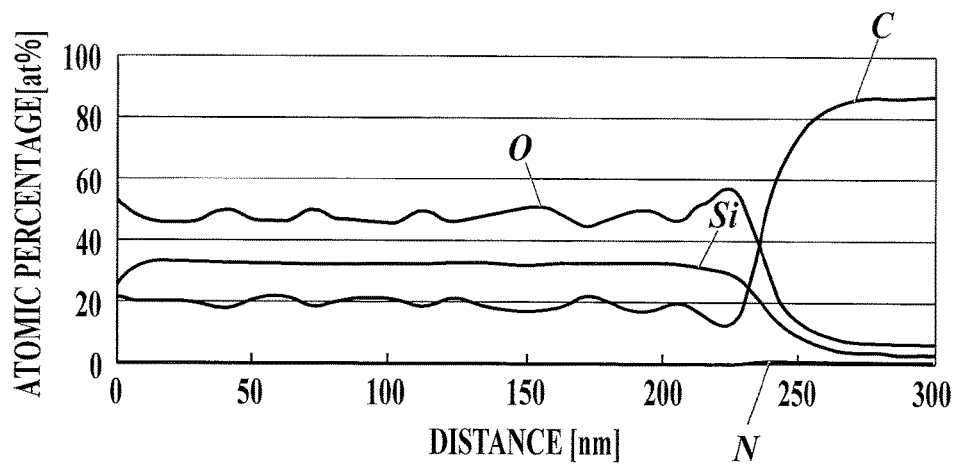
FIG. 3 is a drawing showing a silicon distribution curve, an oxygen distribution curve, a carbon distribution curve and a nitrogen distribution curve.

FIG. 3 illustrates an example of: silicon, oxygen, carbon and nitrogen distribution curves of the second gas barrier layer 122. FIG. 4 illustrates an expansion of a carbon distribution described in FIG. 3 which shows silicon, oxygen, carbon and nitrogen distribution curve.

In FIG. 3 and FIG. 4, a horizontal axis indicates a distance (nm) in the thickness direction from the surface of the second gas barrier layer 122. A vertical axis indicates an atomic percentage (at %) of silicon, oxygen, carbon and nitrogen each to the total amount of silicon, oxygen, carbon and nitrogen. In addition, it will be described later a detail of a measuring method of silicon, oxygen, carbon and nitrogen distribution curves.

As illustrated in FIG. 3, an atomic percentage of silicon, oxygen, carbon and nitrogen changes depending on the distance from the surface of the second gas barrier layer 122. In particular, with respect to oxygen and carbon, an amount of change in an atomic percentage depending on the distance from the surface of the second gas barrier layer 122 is large, and each distribution curve has plural extremum points. An oxygen distribution curve and a carbon distribution curve are mutually correlated. At a distance where an atomic percentage of carbon is large, an atomic percentage of oxygen becomes small, and at a distance where an atomic percentage of carbon is small, an atomic percentage of oxygen becomes large.

Figure 5:
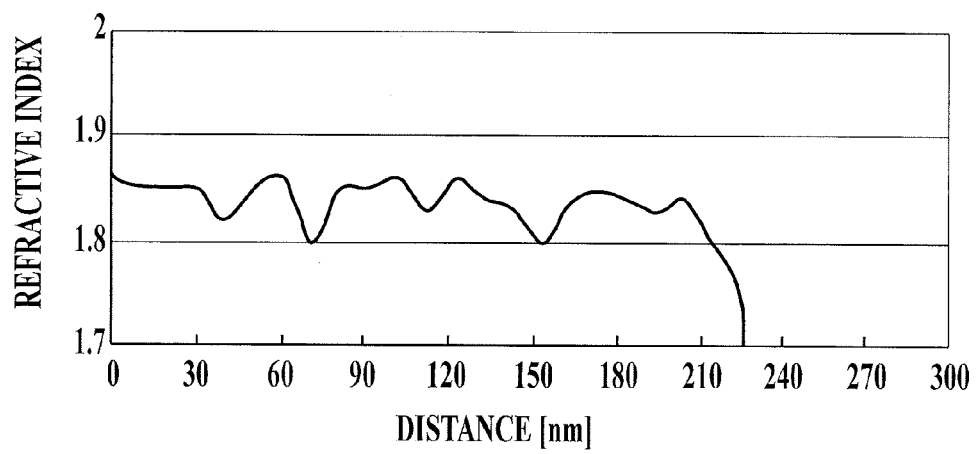
FIG. 5 is a drawing showing a refractive index distribution of a second gas barrier layer.

FIG. 5 illustrates a refractive index distribution of the second gas barrier layer 122. In FIG. 5, a horizontal axis indicates a distance (nm) in the thickness direction from the surface of the second gas barrier layer 122. A vertical axis indicates a refractive index of the second gas barrier layer 122.

The refractive index of the second gas barrier layer 122 shown in FIG. 5 is a measured value of the second gas barrier layer 122 with a visible light at a distance in the thickness direction from the surface of the second gas barrier layer 122. The measurement of a refractive index of the second gas barrier layer 122 may be done using a known method. For example, Spectro-ellipsometer (ELC-300 made by JASCO Co.) may be used.

As illustrated in FIG. 4 and FIG. 5, there is a mutual relationship between an atomic percentage of carbon and a refractive index of the second gas barrier layer 122.

More specifically, a refractive index of the second gas barrier layer 122 is increased at a point where an atomic percentage of carbon in the second gas barrier layer 122 is incresed. Thus, the refractive index of the second gas barrier layer 122 varies in relation to the atomic percentage of carbon in the second gas barrier layer 122.

This means that the refractive index distribution curve of the second gas barrier layer 122 may be controlled by adjusting the atomic percentage of carbon in the thickness direction.

Further, as described above, since an atomic percentage of oxygen and an atomic percentage of carbon are mutually related, the refractive index distribution curve of the second gas barrier layer 122 may be controlled by adjusting the atomic percentage and the distribution curve of oxygen.

Reflection and interference at an interface of the flexible substrate 11 may be controlled by providing with the second gas barrier layer 122 having extremum points in the refractive index curve. As a result, the transmitting light through the organic EL element 10 will be emitted without being affected by total reflection or interference due to the effect of the second gas barrier layer 122. Therefore, an amount of light will not be decreased, and a taking out efficiency of light from the organic EL element 10 will be improved.

When a metal transparent conductive layer containing silver is used as a first electrode 13, the transmitting light through the organic EL element 10 is likely to be affected by reflection and interference at an interface of the flexible substrate 11 to result in generating a problem of viewing angel dependency. This is considered to be produced by the following. A component of light having a specific wavelength range is reflected at an aggregated metal in the metal transparent conductive layer, at the metal transparent conductive layer or at the interface thereof. This reflected light will interfere with a light emission spectrum to result in changing the light emission spectrum to give viewing angel dependency.

Therefore, the viewing angel dependency may be controlled by adjusting the refractive index distribution curve of the second gas barrier layer 122 in such a manner of not interfering with a light having a specific wavelength. The refractive index distribution curve of the second gas barrier layer 122 may be managed by an atomic percentage of carbon. Consequently, it will give a required optical property to the second gas barrier layer 122 by controlling a carbon distribution curve.

In the present embodiment, it can adjust a light spectrum by the presence of one or a plurality of extremum points in the refractive index distribution curve of the second gas barrier layer 122. Consequently, interference conditions of the organic EL element 10 will be dispersed to lead to a constitution in which there occurs no interference at a specific wavelength. Therefore, the distribution of the transmitted light through the organic EL element 10 may be controlled by the second gas barrier layer 122. By solving the problem of the viewing angel dependency of the light spectrum, it can achieve a uniform light distribution of the organic EL element 10.

(Conditions of Distribution Curve of Each Element)

It is preferable that atomic percentages of silicon, oxygen and carbon, and distribution curves of each element in the second gas barrier layer 122 will satisfy the following conditions (i) to (iii).

(i) The atomic percentages of silicon, oxygen, and carbon satisfy the relationship (1) indicated below in an area covering 90% or more of the distance from the surface across the thickness of the second gas barrier layer 122:

(Atomic percentage of oxygen)>(atomic percentage of silicon)>(atomic percentage of carbon) (1)

Otherwise, the atomic percentages of silicon, oxygen, and carbon satisfy the relationship (2) indicated below in an area covering 90% or more of the distance from the surface across the thickness of the second gas barrier layer 122:

Atomic percentage of carbon)>(atomic percentage of silicon)>(atomic percentage of oxygen) (2)

(ii) The carbon distribution curve has at least two local extremum points (a local maximum and a local minimum).

(iii) The absolute value of the difference between the maximum value and the minimum value of the atomic percentage of carbon in the carbon distribution curve is 5 at % or more.

It is preferable that the organic EL element 10 is provided with a second gas barrier layer 122 satisfying at least one of the above-described conditions (i) to (iii).

In particular, it is preferable that the organic EL element 10 is provided with a second gas barrier layer 122 satisfying all of the above-described conditions (i) to (iii).

In addition, the organic EL element 10 may be provided with two or more second gas barrier layers 122 satisfying all of the above-described conditions (i) to (iii). When the organic EL element 10 is provided with two or more second gas barrier layers 122, the material of the thin layer in the plural second gas barrier layers 122 may be the same or different.

When the organic EL element 10 is provided with two or more second gas barrier layers 122, the second gas barrier layers 122 may be formed on one surface of the flexible substrate 11, or they may be formed on both surfaces of the flexible substrate 11.

The refractive index of the second gas barrier layer 122 may be regulated by an atomic percentage of carbon or oxygen as shown by the mutual relation as illustrated in FIG. 4 and FIG. 5. Consequently, the refractive index of the second gas barrier layer 122 may be adjusted in the required range by the above-described conditions (i) to (iii).

(Carbon Distribution Curve)

The second gas barrier layer 122 is required to have a carbon distribution curve containing at least one extremum point. More preferably, the second gas barrier layer 122 has a carbon distribution curve containing at least two extremum points. In particular, still more preferably, a carbon distribution curve contains at least three extremum points. Further, it is preferable that the carbon distribution curve contains at least one local maximum point and one local minimum point.

When the carbon distribution curve contains no extremum point, the light distribution of the obtained second gas barrier layer 122 may be insufficient. As a result, it may be difficult to solve the problem of the viewing angle dependency of the emitted light from the organic EL element 10 obtained through the first electrode 13.

When the second gas barrier layer 122 contains three or more extremum points, it is preferable that the distance between one extremum point and an adjacent extremum point in the carbon distribution curve is 200 nm or less in the thickness direction from the surface of the second gas barrier layer 122. More preferably, it is 100 nm or less.

(Extremum)

Extremum points in the atomic distribution curve of the second gas barrier layer 122 refer to measured values of local maximum points or local minimum points of the atomic percentage of each element at a certain distance from the surface of the second gas barrier layer 122 in the thickness direction of the second gas barrier layer 122. Or, they are the measured values of a refractive index distribution curve corresponding to these values.

The local maximum point in the distribution curve of each element of the second gas barrier layer 122 represents a point at which the atomic percentage of the element changes from an increase to a decrease when the distance from the surface of the second gas barrier layer 122 varies, and from which point the atomic percentage of the element decreases by 3 at % or more when the distance from the surface of the second gas barrier layer 122 in the thickness direction varies by 20 nm.

The local minimum point in the distribution curve of each element of the second gas barrier layer 122 represents a point at which the atomic percentage changes from a decrease to an increase when the distance from the surface of the second gas barrier layer 122 varies, and from which point the atomic percentage of the element increases by 3 at % or more when the distance from the surface of the second gas barrier layer 122 in the thickness direction varies by 20 nm.

In a carbon distribution curve of the second gas barrier layer 122, it is preferable that an absolute value of the difference between the maximum value and the minimum value of the atomic percentage of carbon is 5 at % or more. In the second gas barrier layer 122, it is more preferable that an absolute value of the difference between the maximum value and the minimum value of the atomic percentage of carbon is 6 at % or more. And still more preferably, it is 7 at % or more. When the difference between the maximum value and the minimum value of the atomic percentage of carbon is in the above-described range, the difference of refractive index in a refractive index distribution curve of the obtained second gas barrier layer 122 becomes large, and light distribution becomes sufficient.

There is correlation between a carbon distribution amount and a refractive index. When the absolute value of the difference between the maximum value and the minimum value of carbon is 7 at % or more, the obtained absolute value of the difference between the maximum value and the minimum value of refractive index becomes 0.2 or more.

(Oxygen Distribution Curve)

The second gas barrier layer 122 is required to have an oxygen distribution curve containing at least one extremum point. More preferably, the second gas barrier layer 122 has an oxygen distribution curve containing at least two extremum points. In particular, still more preferably, an oxygen distribution curve contains at least three extremum points. Further, it is preferable that the oxygen distribution curve contains at least one local maximum point and one local minimum point.

When the oxygen distribution curve contains no extremum point, the light distribution of the obtained second gas barrier layer 122 may be insufficient. As a result, it may be difficult to solve the problem of the viewing angle dependency of the emitted light from the organic EL element 10 obtained through the first electrode 13.

When the oxygen distribution curve contains three or more extremum points, it is preferable that the distance between one extremum point and an adjacent extremum point in the carbon distribution curve is 200 nm or less in the thickness direction from the surface of the second gas barrier layer 122. More preferably, it is 100 nm or less.

In an oxygen distribution curve of the second gas barrier layer 122, it is preferable that an absolute value of the difference between the maximum value and the minimum value of the atomic percentage of oxygen is 5 at % or more. In the second gas barrier layer 122, it is more preferable that an absolute value of the difference between the maximum value and the minimum value of the atomic percentage of oxygen is 6 at % or more. And still more preferably, it is 7 at % or more. When the difference between the maximum value and the minimum value of the atomic percentage of oxygen is in the above-described range, the light distribution becomes sufficient based on the refractive index distribution curve of the obtained second gas barrier layer 122.

(Silicon Distribution Curve)

In a silicon distribution curve of the second gas barrier layer 122, it is preferable that an absolute value of the difference between the maximum value and the minimum value of the atomic percentage of silicon is less than 5 at %. More preferably, an absolute value of the difference between the maximum value and the minimum value of the atomic percentage of silicon in the second gas barrier layer 122 is less than 4 at %. Still more preferably, it is less than 3 at %. When the difference between the maximum value and the minimum value of the atomic percentage of silicon is in the above-described ranges, the light distribution becomes sufficient based on the refractive index distribution curve of the obtained second gas barrier layer 122.

(Sum of Oxygen and Carbon: Oxygen-Carbon Distribution Curve)

In the second gas bather layer 122, a percentage of a sum of oxygen and carbon with respect to a sum of silicon, oxygen and carbon is called as "an oxygen-carbon distribution curve".

In an oxygen-carbon distribution curve of the second gas barrier layer 122, it is preferable that an absolute value of the difference between the maximum value and the minimum value of the atomic percentage of the sum of oxygen and carbon is less than 5 at %. More preferably, it is less than 4 at %. Still more preferably, it is less than 3 at %. When the difference between the maximum value and the minimum value of the atomic percentage of the sum of oxygen and carbon is in the above-described ranges, the light distribution becomes sufficient based on the refractive index distribution curve of the obtained second gas bather layer 122.

(XPS Depth Profiling)

The above-described silicon, oxygen, carbon, oxygen-carbon, and nitrogen distribution curves will be prepared through XPS depth profiling in which the interior of the specimen is exposed in sequence for analysis of the surface composition through a combination of X-ray photoelectron spectroscopy (XPS) and ion-beam sputtering using a rare gas, such as argon.

Each distribution curve acquired through such XPS depth profiling has, for example, a vertical axis representing the atomic percentage (unit: at %) of the element and a horizontal axis representing the etching time (sputtering time).

In a distribution curve of an element having an etching time as a horizontal axis, the etching time correlates approximately with the distance from the surface of the second gas barrier layer 122 in the thickness direction of the gas barrier layer. Thus, a distance from the surface of the second gas barrier layer 122 calculated on the basis of the relationship between the etching rate and etching time used in the XPS depth profiling may be adopted "as a distance from the surface of the second gas barrier layer 122 in the thickness direction".

For the XPS depth profiling, it is preferable to select an ion-beam sputtering of a rare gas using argon (Ar+) as an ionic species and an etching rate of 0.05 nm/sec (equivalent to a value for a thermally-oxidized SiO2 film).

From the viewpoint of forming a gas barrier layer having a uniform layer and superior light distribution property, it is preferable that the second gas barrier layer 122 is substantially uniform in the direction of the film surface (the direction parallel to the surface of the second gas barrier layer 122).

In this specification, a second gas barrier layer 122 being substantially uniform in the direction of the film surface means the following. At any two points of the second gas barrier layer 122, the element distribution curves for the two points contain the same number of extremum points, and the absolute values of the differences between the maximum value and the minimum value of the atomic percentage of carbon in the carbon distribution curves are identical or have a difference of 5 at % or less.

(Substantial Continuity)

In the second gas barrier layer 122, the carbon distribution curve preferably has substantial continuity.

In this specification, the carbon distribution curve having substantial continuity means that the variation in the atomic percentage of carbon in the carbon distribution curve does not include any discontinuity. Specifically, it means that the condition represented by the following mathematical expression (F1) is satisfied, F1 being the relationship between the distance x (in nm) from the surface of the second gas barrier layer 122 in the thickness direction, which is derived from the etching rate and the etching time, and the atomic percentage of carbon (C in at %):

$$(dC/dx) \leq 0.5 \tag{F1}$$

(Atomic Percentage of Silicon Atom, Oxygen Atom and Carbon Atom)

In the silicon, oxygen, and carbon distribution curves, it is preferable that atomic percentages of silicon, oxygen, and carbon will satisfy the condition represented by the relationship (1) in an area corresponding to 90% or more of the thickness of the second gas barrier layer 122.

$$\text{(Atomic percentage of oxygen)} > \text{(atomic percentage of silicon)} > \text{(atomic percentage of carbon)} \tag{Relationship (1)}$$

In this case, the atomic percentage of silicon atom to the total amount of silicon atom, oxygen atom and carbon atom in the second gas barrier layer 122 is preferably in the range of 25 to 45 at %, more preferably in the range of 30 to 40 at %.

The atomic percentage of oxygen atom to the total amount of silicon atom, oxygen atom and carbon atom in the second gas barrier layer 122 is preferably in the range of 33 to 67 at %, more preferably in the range of 45 to 67 at %.

The atomic percentage of carbon atom to the total amount of silicon atom, oxygen atom and carbon atom in the second gas barrier layer 122 is preferably in the range of 3 to 33 at %, more preferably in the range of 3 to 25 at %.

(Thickness of Thin Layer>

A thickness of the second gas barrier layer 122 is preferably in the range of 5 to 3,000 nm, more preferably in the range of 10 to 2,000 nm, and still more preferably in the range of 100 to 1,000 nm. When the second gas barrier layer 122 has a thickness within these ranges, the second gas barrier layer 122 will produce sufficient light distribution.

When the second gas barrier layer 122 includes a plurality of gas barrier layers, the total thickness of the second gas barrier layer 122 is normally in the range of 10 to 10,000 nm, preferably in the range of 10 to 5,000 nm, more preferably in the range of 100 to 3,000 nm. Further, the range of 200 to 2,000 nm is particularly preferable.

(Primer Layer)

The second gas barrier layer 122 may be provided with a primer coat layer, a heat seal resin layer and an adhesive layer between the flexible layer 11 and the second gas barrier layer 122.

The primer coat layer may be formed by using a known primer coating agent which will improve adhesiveness between the flexible layer 11 and the second gas barrier layer 122.

The heat seal resin layer may be suitably formed by using a known heat seal resin.

Further, the adhesive layer may be suitably formed by using a known adhesive. A plurality of second gas barrier layers 122 may be adhered using such adhesive.

(Method for Forming Second Gas Barrier Layer)

A second gas barrier layer 122 of an organic EL element 10 is preferably formed through a plasma enhanced chemical vapor deposition method. More specifically, the second gas barrier layer 122 is preferably formed through a plasma enhanced chemical vapor deposition method (plasma CVD) in which a flexible substrate 11 is conveyed in contact with a pair of deposition rollers, and plasma is discharged between the deposition rollers. The plasma enhanced chemical vapor deposition method may be a Penning discharge plasma method.

During discharge between the pair of deposition rollers, it is preferable that the polarities of the deposition rollers are alternately inverted.

During generation of plasma in the plasma enhanced chemical vapor deposition method, it is preferable to generate plasm in a space between a plurality of deposition rollers. In particular, a more preferable method contains the following: to use a pair of deposition rollers; to arrange a flexible substrate 11 to each deposition roller; and to discharge between the pair of deposition rollers to generate plasma.

Thus, by arranging a flexible substrate 11 to the pair of deposition rollers, and by discharging between the pair of deposition rollers, it can perform deposition on the flexible substrate 11 which exists on one of the deposition rollers. And at the same time, it is possible to perform deposition on the flexible substrate 11 which exists on other deposition roller. As a result, the deposition rate will be increased to double, and a thin film may be efficiently produced. In addition, it may form a layer having the same composition on each of the pair of deposition rollers.

The deposition gas used in the aforesaid plasma enhanced chemical vapor deposition preferably includes an organosilicon compound and oxygen. The content of the oxygen in the deposition gas to be supplied is preferably equal to or less than a theoretical quantity required for the complete oxidation of the entire quantity of the organosilicon compound in the deposition gas. The second gas bather layer 122 is preferably formed through a continuous deposition process.

(Production Apparatus of Second Gas Barrier Layer)

A second gas barrier layer 122 is preferably produced on a surface of a flexible substrate 11 through a roll-to-roll processing in view of productivity.

Although any apparatus may be used for the production of the second gas barrier film through plasma enhanced chemical vapor deposition, the apparatus preferably includes at least a pair of deposition rollers and a plasma power source and is capable of discharging in the space between the deposition rollers.

Figure 6:
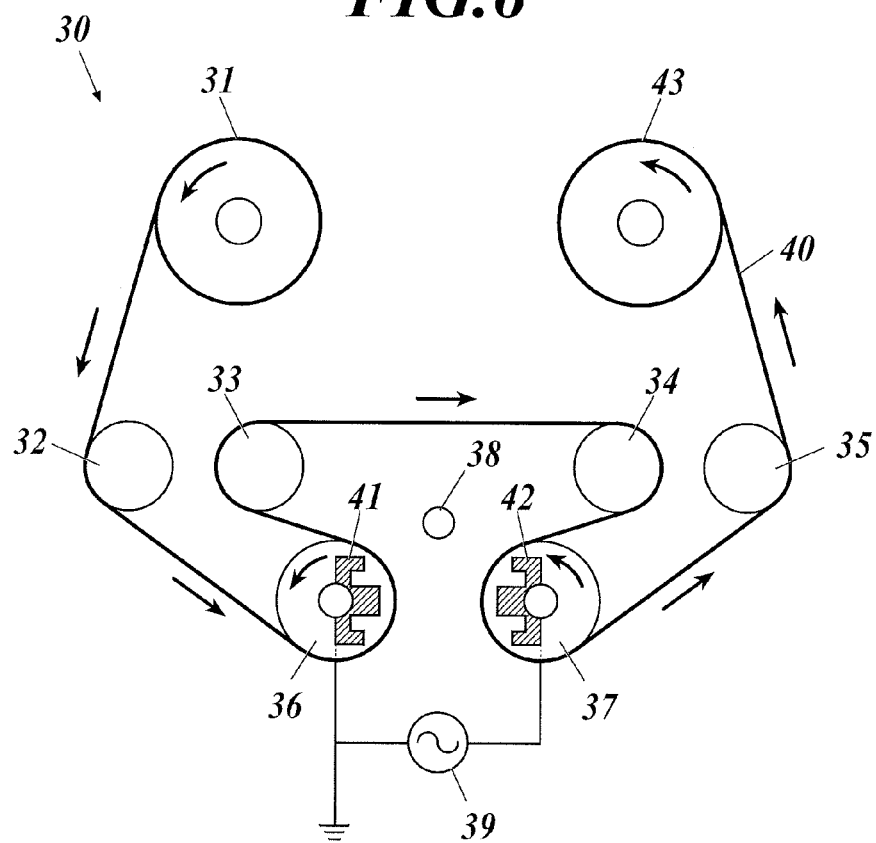
FIG. 6 is a drawing showing a composition of a manufacturing apparatus of a second gas barrier layer.

For example, the manufacturing apparatus 30 illustrated in FIG. 6 can manufacture gas barrier films through plasma enhanced chemical vapor deposition in a roll-to-roll process.

With reference to FIG. 6, a method for manufacturing a second gas barrier film 122 will now be described in detail. FIG. 6 is a schematic view illustrating an example of a preferable apparatus for manufacturing a gas barrier film 122.

The manufacturing apparatus 30 illustrated in FIG. 6 includes a delivery roller 31, conveyer rollers 32, 33 and 34, deposition rollers 36 and 37, a gas inlet 38, a power source 39 for plasma generation, magnetic-field generators 41 and 42 disposed inside the deposition rollers 36 and 37, and a reeling roller 43. Such a manufacturing apparatus 30 includes a vacuum chamber (not shown) that accommodates at least the deposition rollers 36 and 37, the gas inlet 38, the power source 39 for plasma generation, and the magnetic-field generators 41 and 42. The vacuum chamber of such a manufacturing apparatus 30 is connected to a vacuum pump (not shown). The vacuum pump can appropriately adjust the pressure in the vacuum chamber.

In the manufacturing apparatus 30, the deposition rollers are connected to the power source 39 for plasma generation such that a pair of deposition rollers (deposition rollers 36 and 37) can function as opposing electrodes. Thus, in the manufacturing apparatus 30, electric power will be supplied from the power source 39 for plasma generation and discharge will be done in the space between the deposition rollers 36 and 37. This will generate plasma in the space between the deposition rollers 36 and 37. The deposition rollers 36 and 37 may be used as electrodes by appropriately selecting the material and design for the deposition rollers 36 and 37 suitable as electrodes. The deposition rollers (deposition rollers 36 and 37) in the manufacturing apparatus 30 are preferably disposed such that the central axes of the rollers 36 and 37 are substantially parallel to each other on a single plane. Such arrangement of the deposition rollers (deposition rollers 36 and 37) will make double the deposition rate and it will deposit a film with an identical structure. As a result, the number of local extreme value points in the carbon distribution curve may be increased at least to double. By using the manufacturing apparatus 30, it will produce the second gas barrier layer 122 on a surface of a film 40 with CVD. It will deposit a layer component on the surface of the film 40 placed on the deposition roller 36, and at the same time, it will deposit a layer component on the surface of the film 40 placed on the deposition roller 37. Therefore, the second gas barrier layer 122 will be efficiently formed on the surface of the film 40.

The deposition rollers 36 and 37 respectively accommodate the magnetic-field generators 41 and 42, which are fixed without rotation even when the deposition rollers rotate. The deposition rollers 36 and 37 may be any appropriate known roller.

The deposition rollers 36 and 37 are preferred to have identical diameters in view of the efficient deposition of the films. The diameter of the deposition rollers 36 and 37 is preferably in the range of 5 to 100 cm in view of the discharge conditions and the space in the chamber.

In the manufacturing apparatus 30, the film 40 is arranged on the pair of deposition rollers (deposition rollers 36 and 37) so that the surfaces of the film 40 each are opposed. By this arrangement of the film 40, it is possible to simultaneously deposit the second barrier layer 122 on each surface of the film 40 which exists between the pair of deposition rollers during the time of generating plasma by discharging the portion between the deposition rollers 36 and 37. That is, the manufacturing apparatus 30 enables to deposit a layer component on the surface of the film 40 placed on the deposition rollers 36, and further, to deposit a layer component on the deposition rollers 37. As a result, the second barrier layer 122 will be efficiently formed on the surface of the film 40.

The delivery roller 31 and the conveyer rollers 32, 33, 34 and 35 of the manufacturing apparatus 30 may be any appropriate known roller. The reeling roller 43 may be any appropriate known roller that can reel the film 40 on which is formed the second gas barrier layer 122.

The gas inlet 38 may be any appropriate inlet that can supply or discharge a material gas at a predetermined rate. The power source 39 for plasma generation may be any appropriate power source for a known plasma generator. The power source 39 for plasma generation supplies power to the deposition rollers 36 and 37 connected thereto and can use the deposition rollers 36 and 37 as opposing electrodes for electrical discharge. The power source 39 for plasma generation is preferably an AC source that will alternatively invert the polarities of the deposition rollers so as to efficiently perform plasma enhanced CVD. The power source 39 for plasma generation is preferred to apply power in the range of 100 W to 10 kW and have an AC frequency in the range of 50 Hz to 500 kHz so as to efficiently perform plasma enhanced CVD. The magnetic-field generators 41 and 42 may be any appropriate known magnetic-field generator.

As a film 40, it can use a flexible substrate 11 applicable to the aforesaid organic EL element 10, and further, it can use a flexible substrate 11 which has been provided with a second gas barrier layer 122 beforehand.

Thus, by using a flexible substrate 11 which has been provided with a second gas barrier layer 122 beforehand, it is possible to make larger the thickness of the second gas barrier layer 122.

The manufacturing apparatus 30, such as that illustrated in FIG. 6, can manufacture the second gas barrier film 122 through appropriate adjustment of, for example, the type of material gas, the electric power of the electrode drum in the plasma generator, the pressure in the vacuum chamber, the diameter of the deposition rollers, and the conveying rate of the resin substrate. That is, the manufacturing apparatus 30 illustrated in FIG. 6 supplies a deposition gas (for example, raw material gas) into the vacuum chamber and generates plasma discharge between the deposition rollers (deposition rollers 36 and 37) so as to decompose the deposition gas (for example, raw material gas) by the plasma, and deposit the second gas barrier layer 122 on the surface of the film 40 located on the deposition rollers 36 and 37 through plasma enhanced CVD. Through such deposition process, the film 40 is conveyed by the delivery roller 31 and the deposition roller 36, and the second gas barrier layer 122 is formed on the surface of the film 40 through continuous roll-to-roll deposition.

(Raw Material Gas)

A raw material gas in a layer forming gas used for forming a second gas barrier layer 122 is suitably selected according to the material for forming the second gas barrier layer 122. An organic silicon compound may be used as a raw material gas.

Examples of an organic silicon compound are: hexamethyldisiloxane, 1.1.3.3 tetramethyldisiloxane, vinyl trimethylsilane, trimethylsilane, hexamethyldisilane, methylsilane, dimethylsilane, trimethylsilane, diethylsilane, propylsilane, phenylsilane, vinyl triethoxysilanesilane, vinyltrimethoxysilane, tetramethoxysilane, tetraethoxysilane, phenyltrimethoxysilane, methyltriethoxysilane, and octamethylcyclotetrasiloxane.

Among these organic silicon compounds, hexamethyldisiloxan and 1.1.3.3-tetramethyldisiloxane are preferably used from the viewpoint of handling during layer formation and light distribution property of the obtained second gas barrier layer. Further, these organic silicon compounds may be used singly, or may be used in combination of two or more.

The deposition gas may contain a reactive gas in addition to the raw material gas. Such a reactive gas may be appropriately selected from gases that produce inorganic compounds, such as oxides and nitrides, through reaction with the raw material gas. The reactive gas for the production of oxides includes oxygen and ozone. The reactive gas for the production of nitrides includes nitrogen and ammonia. The reactive gas may be used alone or in combination. For example, for the production of an oxynitride, a reactive gas for the production of oxides may be combined with a reactive gas for the production of nitrides.

The deposition gas may contain a carrier gas, if required, for supplying the raw material gas to the vacuum chamber. The deposition gas may contain a discharge gas, if required, for the generation of plasma discharge. Such carrier gas and discharge gas may be any appropriate known gas, including rare gases, such as helium, argon, neon, and xenon, and hydrogen.

When a deposition gas contains a raw material gas and a reactive gas, it is preferable that the deposition gas contains the reactive gas at a percentage not too higher than the theoretical percentage of the reactive gas required for complete reaction of the raw material gas and the reactive gas. If the percentage of the reactive gas is too high, the obtained gas barrier layer 122 cannot yield a sufficient distribution of light.

When a deposition gas contains an organosilicon compound and oxygen, an amount of oxygen is preferably set to be equal to or less than a theoretical amount of oxygen required for complete oxidation of all amount of the organosilicon compound in the deposition gas.

As a representative example, it will be described a case in which hexamethyldisiloxane (organosilicon compound (HMDSO:$(CH_3)_6Si_2O$)) is a raw material gas and oxygen ($O_2$) is a reactive gas.

By using hexamethyldisiloxane as a raw material gas, and oxygen ($O_2$) as a reactive gas, silicon dioxide is produced through the following reaction:

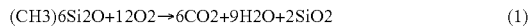

$$(CH_3)_6Si_2O + 12O_2 \rightarrow 6CO_2 + 9H_2O + 2SiO_2 \quad (1)$$

In this reaction, 12 moles of oxygen is required for complete oxidation of 1 mole of hexamethyldisiloxane. Thus, the complete reaction of a deposition gas containing 12 moles or more oxygen for each mole of hexamethyldisiloxane will generate a uniform silicon dioxide layer. Thus, the flow rate of the material gas is adjusted to a rate equal to or less than the theoretical rate for complete reaction so as to maintain an incomplete reaction. That is, less than 12 moles of the oxygen should be provided for each mole of hexamethyldisiloxane, which is lower than the stoichiometric ratio of oxygen.

In an actual plasma enhanced CVD chamber, the hexamethyldisiloxane, which is the raw material gas, and the oxygen, which is the reactive gas, are supplied from the gas inlets to the deposition region. Thus, even if the quantity of the reactive oxygen gas in moles (flow rate) is 12 times of that of hexamethyldisiloxane, which is the raw material gas, the reaction actually cannot be completely accomplished. A complete reaction is presumed to be accomplished only when oxygen is supplied in a quantity that significantly exceeds the stoichiometric ratio (for example, the mole quantity (flow rate) of oxygen may be set to at least approximately 20 times of that of hexamethyldisiloxane so as to produce silicon oxide through a complete oxidation in CVD.

Thus, the mole quantity (flow rate) of oxygen is preferably not more than 12 times, which is the stoichiometric ratio, more preferably not more than 10 times that of the hexamethyldisiloxane, which is the raw material gas. With such contents of hexamethyldisiloxane and oxygen, the carbon atoms and hydrogen atoms in the hexamethyldisiloxane that are not completely oxidized are incorporated in the second gas barrier layer 122, enabling to form a desired second gas barrier layer 122.

When the mole quantity (flow rate) of oxygen is too small relative to the mole quantity (flow rate) of hexamethyldisiloxane in the deposition gas, the non-oxidized carbon and hydrogen atoms are excessively taken in the second gas barrier layer 122. Thus, the second gas barrier layer 122 will have low transparency and it cannot be used as a flexible substrate for a device such as an organic EL element 10, which is required to have transparency. In this view, the lower limit of the mole quantity (flow rate) of oxygen relative to the mole quantity (flow rate) of hexamethyldisiloxane in the deposition gas is preferably 0.1 times or more of the mole quantity (flow rate) of hexamethyldisiloxane, more preferably 0.5 times or more.

(Vacuum Level)

The pressure (vacuum level) in the vacuum chamber may be appropriately adjusted depending on the type of material gas and it is preferably in the range of 0.5 to 100 Pa.

(Deposition Roller)

In the plasma enhanced CVD as described above, the electric power to be applied to electrode drums connected to the power source 39 for plasma generation for electrical discharge between the deposition rollers 36 and 37 may be appropriately adjusted depending on the type of the material gas and the pressure in the vacuum chamber. A preferred electric power is in the range of 0.1 to 10 kW. Electric power applied within such a range does not generate particles, and the heat generated during deposition is not excessive and controllable. Thus, heat damage and wrinkles in the flexible substrate 11 due to the increase in temperature at the surface of the substrate during deposition do not occur. In this example, the electrode drum is placed to the deposition rollers 36 and 37.

The conveying rate (line rate) of the film 40 may be appropriately adjusted depending on the type of material gas and the pressure in the vacuum chamber, and it is preferably in the range of 0.25 to 100 m/min, more preferably in the range of 0.5 to 20 m/min. If the line rate is within these ranges, wrinkles in the film due to heat are not easily formed, and an insufficient thickness of the second gas barrier layer 122 to be deposited may be prevented.

(Underlayer)

An underlayer may be formed between a flexible substrate 11 and a second gas barrier layer 122. An underlayer is prepared in order to carry out leveling of the unevenness of the rough surface of flexible substrate 11 which may have a projection, or to prevent generation of pinholes due to the existence of the projection in the flexible substrate 11.

In addition, when this underlayer is provided, this layer may not be placed in around the center portion in the depth direction of an organic EL element 10. However, by placing in around the center portion, it is efficient to prevent generation of crack of the second barrier layer 122.

Generally, such an underlayer is formed by curing a photopolymer. As a photopolymer used for forming an underlayer, examples are: a resin composition containing an acrylate compound having a radical reactive unsaturated compound; a resin composition containing an acrylate compound and mercapto compound having a thiol group; and a resin composition dissolved a polyfunctional acrylate monomer such as epoxy acrylate, urethane acrylate, polyester acrylate, polyether acrylate, polyethylene glycol acrylate, and glycerol methacrylate.

It is possible to use an arbitral mixture of resin compositions as described above. It is not specifically limited as long as the photopolymer contains a reactive monomer having one or more photopolymerizable unsaturated bond in the molecule.

Examples of a reactive monomer which contains at least one photopolymerizable unsaturated bond in the molecule include: methyl acrylate, ethyl acrylate, n-propyl acrylate, isopropyl acrylate, n-butyl acrylate, isobutyl acrylate, tert-butyl acrylate, n-pentyl acrylate, n-hexyl acrylate, 2-ethylhexyl acrylate, n-octyl acrylate, n-decyl acrylate, hydroxyethyl acrylate, hydroxypropyl acrylate, allyl acrylate, benzyl acrylate, butoxyethyl acrylate, butoxyethylene glycol acrylate, cyclohexyl acrylate, dicyclopentanyl acrylate, 2-ethylhexyl acrylate, glycerol acrylate, glycidyl acrylate, 2-hydroxyethyl acrylate, 2-hydroxypropyl acrylate, isobornyl acrylate, isodexyl acrylate, iso-octyl acrylate, lauryl acrylate, 2-methoxyethyl acrylate, methoxyethylene glycol acrylate, phenoxyethyl acrylate, stearyl acrylate, ethylene glycol diacrylate, diethylene glycol diacrylate, 1,4-butanediol diacrylate, 1,5-pentanediol diacrylate, 1,6-hexadiol diacrylate, 1,3-propanediol acrylate, 1,4-cyclohexanediol diacrylate, 2,2-dimethylolpropane diacrylate, glycerol diacrylate, tripropylene glycol diacrylate, glycerol triacrylate, trimethylolpropane triacrylate, polyoxyethyltrimethylolpropane diacrylate, pentaerythritol triacrylate, pentaerythritol tetraacrylate, ethylene oxide modified pentaerythritol triacrylate, ethylene oxide modified pentaerythritol tetraacrylate, propylene oxide modified pentaerythritol triacrylate, propylene oxide modified pentaerythritol tetraacrylate, triethylene glycol diacrylate, polyoxypropyltrimethylolpropane triacrylate, butylene glycol diacrylate, 1,2,4-butanediol triacrylate, 2,2,4-trimethyl-1,3-pentadiol diacrylate, diallyl fumarate, 1,10-decanediol dimethyl acrylate, pentaerythritol hexaacrylate, and the compounds in which the above-mentioned acrylate are changed to methacrylate, γ-methacryloxypropyl trimethoxysilane, and 1-vinyl-2-pyrrolidone.

The above-described reactive monomers may be used as a single compound or as a mixture of two or more compounds, or it may be used as a mixture with other compound.

The photosensitive resin composition contains a photo polymerization initiator. Examples of a photo polymerization initiator include: benzophenone, o-benzoyl methyl benzoate, 4,4-bis(dimethylamine)benzophenone, 4,4-bis(diethylamine)benzophenone, α-amino acetophenone, 4,4-dichlorobenzophenone, 4-benzoyl-4-methyldiphenyl ketone, dibenzyl ketone, fluorenone, 2,2-diethoxyacetophenone, 2,2-dimethoxy-2-phenylacetophenone, 2-hydroxy-2-methylpropiophenone, p-tert-butyldichloroacetophenone, thioxanthone, 2-methylthioxanthone, 2-chlorothioxanthone, 2-isopropylthioxanthone, diethylthioxanthone, benzyldimethylketal, benzylmethoxyethylacetal, benzoin methyl ether, benzoin butyl ether, anthraquinone, 2-tert-butylanthraquinone, 2-almylanthraquinone, β-chloroanthraquinone, anthrone, benzanthrone, dibenzosuberone, methyleneanthrone, 4-azidobenzylacetophenone, 2,6-bis(p-azidobenzylidene)cyclohexane, 2,6-bis(p-azidobenzylidene)-4-methylcyclohexanone, 2-phenyl-1,2-butanedione-2-(o-methoxycarbonyl)oxime, 1-phenyl-1,2-propanedione-2-(o-methoxycarbonyl)oxime, 1,3-diphenyl-propanetrione-2-(o-methoxycarbonyl)oxime, 1-phenyl-3-ethoxy-propanetrione-2-(o-methoxycarbonyl)oxime, Michler's ketone, 2-methyl [4-(methylthio)phenyl]-2-monpholino-1-propane, 2-benzyl-2-dimethylamino-1-(4-monopholinephenyl)-butanone-1, naphthalenesulfonylchloride, quinolinesulfonyl chloride, n-phenylthioacrydone, 4,4-azobis isobutyronitrile, diphenyl disulfide, benzthiazole disulfide, triphenylphosphine, camphorquinone, carbon tetrachloride, tribromophenylsulfone, benzoin peroxide, eosin, and a combination of a photo reductive dye such as methylene blue with a reducing agent such as ascorbic acid and triethanol amine. These polymerization initiators may be used alone or in combination of two or more kinds.

A method of forming an underlayer is not specifically limited, however, preferably employed are wet coating methods, for example, a spin coating method, a spray coating method, a blade coating method, and a dip coating method; or a dry coating method such as vapor deposition method.

In a forming process of an underlayer, an additive such as an antioxidant, an ultraviolet absorber or a plasticizer may be added in the aforementioned photopolymer, if needed. An appropriate resin or an additive may be added in any organic layer regardless of the laminate position in order to improve the film forming property or to avoid occurrence of pin holes.

Examples of a solvent used when forming an underlayer using an application liquid in which a photopolymer is dissolved or dispersed in a solvent include: alcohols such as methanol ethanol, n-propanol, iso-propanol, ethylene glycol and propylene glycol; terpenes such as α- and β-terpineol; ketones such as acetone, methyl ethyl ketone, cyclohexanone, N-methyl-2-pyrrolidone, diethyl ketone, 2-heptanone and 4-heptanone; aromatic hydrocarbons such as toluene, xylene, and tetramethyl benzene; glycol ethers such as cellosolve, methyl cellosolve, ethyl cellosolve, carbitol, methyl carbitol, ethyl carbitol, butyl carbitol, propylene glycol monomethyl ether, propylene glycol monomethyl ether, propylene glycol monoethyl ether, dipropylene glycol monomethyl ether, dipropylene glycol monoethyl ether, triethylene glycol monomethyl ether and triethylene glycol monomethyl ether; acetates such as ethyl acetate, butyl acetate, cellosolve acetate, ethylcellosolve acetate, butylcellosolve acetate, carbitol acetate, ethylcarbitol acetate, butylcarbitol acetate, propylene glycol monomethylether acetate, propylene glycol monoethylether acetate, 2-methoxyethyl acetate, cyclohexyl acetate, 2-ethoxyetyl acetate and 3-methoxybutyl acetate; diethylene glycol dialkylether, dipropylene glycol dialkylether, ethyl 3-ethoxypropionate; methyl benzoate; N,N-dimethylacetamide; and N,N-dimethylformamide.

A flatness of an underlayer is a value expressed by the surface roughness specified by JIS B 0601, and the maximum profile peak height Rt(p) is preferably in the range of 10 to 30 nm. When the maximum profile peak height Rt(p) is within the above-described range, it will not deteriorate coating property at the moment of contacting the surface of the underlayer with the application devices during the step of applying a silicon compound mentioned later with a coating method such as a wire bar method or a wireless bar method. It becomes easier to make flat the irregularity of the coated layer with a silicon compound.

The surface roughness is a roughness relating to an amplitude of minute irregularity measured by using an atomic force microscope (AFM). This surface roughness is obtained by multiple measurements within a range of several tens μm using a stylus of the minimal tip radius in AFM. It is calculated from a cross-section curve of the irregularity obtained by this continuous measurement.

(Additive in Underlayer)

The underlayer may contain an additive. As an additive contained in the underlayer, preferable is a reactive silica particle incorporating a photo reactive group having a photo polymerization property on the surface of the silica particle (hereafter, it is simply called as "a reactive silica particle").

Here, as a photo reactive group having a photo polymerization property, it may be cited a polymerizable unsaturated group represented by a (meth)acryloyloxy group. Preferably, the photo reactive resin contains a photo reactive group incorporated on the surface of a reactive silica particle and a photopolymerizable compound.

Example thereof is an unsaturated organic compound having a polymerizable unsaturated group. As a photopolymer, it may be used a composition of a reactive silica particle and an unsaturated organic compound having a polymerizable unsaturated group prepared by suitably adjusting the solid component with mixing a diluting solvent for general use.

Here, as an average particle diameter of reactive silica particles, it is preferable to be in the range of 0.001 to 0.1 μm. By setting the average particle diameter in this range, and by using with a matting agent made of inorganic particles having an average particle diameter of 1 to 10 μm described later, it is easily formed un underlayer provided with: an optical properties of light distribution; and a hard coat property. From the viewpoint of obtaining these effects easily, it is more preferable to use a silica particle having an average particle diameter of 0.001 to 0.01 μm. In the underlayer, it is preferable to incorporate the above-described inorganic particles in an amount of 20 to 60% as a mass ratio. By the addition of 20% or more, a close contact property of a flexible substrate 11 with a second gas barrier layer 122 will be increased. It will avoid: generation of crack when bending the film or giving a heat treatment to the film; and influence on optical properties of transparency and reflectance of the second gas barrier layer 122.

In the present invention, a hydrolytic silane compound modified with a polymerizable unsaturated group may be used as a reactive silica particle. This compound produces a silyloxy group with a silica particle by a hydrolysis reaction and the silyloxy group is chemically bonded.

Examples of hydrolytic silane include: an alkoxysilyl group, a carboxysililate silyl group such as an acetoxysilyl group, a halogenated silyl group such as a chlorosilyl group, an aminosilyl group, an oxymsilyl group, and a hydrylsilyl group.

Examples of a polymerizable unsaturated group include: an acryloyloxy group, a methacryloyloxyl group, a vinyl group, a propenyl group, a butadienyl group, a styryl group, an ethynyl group, a cinnamoyl group, a malate group, and an acrylamide group.

In the present invention, a thickness of the underlayer is preferably in the range of 1 to 10 μm, more preferably, it is in the range of 2 to 7 μm. By making it to be 1 μm or more, the smoothness of the flexible substrate 11 having an underlayer will be sufficient. Further, by making it to be 10 μm or less, it is easy to adjust the balance of optical properties, and at the same time, it becomes easy to suppress curl of the film when the underlayer is provided on only one side of the flexible substrate 11.

The underlayer may contain a matting agent as other additive agent. As a matting agent, inorganic particles having an average particle diameter of about 0.1 to 5 μm are preferably used.

As such inorganic particles, it may be used one kind or two or more kinds in combination of the following: silica, alumina, talc, clay, calcium carbonate, magnesium carbonate, barium sulfate, aluminum hydroxide, titanium dioxide or zirconium dioxide.

The matting agent made of inorganic particles is preferably contained in a ratio of 2 mass parts or more, more preferably, 4 mass parts or more, and still more preferably, 6 mass parts or more, but preferably 20 mass parts or less, more preferably, 18 mass parts or less, and still more preferably, 16 mass parts or less, based on the total solid content of 100 mass parts in the underlayer.

(Bleedout Preventing Layer)

A flexible substrate 11 may be provided with a bleedout preventing layer. A bleedout preventing layer is preferably provided on the surface of a substrate opposite to the surface on which the underlayer is provided, in order to avoid the contamination of the surface of the flexible substrate 11 due to migration of an unreacted oligomer from the inside of the flexible substrate 11, when a film type flexible substrate 11 having an underlayer is heated. As far as the bleedout preventing layer has this function, the bleedout preventing layer may have the same constitution as that of the underlayer.

In addition, when this bleedout preventing layer is provided, this layer may not be placed in around the center portion in the depth direction of an organic EL element 10. However, by placing it in around the center portion, it is efficient to prevent generation of crack of the second barrier layer 122.

As a bleedout preventing layer, it may be used an unsaturated organic compound having a polymerizable unsaturated group. As this unsaturated organic compound, it is preferable to use a polyvalent unsaturated organic compound having two or more polymerizable unsaturated groups in the molecule or a monovalent unsaturated organic compound having one polymerizable unsaturated group in the molecule.

Here, examples of a multivalent unsaturated organic compound include: ethylene glycol di(meth)acrylate, diethylene glycol di(meth)acrylate, glycerol di(meth)acrylate, glycerol tri(meth)acrylate, 1,4-butanediol di(meth)acrylate, 1,6-hexanediol di(meth)acrylate, neo-pentyl glycol di(meth) acrylate, trimethylolpropane tri(meth)acrylate, dicyclopentanyl di(meth)acrylate, pentaerythritol tri(meth)acrylate, pentaerythritol tetra(meth)acrylate, dipentacrythritol hexa (meth)acrylate, dipentaerythritol monohydroxypenta(meth) acrylate, ditrimethylolpropane tetra(meth)acrylate, diethylene glycol di(meth)acrylate, polyethylene glycol di(meth) acrylate, tripropylene glycol di(meth)acrylate, and polypropylene glycol di(meth)acrylate.

Here, examples of a monovalent unsaturated organic compound include: methyl(meth)acrylate, ethyl(meth)acrylate, propyl(meth)acrylate, butyl(meth)acrylate, 2-ethylhexyl(meth)acrylate, isodecyl(meth)acrylate, lauryl(meth) acrylate, stearyl(meth)acrylate, allyl(meth)acrylate, cyclohexyl(meth)acrylate, methylcyclohexyl(meth)acrylate, isobornyl(meth)acrylate, 2-hydroxyethyl(meth)acrylate, 2-hydroxypropyl(meth)acrylate, glycerol (meth)acrylate, glycidyl(meth)acrylate, benzyl(meth)acrylate, 2-ethoxyethyl(meth)acrylate, 2-(2-ethoxyethoxy)ethyl(meth)acrylate, butoxyethyl(meth)acrylate, 2-methoxyethyl(meth)acrylate, methoxydiethylene glycol (meth)acrylate, methoxytriethylene glycol (meth)acrylate, methoxypolyethylene glycol (meth)acrylate, 2-methoxypropyl(meth)acrylate, methoxydipropylene glycol (meth)acrylate, methoxytripropylene glycol (meth)acrylate, methoxypolypropylene glycol (meth)acrylate, polyethylene glycol (meth) acrylate, and polypropylene glycol (meth)acrylate.

The bleedout preventing layer may contain a thermoplastic resin, a thermocurable resin, an ionizing radiation curable resin, and a photopolymerization initiator.

Examples of such a thermoplastic resin include: cellulose derivatives such as acetyl cellulose, nitro cellulose, acetyl butyl cellulose, ethyl cellulose, and methyl cellulose; vinyl resins such as vinyl acetate and its co-polymer, vinyl chloride and its co-polymer, and vinylidene chloride and its co-polymer; acetal resins such as polyvinyl formal and polyvinyl butyral; acrylic resins such as acrylic resin and its co-polymer, methacrylic resin and its co-polymer; polystyrene resin, polyamide resin, linear polyester resin, and polycarbonate resin.

Examples of such a thermocurable resin include: a thermocurable urethane resin formed from acrylic polyol and an isocyanate prepolymer, a phenol resin, a urea melamine resin, an epoxy resin, an unsaturated polyester resin, and a silicone resin.

As an ionizing radiation curable resin, an ionizing radiation curable coating material containing one kind or two or more kinds of photopolymerizable prepolymers or monomers, which will be hardened by irradiation with ionizing radiation (ultraviolet radiation or electron radiation), may be employed.

As a photopolymerizable prepolymer, an acrylic prepolymer which has two or more acrylic groups in the molecule, and can form a three dimensional network structure by cross-linking polymerization is specifically preferably used. As an acrylic prepolymer, for example, urethane acrylate, polyester acrylate, epoxy acrylate, or melamine acrylate may be used. As a photopolymerizable monomer, the polyvalent unsaturated organic compounds described above are applicable.

Examples of a photopolymerization initiator include: acetophenone, benzophenone, Michler's ketone, benzoin, benzyl methyl ketal, benzoin benzoate, hydroxycyclohexyl phenyl ketone, 2-methyl-1-(4-(methylthio)phenyl)-2-(4-morpholinyl)-1-propane, α-acyloxym ester, and thioxanthone.

The bleedout preventing layer may be prepared as follows. A coating solution is prepared by mixing a matting agent, and other components if required, and by diluting it with a diluting solvent when required. The prepared coating solution is coated on a surface of a substrate with a conventionally known method. Then, it is cured by irradiation with an ionization radiation rays.

As a method of irradiation with ionization radiation rays, it is irradiated with ultraviolet rays in the range of 100 to 400 nm, or preferably, in the range of 200 to 400 nm emitted from: a super-high-pressure mercury lamp, a high-pressure mercury lamp, a low-pressure mercury lamp, a carbon ark, or a metal halide lamp. Otherwise, it is irradiated with electron beams having the wavelength range of 100 nm or less emitted from a scanning-type or curtain-type electron accelerator.

A thickness of the bleedout preventing layer is preferably in the range of 1 to 10 μm, and more preferably, it is in the range of 2 to 7 μm. By making it to be 1 μm or more, it becomes easy to achieve sufficient heat resistivity. By making it to be 10 μm or less, it becomes easy to adjust the balance of optical properties of the underlayer, and at the same time, it becomes easy to suppress curl when the underlayer is provided on only one side of the transparent polymer film.

EXAMPLES

Hereafter, the present invention will be described specifically by referring to Examples, however, the present invention is not limited to them. In Examples, the term "parts" or "%" is used. Unless particularly mentioned, they respectively represent "mass parts" or "mass %".

<Preparation of Organic EL Element>

[Flexible Substrate]

The following three kinds of substrates were used as a flexible substrate.

Flexible substrate A: PET film provided with hard coat layers on both surfaces of the PET film (total thickness: 136 μm; thickness of PET: 125 μm);

Flexible substrate B: PET film provided with hard coat layers on both surfaces of the PET film (total thickness: 58 μm; thickness of PET: 50 μm); and Flexible substrate C: PET film provided with hard coat layers on both surfaces of the PET film (total thickness: 36 μm; thickness of PET: 25 μm).

[First Gas Barrier Layer]

A first barrier layer was prepared under the film forming conditions a1 to a3 as indicated below.

First, a dibutyl ether solution containing 20 mass % of perhydropolysilazane (NN120-20, made by AZ Electronic Materials Co.,) and a dibutyl ether solution containing 20 mass % of perhydropolysilazane and an amine catalyst (N,N,N',N'-tetramethyl-1,6-diaminohexane (TMDHA)) (NAX 120-20, made by AZ Electronic Materials Co.,) were mixed with a ratio of 4:1 (mass ratio). Then, a suitable amount of dibutyl ether was added to adjust a dry layer thickness. Thus, each coating solution was prepared.

A coating solution was applied with a spin coat method to achieve a layer of a dried layer thickness as indicated in Table 2, then, the layer was dried at 80° C. for 2 minutes.

Subsequently, a surface treatment was performed to the dried coated layer using a treatment method and an oxygen concentration condition as indicated in Table 2 to result in forming a first gas barrier layer. Further, a repeated film formation was performed to obtain first gas barrier layers having a various thickness as indicated in Table 2.

TABLE 2

| FILM FORMING CONDITION No. | TREATMENT METHOD | OXYGEN CONCENTRATION DURING IRRADIATION (VOLUME %) | DRIED LAYER THICKNESS (nm) |
|---|---|---|---|
| a1 | VACUUM UV IRRADIATION TREATMENT (WAVELENGTH172 nm, XeEXCIMER LAMP, 3.0 J/cm$^2$) | 0.1 | 250 |

TABLE 2-continued

| FILM FORMING CONDITION No. | TREATMENT METHOD | OXYGEN CONCENTRATION DURING IRRADIATION (VOLUME %) | DRIED LAYER THICKNESS (nm) |
|---|---|---|---|
| a2 | FILM FORMING BY REPEATING TWO TIMES OF a1 CONDITION | | 500 |
| a3 | FILM FORMING BY REPEATING THREE TIMES OF a1 CONDITION | | 750 |
| a4 | PLASMA TREATMENT (5 kV) | 5.0 | 500 |

[Insulating Layer]

An insulating layer made of metal oxide was formed on a first gas barrier layer under a gas phase film forming condition using various metal oxides as indicated in Table 3. A layer thickness was determined with a cross-section TEM. Here, an insulating layer formed under a film forming condition b1 is a comparative sample of the present invention.

TABLE 3

| FILM FORMING CONDITION No. | METHOD | MATERIAL | VACUUM DEGREE (Pa) | FILM FORMING RATE (nm/sec) | LAYER THICKNESS (nm) |
|---|---|---|---|---|---|
| b1 | RF SPUTTER METHOD | Si OXIDE | $4 \times 10^{-4}$ | 0.2 | 100 |
| b2 | ELECTRON BEAM VAPOR DEPOSITION | Ti OXIDE | $2 \times 10^{-2}$ | 0.2 | 30 |
| b3 | RF SPUTTER METHOD | Hf OXIDE | $4 \times 10^{-4}$ | 0.2 | 30 |
| b4 | RF SPUTTER METHOD | Mg OXIDE | $4 \times 10^{-4}$ | 0.2 | 30 |
| b5 | RF SPUTTER METHOD | Zr OXIDE | $4 \times 10^{-4}$ | 0.2 | 30 |
| b6 | RF SPUTTER METHOD | Nb OXIDE | $4 \times 10^{-4}$ | 0.2 | 100 |
| b7 | RF SPUTTER METHOD | Nb OXIDE | $4 \times 10^{-4}$ | 0.2 | 50 |
| b8 | RF SPUTTER METHOD | Nb OXIDE | $4 \times 10^{-4}$ | 0.2 | 30 |
| b9 | RF SPUTTER METHOD | Nb OXIDE | $4 \times 10^{-4}$ | 0.2 | 15 |
| b10 | RF SPUTTER METHOD | Zn OXIDE | $4 \times 10^{-4}$ | 0.2 | 30 |

[Light Emitting Unit]

A light emitting layer was formed under film forming conditions d1 or d2 as described below, then sealing was carried out thereto.

(Film Forming Condition d1)

A substrate formed with an insulating layer beforehand was fixed to a substrate holder of a vacuum deposition apparatus available on the market. Then, a nitrogen containing compound as indicated below was placed in a tungsten resistance heating boat. The substrate holder and the heating boat were placed in the first vacuum tank of the vacuum deposition apparatus. Silver (Ag) was placed in another tungsten resistance heating boat, and it was placed in a second vacuum tank of the vacuum deposition apparatus.

Subsequently, after reducing the pressure of the first vacuum tank to 4×10−4 Pa, the aforesaid heating boat in which the nitrogen containing compound was placed was heated via application of electric current, and a nitrogen containing layer was formed onto the substrate at a deposition rate of 0.1 to 0.2 nm/second with a thickness of 10 nm.

Subsequently, the substrate formed with the nitrogen containing layer was transported in the second vacuum tank. After reducing the pressure of the second vacuum tank to 4×10−4 Pa, the aforesaid heating boat in which silver (Ag) was placed was heated via application of electric current. Thus, a first electrode made of silver (Ag) having a thickness of 8 nm was formed at a deposition rate of 0.1 to 0.2 nm/second.

Here the aforesaid nitrogen containing compound employed is a compound indicated below.

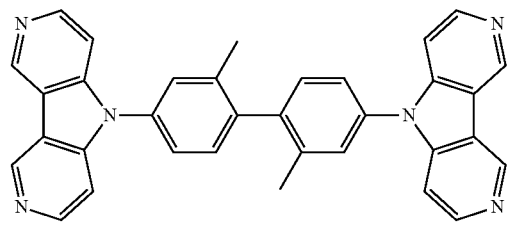 [SMILES: Cc1cc(-n2c3ccncc3c3cnccc32)ccc1-c1ccc(-n2c3ccncc3c3cnccc32)cc1C]

The substrate which was prepared to the first electrode was fixed to a substrate holder of the vacuum deposition apparatus available on the market. Then, after reducing the pressure of the vacuum tank to 4×10−4 Pa, a compound HT-1 was vapor deposited onto the substrate at a deposition rate of 0.1 nm/second, while transporting the substrate, whereby it was produced a hole transport layer (HTL) having a thickness of 20 nm.

Subsequently, there were vapor deposited a compound A-3 (blue light emitting dopant), a compound A-1 (green light emitting dopant), a compound A-2 (red light emitting dopant), and a compound H-1 (host compound) in such a manner that the content of the compound A-3 was linearly varied from 35 mass % to 5 mass % in the thickness direction by changing the deposition rate depending on the place; the compound A-1 and the compound A-2 were formed regardless of the thickness to have the content of 0.2 mass % at a deposition rate of 0.0002 nm/sec; and the compound H-1 was varied from 64.6 mass % to 94.6 mass % by changing the deposition rate depending on the place, whereby a light emitting layer having a thickness of 70 nm was formed with co-deposition.

Further, a compound ET-1 was vapor deposited to form an electron transport layer having a thickness of 30 nm. Subsequently, 2 nm thick potassium fluoride (KF) was vapor deposited. Moreover, aluminum was vapor deposited with a thickness of 100 nm to form a second electrode.

Here the aforesaid compound HT-1, compounds A-1, A-2 and A-3, compound H-1 and compound ET-1 are compounds indicated below.

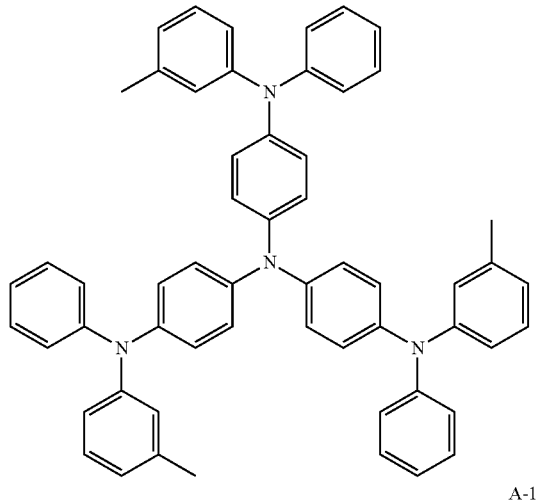

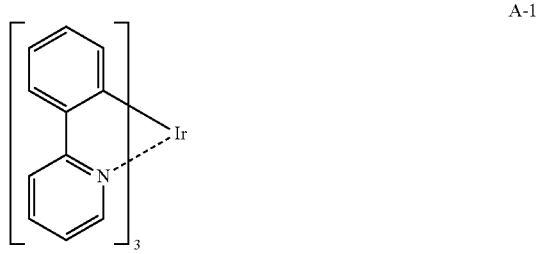

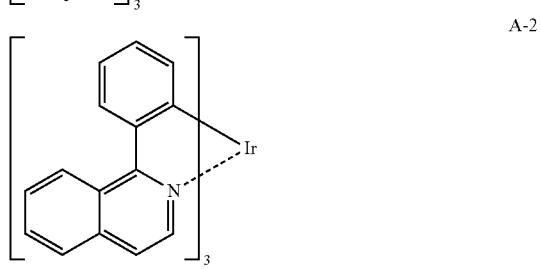

Subsequently, an aluminum foil (thickness of 100 μm) laminated with a polyethylene terephthalate (PET) resin was used as a sealing member. On the aluminum side of this sealing member was coated with a heat curing liquid adhesive (an epoxy resin) with a thickness of 20 nm as a sealing layer. Then, this pasted sealing member was superposed on the substrate having been prepared to the second electrode. At this moment, the adhesive forming surface of the sealing member and the organic functional layer surface were continuously superposed in a manner that the edge portions of the taking out electrodes of the first electrode and the second electrode were made outside.

Then, the sample was placed in a reduced pressure apparatus, and the superposed substrate and the sealing member were pressed at 90° C. with 0.1 MPa and they were kept together for 5 minutes.

Subsequently, the sample was returned to an atmospheric pressure environment, followed by heated at 110° C. for 30 minutes to cure the adhesive. The above-described sealing process was done at an atmospheric pressure with a nitrogen environment having a water content of 1 ppm or less, with a measured cleanness of class 100, which was conformed with JIS B 9920, with a dew point of −80° C. or less, and oxygen concentration of 0.8 ppm or less.

In addition, the formation process of the taking out wirings of the first electrode and the second electrode were omitted in this description.

(Film Forming Condition d2)

Film formation was done under the same conditions as the above-described Film forming condition d1, except that the following underlayer, a first conductive layer and a second conductive layer were provided on the insulating layer as a first electrode.

First, an underlayer liquid was prepared by adding γ-mercaptopropyltrimethoxysilan to become an amount of 0.01 mass % to an aqueous acetic acid (pH=4.5, 25° C.).

Subsequently, this underlayer liquid was coated on the insulating layer with a wire-bar to have a wet thickness of 3 μm. Then, the coated layer was dried at 100° C. for 15 minutes to form an underlayer.

Subsequently, on the underlayer was printed a silver nano-particle paste (M-Dot™, average particle size of 20 nm, made by SLP Mitsuboshi Belting, Ltd.) with a gravure printing testing machine so as to have a thin line grate with a line width of 50 μm, a height of 1.5 μm, an interval of 1.0 mm. Then, the printed pattern was subjected to a cure treatment at 110° C. for 5 minutes to form a first conductive layer.

Subsequently, it was prepared a coating liquid by mixing: 7.8 g of conductive polymer Baytron PH510 (solid content of 1.7%, made by H. C. Starck Co.); 1.7 g of 20% aqueous solution of poly(2-hydroxyethyl acrylate); and 0.5 g of DMSO. Then, after adding 40 μL of 10% aqueous sulfuric acid to the mixture followed by stirring, the mixture was filtered with a filter having a mesh of 20 μm. Thus, the coating liquid was prepared. This coating liquid was coated on the first conductive layer with a spin coater to form a layer with a thickness of 300 nm after drying, and the layer was subjected to a heating treatment at 110° C. for 30 minutes to form a second conductive layer.

[Second Gas Barrier Layer]

A second gas barrier layer was formed between the flexible substrate and the first gas barrier layer.

The second gas barrier layer was formed with a roll-to-roll CVD film forming apparatus, which is described in Japan Patent No. 4268195, and being a two linked type apparatus each having a film forming portion composed of opposing film forming rollers (containing a first film forming portion and a second film forming portion).

As shown in Table 4, the film forming conditions were adjusted with the items of: transport rate, supplying amount of raw material (HMDSO), supplying amount of oxygen, vacuum level, impressed electric power, frequency of electric source, and number of film forming process (repeated number of film forming process). The film thickness was determined with a cross-section TEM.

Organic EL elements 1 to 20 were prepared by following the conditions as described in the following Table 5. The varied conditions were: flexible substrate; first gas barrier layer; insulating layer; light emitting unit; and second gas barrier layer.

[Evaluations]

The prepared organic EL elements were subjected to the following evaluations.

<Storage Property>

The prepared organic EL elements each were kept under the conditions of 85° C. and 85% RH for 500 hours. Subsequently, these organic EL element samples were lighted with a constant voltage electric source to find out the number of generated dark spots (non-light emitting portions) having a radius of 150 μm or more per 100 cm2.

The generation rate of dark spots was determined by taking a picture of a light emitting surface of each organic EL element sample, and the taken image data was subjected to a predetermined image processing to obtain the generation rate of dark spots.

<Light Emitting Efficiency>

Light emitting efficiency was evaluated by measuring an external quantum efficiency (EQE) value. The luminance and the light emitting spectrum were measured with a spectroradiometric luminance meter CS-1000 (produced by Konica Minolta, Inc.). EQE was calculated with a luminance conversion method based on these measurement values. Here, EQE was indicated as a relative value by setting the EQE value of "Organic EL element 17" to be 1.00.

<Uniformity of Emitting Light>

A viewing angle dependency of the light emitting spectrum within the viewing angle of 0 to 45° from the front part was measured (with a front luminance of 1,000 cd/m2). Then, S1, S2 and S3 were calculated, in which S1 is a spectrum area of 350 to 700 nm at 0°; S2 is a spectrum area of 350 to 700 nm at 45°; and S3 is an overlapped area of S1 and S2. A spectrum area overlapping ratio R was determined by the following scheme.

$$R=[S3/(S1+S2+S3)]\times 100 (\%)$$

R takes a value in the range of 0 to 100%. When this value is closer to 100, it shows that a better viewing angle dependency is achieved.

TABLE 4

| | FILM FORMING CONDITIONS | | | | | | |
|---|---|---|---|---|---|---|---|
| FILM FORMING CONDITION No. | TRANSPORT RATE (m/min) | SUPPLYING AMOUNT OF RAW MATERIAL (sccm) | SUPPLYING AMOUNT OF OXYGEN (sccm) | VACUUM LEVEL (Pa) | IMPRESSED ELECTRIC POWER (kW) | FREQUENCY (kHz) | LAYER THICKNESS (nm) |
| c1 | 7 | 150 | 500 | 1.5 | 4.5 | 90 | 100 |
| c2 | FILM FORMING BY TWO TIMES REPEATING OF c1 | | | | | | 200 |
| c3 | FILM FORMING BY THREE TIMES REPEATING OF c1 | | | | | | 300 |

TABLE 5

| ORGANIC EL ELEMENT No. | FLEXIBLE SUBSTRATE | SECOND GAS BARRIER LAYER | FIRST GAS BARRIER LAYER | INSULATING LAYER | LIGHT EMITTING UNIT | STORAGE PROPERTY NUMBER OF DARK SPOTS PER 100 cm$^2$ | LIGHT EMITTING EFFICIENCY | UNIFORMITY OF EMITTING LIGHT OVERLAPPING RATIO R (%) | REMARKS |
|---|---|---|---|---|---|---|---|---|---|
| 1 | A | NONE | a3 | b2 | d1 | 26 | 1.08 | 76 | INVENTIVE EXAMPLE |
| 2 | A | NONE | a3 | b3 | d1 | 14 | 1.21 | 74 | INVENTIVE EXAMPLE |
| 3 | A | NONE | a3 | b4 | d1 | 20 | 1.25 | 71 | INVENTIVE EXAMPLE |
| 4 | A | NONE | a3 | b5 | d1 | 3 | 0.74 | 82 | INVENTIVE EXAMPLE |
| 5 | A | NONE | a3 | b6 | d1 | 8 | 1.20 | 90 | INVENTIVE EXAMPLE |
| 6 | A | NONE | a3 | b7 | d1 | 10 | 1.48 | 78 | INVENTIVE EXAMPLE |
| 7 | A | NONE | a3 | b8 | d1 | 4 | 1.33 | 75 | INVENTIVE EXAMPLE |
| 8 | A | NONE | a3 | b9 | d1 | 10 | 1.61 | 78 | INVENTIVE EXAMPLE |
| 9 | A | NONE | a2 | b9 | d1 | 6 | 1.80 | 87 | INVENTIVE EXAMPLE |
| 10 | A | NONE | a4 | b9 | d1 | 19 | 1.90 | 84 | INVENTIVE EXAMPLE |
| 11 | B | NONE | a1 | b9 | d1 | 15 | 1.74 | 72 | INVENTIVE EXAMPLE |
| 12 | C | NONE | a3 | b9 | d2 | 11 | 1.83 | 94 | INVENTIVE EXAMPLE |
| 13 | A | c1 | a3 | b9 | d1 | 6 | 1.47 | 93 | INVENTIVE EXAMPLE |
| 14 | A | c2 | a3 | b9 | d1 | 2 | 1.51 | 82 | INVENTIVE EXAMPLE |
| 15 | A | c3 | a3 | b9 | d1 | 3 | 1.68 | 89 | INVENTIVE EXAMPLE |
| 16 | A | c3 | a3 | b9 | d2 | 1 | 1.76 | 93 | INVENTIVE EXAMPLE |
| 17 | A | NONE | a1 | NONE | d1 | 228 | 1.00 | 70 | COMPARATIVE EXAMPLE |
| 18 | A | NONE | a2 | NONE | d1 | 300 | 1.03 | 61 | COMPARATIVE EXAMPLE |
| 19 | A | NONE | a3 | NONE | d1 | 45 | 1.02 | 72 | COMPARATIVE EXAMPLE |
| 20 | A | NONE | a3 | b10 | d1 | 40 | 0.91 | 66 | COMPARATIVE EXAMPLE |
| 21 | A | NONE | a3 | b1 | d1 | 36 | 0.93 | 67 | COMPARATIVE EXAMPLE |
| 22 | A | c3 | a3 | b1 | d1 | 32 | 0.79 | 67 | COMPARATIVE EXAMPLE |

As shown by the results in Table 5, an organic EL element relating to the present invention is found to be excellent in storage property, light emitting efficiency, and uniformity of emitting light compared with a comparative organic EL element.

DESCRIPTION OF SYMBOLS

10 and 20: Organic EL element
11: Flexible substrate
13: First electrode
14: Organic functional layer
15: Second electrode
16: Light emitting unit
17: Sealing layer
18: Sealing member
19: Insulating layer
30: Manufacturing apparatus
31: Delivery roller
32, 33, 34, and 35: Conveyer roller
36 and 37: Deposition roller
38: Gas inlet
39: Power source for plasma generation
40: Film
41 and 42: Magnetic-field generator
43: Reeling roller
121: First gas barrier
122: Second gas barrier

What is claimed is:

1. An organic electroluminescent element comprising a flexible substrate having thereon: a first gas barrier layer, an insulating layer, a first electrode, a light emitting unit containing an organic functional layer, and a second electrode, in that order,
    wherein the first gas barrier layer is a polysilazane reforming layer;
    the insulating layer is a layer containing a niobium oxide without containing a binder resin; and
    the first gas barrier layer is directly contacted with the insulating layer; and the first gas barrier layer is in direct contact with the flexible substrate.

2. The organic electroluminescent element of claim 1, wherein the first gas barrier layer is a polysilazane reforming layer which is formed by impressing energy to a coating layer containing polysilazane; and the insulating layer is a layer formed by gas phase layer formation with a metal oxide.

3. The organic electroluminescent element of claim 2, wherein the impression of energy is done by irradiating with vacuum ultra violet rays.

4. The organic electroluminescent element of claim 1, wherein the insulating layer has a thickness of 5 to 50 nm.

5. The organic electroluminescent element of claim 1, wherein the insulating layer is in direct contact with the first electrode.

6. An organic electroluminescent element comprising:
a flexible substrate having thereon:
  a first gas barrier layer;
  an insulating layer;
  a first electrode;
  a light emitting unit containing an organic functional layer;
  a second electrode; and
  a sealing layer, in that order;
wherein the first gas barrier layer is a polysilazane reforming layer;
wherein the insulating layer is a layer containing a metal oxide; and
a metal element in the metal oxide has a lower redox potential than silicon;
wherein a second gas barrier layer is further provided between the flexible substrate and the first gas barrier layer;
wherein the second gas barrier layer contains a silicon compound, and further, an element selected from the group consisting of carbon, nitrogen, and oxygen; and
a composition of silicon, carbon, nitrogen, and oxygen each continuously changes in a depth direction of the second gas barrier layer, and each element has an extremum point in an element composition distribution of silicon, carbon, nitrogen, and oxygen;
wherein the sealing layer covers the first electrode, the light emitting unit, and the second electrode, and the sealing layer is in direct contact with a first side of the light emitting unit and a second side of the light emitting unit which is opposite the first side, and
wherein the insulating layer is in direct contact with the first electrode.

* * * * *